(12) United States Patent
Mukherjee et al.

(10) Patent No.: US 7,426,668 B2
(45) Date of Patent: Sep. 16, 2008

(54) PERFORMING MEMORY BUILT-IN-SELF-TEST (MBIST)

(76) Inventors: Nilanjan Mukherjee, 298028 SW. Flynn St., Wilsonville, OR (US) 97070; Xiaogang Du, 29507 SW. Meadows Loop, Apt. # 258, Wilsonville, OR (US) 97070; Wu-Tung Cheng, 19030 SW. 35th Pl., Lake Oswego, OR (US) 97034

( * ) Notice: Subject to any disclaimer, the term of this patent is extended or adjusted under 35 U.S.C. 154(b) by 0 days.

(21) Appl. No.: 11/283,499

(22) Filed: Nov. 18, 2005

(65) Prior Publication Data

US 2006/0146622 A1 Jul. 6, 2006

Related U.S. Application Data

(60) Provisional application No. 60/629,395, filed on Nov. 18, 2004, provisional application No. 60/733,493, filed on Nov. 4, 2005.

(51) Int. Cl.
*G01R 31/28* (2006.01)

(52) U.S. Cl. .......... 714/733; 714/736; 714/30; 714/718; 714/719; 714/720; 714/734; 714/735; 714/738; 714/741; 714/742; 714/743; 716/2; 716/3; 716/4; 716/18; 703/22; 365/201

(58) Field of Classification Search .......... None
See application file for complete search history.

(56) References Cited

U.S. PATENT DOCUMENTS

| | | | |
|---|---|---|---|
| 5,253,349 A | 10/1993 | Kreitzer | |
| 5,469,443 A * | 11/1995 | Saxena | 714/720 |
| 5,661,732 A * | 8/1997 | Lo et al. | 714/725 |
| 6,070,252 A | 5/2000 | Xu et al. | |
| 6,347,056 B1 | 2/2002 | Ledford et al. | |
| 6,415,403 B1 | 7/2002 | Huang et al. | |
| 6,553,527 B1 | 4/2003 | Shephard | |
| 6,567,942 B1 * | 5/2003 | Shepard, III | 714/726 |
| 6,651,201 B1 | 11/2003 | Adams et al. | |
| 6,658,611 B1 | 12/2003 | Jun | |
| 6,671,837 B1 * | 12/2003 | Reohr et al. | 714/719 |
| 6,671,843 B1 | 12/2003 | Kebichi et al. | |
| 6,760,872 B2 | 7/2004 | Gupta et al. | |
| 6,769,081 B1 * | 7/2004 | Parulkar | 714/733 |
| 6,801,461 B2 | 10/2004 | Hii et al. | |
| 6,834,361 B2 * | 12/2004 | Abbott | 714/42 |

(Continued)

FOREIGN PATENT DOCUMENTS

EP 0 472 818 3/1992

(Continued)

OTHER PUBLICATIONS

Zarrineh et al., "Programmable Memory BIST and a New Synthesis Framework", IEEE Digest of Papers on Fault Tolerant Computing, 1999, pp. 352-355.*

(Continued)

*Primary Examiner*—John P Trimmings
(74) *Attorney, Agent, or Firm*—Klarquist Sparkman LLP

(57) ABSTRACT

Programmable memory built-in self-test (MBIST) methods, apparatus, and systems are disclosed. Exemplary embodiments of the disclosed technology can be used, for example, to test one or more memories located on an integrated circuit during manufacturing testing.

23 Claims, 25 Drawing Sheets

U.S. PATENT DOCUMENTS

| | | | |
|---|---|---|---|
| 6,874,111 | B1 | 3/2005 | Adams et al. |
| 6,950,974 | B1 | 9/2005 | Wohl et al. |
| 7,168,005 | B2* | 1/2007 | Adams et al. .................. 714/31 |
| 7,181,659 | B2* | 2/2007 | Bravo et al. .................. 714/718 |
| 7,206,979 | B1* | 4/2007 | Zarrineh et al. ............. 714/718 |
| 7,216,198 | B2 | 5/2007 | Ito et al. |
| 2003/0167431 | A1* | 9/2003 | Nicolaidis et al. ........... 714/733 |
| 2004/0123200 | A1* | 6/2004 | Caty et al. .................. 714/733 |
| 2004/0153885 | A1 | 8/2004 | Chauvel et al. |
| 2004/0158786 | A1 | 8/2004 | Caty et al. |
| 2004/0230395 | A1 | 11/2004 | Basto |
| 2005/0120270 | A1 | 6/2005 | Anand et al. |
| 2005/0172180 | A1 | 8/2005 | Damondaran et al. |
| 2005/0204231 | A1 | 9/2005 | Mukherjee et al. |

FOREIGN PATENT DOCUMENTS

| | | |
|---|---|---|
| EP | 1 388 788 | 2/2004 |
| WO | WO 02/089146 A2 | 11/2002 |
| WO | WO 02/089146 A3 | 11/2002 |

OTHER PUBLICATIONS

Zarrineh et al., "Programmable Memory BIST and a New Synthesis Framework", 1999.
Huang et al., "A Programmable BIST Core for Embedded DRAM", IEEE, Jan.-Mar. 1999, pp. 59-70.
Zarrineh et al., "On Programmable Memory Built-In Self Test Architectures", 1999.
Appello et al., "Exploiting Programmable BIST for the Diagnosis of Embedded Memory Cores", IEEE, 2003, pp. 379-385.
Jakobsen et al., "Embedded DRAM Built In Self Test and Methodology for Test Insertion," IEEE 2001, paper 35.1, pp. 975-984.
U.S. Appl. No. 11/283,527, filed Nov. 18, 2005; Mukherjee et al.
U.S. Appl. No. 11/282,938, filed Nov. 18, 2005; Mukherjee et al.
International Search Report for International Application No. PCT/US05/42029, mailed Jun. 8, 2006.
Chen and Dey, "DEFUSE: A Deterministic Functional Self-Test Methodology for Processors," *Proc. IEEE VLSI Test Symposium*, pp. 255-262, 2000.
Cheng, "Comprehensive Study on Designing Memory BIST: Algorithms, Implementations and Trade-offs," *EECS 579*, University of Michigan, Dec. 16, 2002.
Jervan et al., "A Hybrid BIST Architecture and its Optimization for SoC Testing," *In International Symposium on Quality Electronic Design*, pp. 273-279, 2002.
Touba, "Circular BIST with State Skipping," *IEEE Transactions on Very Large Scale Integration (VLSI) Systems* 10(5):668-672, Oct. 2002.
Könemann, "A Pattern Skipping Method for Weighted Random Pattern Testing," *European Test Conference 1993, Proceedings of ETC 93, Third*, pp. 418-425, Apr. 19-22, 1993.
Sep. 6, 2007 Notice of Allowance in U.S. Appl. No. 11/282,938.
Sep. 20, 2007 Notice of Allowance in U.S. Appl. No. 11/282,938.
Oct. 2, 2007 Office Action in U.S. Appl. No. 11/283,527.
European Search Report dated Mar. 4, 2008, European Patent Application EP 05 84 9415, Publication Date Aug. 29, 2007.
Communication Pursuant to Article 94(3) EPC, dated Jun. 9, 2008, from European patent Office in European Patent Application No. 05849415.4.

* cited by examiner

FIG. 3

| [8] | [7] | [6] | [5] | [4] | [3] | [2] | [1] | [0] |
|---|---|---|---|---|---|---|---|---|
| Loop Control-Base Loop/Local Loop | | | | Base / Local Addressing | | Data/ ~Data | R/W | Instr Type |

FIG. 3A

| Bits | Field | Values |
|---|---|---|
| [8] | | 0 |
| [7:6] | Address Level | 00 to 11 |
| [5:4] | Address Manipulation | 00 – Address<br>01 – Inverse_Address<br>10 – Address_+_index<br>11 – Address_–_index |
| [3] | Data Manipulation | 0 - Data<br>1 - Inverse_Data |
| [2:1] | Operation | 00 – Read<br>01 – Read_no_compare<br>10 – Write<br>11 - NOP |
| [0] | | 1 |

Configuration Buffer

PERFORMING MEMORY BUILT-IN-SELF-TEST (MBIST)

CROSS REFERENCE TO RELATED APPLICATIONS

This application claims the benefit of U.S. Provisional Patent Application No. 60/629,395, filed on Nov. 18, 2004 and U.S. Provisional Patent Application No. 60/733,493, filed on Nov. 4, 2005. The entire disclosure of the provisional applications is considered to be part of the disclosure of the following application and are hereby incorporated by reference herein.

TECHNICAL FIELD

The technology disclosed herein relates to built-in-self-test of memory (MBIST) such as memories embedded in a system on a chip. More specifically, one aspect of the technology relates to a built-in-self-test controller and related methods that is programmable to permit the selection and changing of algorithms that are applied to the memory being tested. Desirably, the controller is field programmable to permit programming at a chip manufacturing site to perform testing of chips following their manufacture at such site or at other remote locations.

BACKGROUND

The density of the memories being fabricated is rapidly increasing and at a fast pace compared to random logic. Additionally, the percentage of embedded memories in a chip is increasing, thereby occupying a major portion of a system-on-a-chip. The smaller feature size and increasing real estate occupied by memories on a chip result in an enormous critical chip area that may potentially have defects. The traditional use of Direct Memory Access (DMA) for testing is costly in terms of silicon area, routing complexity, and test application time. BIST (built-in-self-test) has become an attractive alternative and can offer benefits such as high fault coverage. Traditionally, given the type of memories and the tests that need to be applied to them, memories have been grouped and assigned to particular controllers. For example, a SOC (System on a Chip) with roughly 200 memories is usually grouped and assigned to 25-30 controllers, where each controller is responsible for managing the tests of between 4-10 memories. The controllers are designed in a way such that they are capable of running the exact pre-established algorithms in a pre-specified sequence during manufacturing test. Since such controllers are non-programmable (or hard-wired), the algorithms and the fault models they target are fixed and cannot be changed at a later time after the chip has been manufactured.

SUMMARY

The disclosure is directed toward novel and unique method acts, programmed computers, and programmable media (e.g., electronic files or disks), and BIST circuitry that have one or more of the novel and non-obvious aspects as disclosed anywhere in this disclosure, both alone and in various combinations and subcombinations with one another. There is no requirement that an invention as claimed herein have specific features or provide any specific advantages except as set forth in the language of the claim.

As current System-on-Chip (SOC) designs become more and more memory dominant, the yield of SOC designs greatly depends on the yield of embedded memories. Many fault models and test algorithms have been developed to detect defects in a memory. More fault models and test algorithms are being developed to increase the reliability of memories. After a chip has been manufactured, new algorithms may be developed in the future to ensure the reliability of embedded memories. To test a manufactured chip using such after developed algorithms, in the absence of a programmable MBIST controller, one would have to load and apply such new algorithms after the chip is manufactured. Field programmable memory BIST offers the high flexibility of changing test algorithms in the field.

Certain embodiments of programmable memory BIST controllers described herein not only support linear algorithms, but also supports some other non-linear algorithms. The design allows the selection of algorithms that are supported so as to accomplish a desirable tradeoff between area overhead and fault coverage.

The various exemplary embodiments disclosed herein exhibit numerous novel and non-obvious features and method acts. Certain exemplary embodiments have one or more of the following aspects.

In accordance with some exemplary embodiments, a programmable MBIST circuit is provided to support memory test algorithms having one or more nested loops.

A desirable aspect of certain embodiments is to allow the accomplishment of testing of memory at the rated or functional operating speed of the memory between nested loops within a step as well as within a step. In certain embodiments, regardless of whether nested loops are accommodated, the programmable MBIST circuit allows for testing of memory at the functional speed of operation of the memory between steps of an algorithm as well as within a step. A step can have one or more loops in exemplary embodiments that are not nested. Provision is made to process loop boundaries in accordance with certain exemplary embodiments to allow for this at functional operating speed memory testing.

In a desirable architecture of certain exemplary MBIST circuit embodiments, an instruction memory has a single register scanned in with instructions, such as from an ATE, with instructions being loaded in parallel into a first in first out buffer from the register, the first in first out buffer being successively loaded with instructions that are left to be performed after the buffer empties.

In a desirable architecture of certain exemplary MBIST circuit embodiments, diagnostic data corresponding to a fault from a current algorithm step can be recorded and scanned with the MBIST circuit being restarted at the current algorithm step following scanning out of the fault diagnostic data. A single register can be used in one architecture for this purpose.

In accordance with certain embodiments, the MBIST controller is programmable (e.g., at MBIST circuit testing run time) to schedule memory testing. For example, multiple or a plurality of memories can be assigned or coupled to a single programmable MBIST circuit for testing. Instructions program the MBIST circuit at the time of running the MBIST circuit to perform a test algorithm so as to perform one or more of the following memory circuit testing operations: (a) applying any one or more testing algorithms to plural memories tested by the MBIST circuit on a sequential contiguous basis; (b) applying any one or more testing algorithms to plural memories tested by the MIST circuit on a sequential interleaved basis; and (c) selecting one or more memories from a plurality of memories assigned to the MBIST circuit for testing.

In accordance with exemplary embodiments, instructions (e.g., configuration instructions) can also be provided to program the MBIST circuit at the time of running the MBIST circuit to perform any one or more of the following operations: (a) selecting a memory bank of at least one memory for testing; (b) selecting a page of at least one memory for testing; (c) selecting a port of at least one memory for testing; (d) selecting a portion of a memory address range of a memory to be tested; (e) selecting whether diagnostic monitoring is to be performed; and (f) selecting whether diagnostic monitoring is to be performed for one or more specific algorithms. Instructions to provide other alternative programmable operations are also implemented in certain exemplary embodiments, such as programmable data and background selection and programmable memory cell addressing. Configuration words can be used for such purposes or portions thereof.

In accordance with more specific aspects of certain exemplary embodiments, an integrated circuit comprises at least one memory comprising cells and a memory built in self test (MBIST) circuit that is programmable by programming instructions following the manufacture of the integrated circuit so as to apply test data for at least one memory test algorithm of the memory to test the memory, the at least one memory test algorithm being determined by the programming of the MBIST circuit. The MBIST circuit of such embodiments comprises: an instruction memory adapted to receive programming instructions; an instruction decoder adapted to receive and decode programming instructions; an address generator responsive to the decoded programming instructions to determine addressing of cells of the memory to which test data is to be applied to perform the at least one testing algorithm, the address generator being responsive to the decoded programming instructions to address cells of the memory so as to perform at least one memory test algorithm having at least one nested loop; a data generator adapted to apply test data to the addressed cells of the memory in accordance with the decoded programming instructions and to provide an output of expected responses from the addressed cells to the applied test data, the memory producing a test results output from the addressed cells in response to the applied test data; and an output analyzer operable to compare expected responses from one or more cells of the memory to the applied test data with the corresponding test results for such one or more cells to the applied test data.

In accordance with more specific aspects of certain embodiments, an integrated circuit comprises at least one memory comprising an array of cells, each cell having a row address and a column address, the integrated circuit further comprises at least one memory built in self test (MBIST) circuit coupled to the at least one memory. The MBIST circuit in such embodiments comprises a decoder adapted to decode programming instructions, the programming instructions comprising configuration instruction words and algorithm instruction words, the decoder being adapted to distinguish algorithm instruction words from configuration instruction words and to separately decode the algorithm instruction words and the configuration instructions words, the configuration instruction words comprising an algorithm designating portion designating at least one test algorithm, the test algorithm comprising test steps to be applied to test the memory in accordance with the test algorithm, the algorithm instruction words comprising memory access operation portions that designate memory operations to be performed during test steps.

In accordance with more specific aspects of certain additional embodiments, an integrated circuit comprises at least one memory to be tested and a memory built in test (MBIST) circuit, the MBIST circuit being configured to apply at least one testing algorithm to the at least one memory in response to the instructions received from automated test equipment (ATE). In such embodiments, the MBIST circuit comprises: instruction memory adapted to receive instructions from the ATE; an instruction decoder operable to decode said instructions and to separate configuration instructions from algorithm instructions; an address generator responsive to the decoded instructions for addressing cells of the memory being tested in accordance with an addressing scheme determined from the decoded instructions, the addressing scheme addressing cells of the memory such that the application of test data to the addressed cells results in the execution of said at least one test algorithm to test the at least one memory; a data generator for applying test data to addressed memory cells to perform said at least one test algorithm on the memory as determined from the decoded instructions, the memory producing test response outputs from at least selected cells receiving data from the data generator; an output response analyzer operable to compare expected response data with the actual test response output from the selected cell so as to provide test results; and the integrated circuit also comprising a diagnostic monitor for recording diagnostic data when a fault is indicated by the test results.

Embodiments of methods relating to programming exemplary embodiments of programmable MBIST circuits are also disclosed herein.

In accordance with additional aspects of certain embodiments, flexibility is provided to allow a user to customize, or incrementally or modularly specify, the programmable MBIST circuit that is synthesized so that the MBIST circuit that is synthesized has the capabilities to perform algorithms desired by the user. For example, the user can designate the number of nested loops required to apply one or more memory testing algorithms desired by the user to be run by an MBIST circuit to test one or more memories of an integrated circuit. The MBIST circuit that is synthesized will be configured to have the capability of running memory testing algorithms having the number of nested lops designated by the user. As another example, the user can designate at least one category of memory testing algorithm from a plurality of categories of algorithms desired by the user to be run by a MBIST circuit to test one or more memories of an integrated circuit. The MBIST circuit that is synthesized will be configured to have the capability of running memory testing algorithms of the at least one category of algorithms designated by the user. As yet another example, a user can designate the number of address generators required for an MBIST circuit to run memory testing algorithms desired to be run by a user. The MBIST circuit that is synthesized will be configured to have the number of address generators designated by the user for running the memory testing algorithms desired to be run by the user.

As another example of the flexibility available from certain exemplary embodiments, a programmable MBIST controller is provided that can be programmed at run time to perform memory testing algorithms on at least one memory of an integrated circuit. Instructions for programming the programmable MBIST controller can be provided from an ATE, or less desirably from ROM or RAM. The programmable MBIST controller can be configured with other MBIST circuits for testing an integrated circuit using one or more testing algorithms, such as with hard encoded MBIST circuitry (e.g., using instructions encoded in a Finite State Machine). For example, the hard encoded algorithms can be used for production testing of memory of an integrated circuit. Thereafter, for example to troubleshoot defective circuits that are in returned products, the programmable MBIST circuit can be programmed at run time to apply additional memory testing algorithms to the integrated circuit to assist in searching for the source of previously undetermined defects.

Also, the programmable MBIST controller in accordance with exemplary embodiments, can be programmed at a later time to apply newly developed testing algorithms that are supported by the architecture of the MBIST circuit that was included in a manufactured integrated circuit.

In accordance with another aspect of exemplary embodiments, residual MBIST circuit components having unique configurations remain on the chip containing the integrated circuit. By residual, it is meant circuit components of a programmable MBIST circuit that have been used for memory testing, or that can be used for future memory testing, or both. Thus, an integrated circuit can comprise a memory built in self test (MBIST) circuit, with one or more of the following MBIST residual circuit components, as well as other residual components, on a chip containing the integrated circuit: (a) at least one inter-iteration and at least one intra-iteration address generator; (b) at least one step controller that when used in MBIST testing, allows the execution of multi-level nested loops within an algorithm step; (c) an instruction memory comprising a register coupled to a first in first out (FIFO) buffer that when used in MBIST testing, allows loading of the FIFO buffer in parallel with instructions from the instruction register; and (d) a diagnostic monitor that when used in MBIST testing, allowing restarting of testing from a current algorithm step corresponding to the step at which a fault was detected.

Other features will become apparent from the exemplary embodiments described below.

BRIEF DESCRIPTION OF DRAWINGS

FIG. 3 is a definition of an exemplary Algorithm Instruction word.

FIG. 3A is a definition of an alternative exemplary Algorithm Instruction word.

DETAILED DESCRIPTION 1.0 Overview

Figure 1:
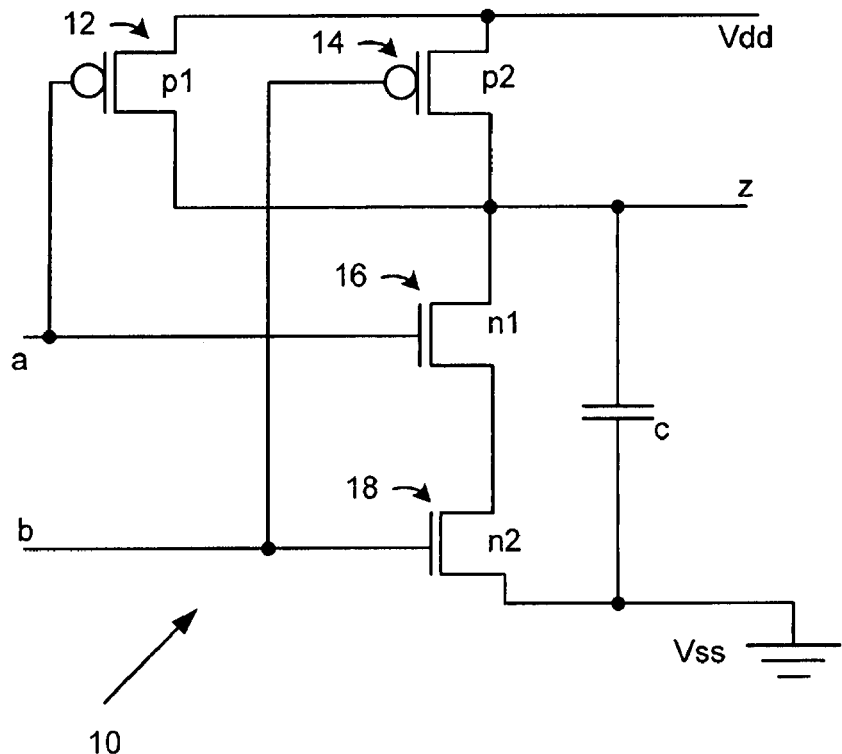
FIG. 1 is a schematic diagram of a 2-Input NAND gate.

Programmable MBIST, comprises a controller with a built-in custom processor on the chip that is used for testing memory. A programmable controller provides the capability to apply certain classes of algorithms and variations of the same and allows for changing the algorithms that are to be applied. The main advantages of certain desirable embodiments, but not all embodiments, of a programmable MBIST controller can be summarized as follows:

It allows modification of a test algorithm at run-time. This can be done by simply modifying the test program.

With rapid changes in technology, it is often difficult to predict all types of defects that can manifest themselves during a manufacturing process. During the ramp-up period of a manufacturing process, one can determine the defects that are escaping the applied tests, modify existing algorithms or introduce new algorithms to target those defects, and change the test program at run time to catch them.

Often, a chip and its revisions have a design life that is long enough to be manufactured with different technologies. A certain test suite that proved to be efficient for a particular technology when the chip was originally designed may not be satisfactory when the chip is migrated to a newer technology. Under such circumstances, additional algorithms may need to be applied to detect defects related to the newer technology. New algorithms can be encoded in a programmable memory BIST controller and applied to the memories under test.

A programmable controller can also be re-used across different revisions of a design or different designs. This reduces the verification time for BIST controllers.

A programmable MBIST controller does utilize additional overhead because a custom processor or controller has to be replicated several times for every group of memories across a design. Given that there could be hundreds of memories (or more) embedded in current designs, a large number of controllers are usually necessary, and therefore the area overhead for all these controllers could easily become substantial. However, one can optimize area overhead with the required flexibility by selectively choosing memories that are to be tested by programmable MBIST controllers.

The description initially provides an overview of selected exemplary algorithms that can be supported (e.g., that the controller, through programming can support). A combination of pre-selected and programmable algorithms can also be accommodated. Some of these algorithms are already supported by the MBISTArchitect® product released by Mentor Graphics Corporation. Exemplary instruction sets and hardware architecture are also described.

As used in this application and in the claims, the singular forms "a," "an," and "the" include the plural forms unless the context clearly dictates otherwise. Additionally, the term "includes" means "comprises." Further, the term "coupled" means electrically or electromagnetically connected or linked and does not exclude the presence of intermediate elements between the coupled items.

Section 2 below generally describes desirable features for a programmable MBIST controller including a listing of an exemplary set of the algorithms that will be supported. Section 3 describes an exemplary first embodiment of an architecture, where details of an exemplary instruction set are highlighted as well as a description of the different exemplary hardware blocks. Section 4 contains some examples of a pseudocode for exemplary algorithms using the instruction set described in Section 3. Section 5 describes alternative embodiments of a programmable MBIST controller. Sections 6 and 7 describe exemplary pseudocode for certain algorithms supported by selected embodiments. Section 8 discloses yet another embodiment. Section 9 describes exemplary interactions with an ATE and diagnostics examples. Section 10 describes exemplary programmable MBIST controller generation. Section 11 discloses a March-only MBIST controller embodiment.

2.0 General Description

The architecture for selected embodiments of the field programmable MBIST controller is desirably configured to meet the following criteria, in addition to being able to specify a test program at run time.

1. Support all algorithms that are currently supported by the MBISTArchitect® Product.

2. Support some advanced algorithms (examples of which are described below) to meet higher quality requirements.

3. Accommodate different data backgrounds, address ordering, and other addressing schemes required for executing the described algorithms.

4. Meet the speed requirements so that at least in certain desirable algorithms, the algorithms can be applied at-speed (e.g., at the design operating speed of the memory being tested).

5. Have manageable area overhead.

6. Be easily extended in the future to support new classes of algorithms.

The next section includes a description of some exemplary groups of algorithms that a desirable form of field programmable MBIST controller will support. Other algorithms can also be supported. In addition, one can select a smaller subset of algorithms to support.

2.1 Algorithm Support

A variety of algorithms that desirably will be supported by the programmable MBIST controller can be broadly classified into the categories that are listed in this section. These algorithms target reduced functional faults, meaning that the fault models are not purely based on the functionality of the memories but also take into consideration their electrical or geometrical level properties. Specifically, the algorithms target faults in which a single cell is involved (stuck-at and transition faults) or faults where a pair of cells are involved (coupling faults). The field programmable BIST controller of this disclosure will desirably not only support such algorithms, but also desirably supports additional classes of algorithms targeted towards improving test quality for the memories.

2.1.1 March Based Algorithms

A March test consists of a finite sequence of March elements. A March element is a finite sequence of operations applied to every cell in the memory by traversing all memory addresses in any order. The order of accessing memory cells can be the same for all March elements or can be opposite reversed for some March elements. As a variation, in a March element, an operation can access a memory cell whose address is a fixed distance from the current cell.

The programmable controller in some forms will desirably support the following standard algorithms as well as other March algorithms used in the industry today or hereafter developed.

March C+ (also called March 2),
March C,
March C− (also called March 1)
March 3
Column March
Unique data
Row stripe/column stripe The above set of algorithms primarily target the following types of faults in the memories, namely, stuck-at faults (SAF), transition faults (TF), coupling faults (CF), inversion coupling faults (CFin), idempotent coupling faults (CFid), stuck-open faults (SOF), and certain address decoder faults (AD). The objectives of March algorithms are simple, that is, every memory cell should be able to be in a state 0 and state 1; and in order to detect the TFs and CFs, all cells should undergo a rising and a falling transition.

In the March algorithms class, the addressing is fairly straight forward. That is, the controller marches through all the addresses of the memory in either an ascending or descending order. Usually, the increment for advancing or decrementing the address is 1, however other address increments may also be used. In a particular test step, the different operations are performed at the same address location. Usually, this can be achieved using just a single address generator. Various data backgrounds can be used when applying the above tests.

In addition to desirably supporting the standard March algorithms listed above, the users can desirably define their own class of March algorithms using single memory access operations, either a single read or write activity, or a more complex sequence of operations that could be formed by using these read and write operations. User Defined Algorithms (UDA) provide some flexibility in terms of defining custom algorithms, however, known UDA approaches are restricted to only March algorithms that follow fairly simple addressing schemes.

The variations of the March algorithms typically come from the following:

The operations (meaning "r" or "w") in a step can be changed by the user to any sequence suiting their process.

The total number of operations corresponding to an algorithm can also vary depending on what the user chooses.

One variation is in a step accessing address "n", that is, one of the operations can access address "n−1" or "n+1". These variations are desirably supported by certain embodiments of the exemplary field programmable BIST controllers disclosed herein.

2.1.2 Other Exemplary Tests

These classes of tests help in detecting non-functional faults, such as refresh and sense-amplifier recovery faults. They are more complex than March algorithms and provide better fault coverage at a cost of consuming more test application time. Some exemplary conventional test algorithms are described below that desirably can be selectively implemented (e.g., by programming) using a field programmable MBIST controller as disclosed herein.

2.1.2.1 Checkerboard Algorithms

Checkerboard algorithms are a class of unique address algorithms, and row stripe and column stripe algorithms that are variations of March algorithms. In all of these algorithms, the addressing scheme remains the same as in the March class of algorithms, but the data written is address dependent. The field programmable BIST controller of this disclosure desirably supports any such checkerboard algorithm.

In an exemplary checkerboard algorithm, the memory cells are divided into two groups, namely, c_1 and c_2, forming a checkerboard pattern. These two groups are always written with opposite values. The checkerboard patterns detect shorts between two adjacent cells, under the assumption that the address decoder functions correctly. Since each cell containing a 1 is surrounded by cells that contain a 0, and the other way around, the checkerboard test can also maximize the leakage current between cells, thereby detecting defects that result in high leakage current. The complexity of the algorithm is O(n), where n is the number of words in the memory. An exemplary checkerboard algorithm can be described as follows:

W1 to all cells in c_1 and W0 to all cells in c_2.

Read all words.

W0 to all cells in c_1 and W1 to all cells in c_2.

Read all words.

2.1.2.2 Galloping/Walking algorithms

Exemplary algorithms for GALPAT (GALlopping PATtern) and Walking 1/0 are very similar in nature. In both of these cases, the memory is divided into two categories, namely, base cell and the remaining cells (which can be called the locally addressed cells). The entire memory is filled with 0s (or 1s) except for the base cell that contains the opposite value, e.g., a 1 (or a 0). During the test, the base cell walks through the memory. When the value in the base cell is changed, all other memory cells will be read to verify if they have been affected by the write operation to the base cell, and the base cell will be read after the read operations in the other cells. The difference between the GALPAT and Walking 0/1 algorithms is in the way the base cell is read. In Walking 0/1, after each step, all cells are read with the base cell last. On the other hand, with GALPAT, while reading all the other cells, after reading every cell the base cell is also read. Variations of these algorithms include: the local cells can be just the cells in the same row or in the same column with the base cell; extra read or write operations can be added to a galloping/walking step, for example, a galloping step (W0, (R1, R0), W1) can be also modified to (W0, R0, (R1, R0), W1).

The Galloping/Walking 0 and 1 algorithms have two loops, the first loop is a base loop that marches through all addresses of the memory. The second loop is the inner (also called local) loop that loops through the address space in a specific order for a given base address. These are more complex algorithms than March algorithms and require additional test application time.

These algorithms detect all AFs, all SAFs, all TFs, and some coupling faults. In addition, the AFs and CF can be located accurately, because the coupled cell is read immediately after writing the coupling cell, before any further write operations take place. The same is true for the address decoder faults. The complexity of both the GALPAT and Walking 0/1 algorithms is $O(n^2)$.

Exemplary GALPAT and Walking 0/1 algorithms are described below.

---

GALPAT algorithm

```
for data_background = 0 to 1 do // loop 1
    for base_cell = 0 to n−1 do // loop 2
        write ~data_background to base_cell
        for (local_cell = 0 to n−1) do // loop 3
            if (local cell != base_cell)
                Read data_background from local_cell
                Read ~data_background from base_cell
            endif
        end loop // loop 3
        write data_background to base_cell
    end loop // loop 2
end loop // loop 1
```

Walking 0/1 algorithm

```
for data_background = 0 to 1 do // loop 1
    Initialize memory to data_background
    for base_cell = 0 to n−1 do // loop 2
        write ~data_background to base_cell
        for (local_cell = 0 to n−1) do // loop 3
            if (local cell != base_cell)
                Read data_background from local_cell
            endif
        end loop // loop 3
        Read ~data_background from base_cell
        write data_background to base_cell
    end loop // loop 2
end loop // loop 1
```

---

As mentioned earlier, the only difference between the above exemplary GALPAT and Walking 0/1 is in the way the base cell is accessed after each read operation of the memory. This not only reduces the complexity of the algorithm but also reduces the test application time.

2.1.2.3 Sliding Diagonal

Since the complexity of the GALPAT and Walking 0/1 algorithms are quite high, the sliding diagonal is a shorter alternative to them. In an example of this case, the cells in the diagonal are accessed in parallel instead of a single base cell. Since the diagonal cells are addressed, both the row and column decoders are being tested simultaneously. The exemplary algorithm starts by writing the entire memory with either all 1's or 0's. If the background is 0, then the diagonal is written with 1s, and vice versa. The entire memory is read subsequently, after which the diagonal is shifted to the right. This process is repeated until every cell becomes part of the diagonal. The sliding diagonal algorithm detects all SAFs and TFs. In addition, this algorithm would detect most of the AFs and some CFs. Not all CFs will be detected because all diagonal cells are written consecutively, and therefore some coupling faults will be masked by some other coupling faults.

An exemplary sliding diagonal algorithm is represented as follows.

```
for data_background = 0 to 1 do // loop 1
    Write data_background to all non-diagonal cells
    Write ~data_background to all diagonal cells
        for base_cell = 0 to max_cloumn−1 do // loop 2
            Read all cells
            Write data_background to all diagonal cells
            Write ~data_background to the right of the diagonal cells
        end loop // loop 2
end loop // loop 1
```

The complexity of the sliding diagonal algorithm is of the order $O(n.n^{1/2})$, where n is the number words in the memory. However, for correct application of an exemplary form of the test, the exact location of the each and every memory word must be known.

2.1.2.4 Butterfly

Butterfly is a variation of the GALPAT test that reduces the complexity of applying the test. Similar to the GALPAT algorithm, the memory is filled up, for example with background 0s except for the base cell, which contains a 1. During test application, the base cell actually walks through the memory. While reading, only the four cells that are direct neighbors (east, west, north and south) of the base cells are read, i.e., a distance of one from the base cell. Depending on the implementation, other neighboring cells at a distance of 2, 4, 8, and 16 can be read successively. More generally, the local cells of the algorithm have a distance of $2^n$ from the base cell in 4 directions: east, west, south and north, that is, the addresses of local cells are (base row/column address $+/-2^n$), where n is from 0 to N−1 and N is the number of row or column address bits. Here we assume the memory is square. Additional read or write operations can be added as needed.

The Butterfly algorithm detects all SAFs since every cell is written with both 0 and 1, and some of the address decoder faults are detected as well. An exemplary butterfly algorithm can be described as follows.

```
for data_background = 0 to 1 do // loop 1
    Write data_background to all cells
    for base_cell = 0 to n−1 do // loop 2
        Write ~data_background to base_cell
        for (distance = 1 to max_distance) do // loop 3
            Read data_background at distance north from base_cell
            Read data_background at distance east from base_cell
            Read data_background at distance south from base_cell
            Read data_background at distance west from base_cell
            Read base_cell
            distance = distance * 2;
        end loop // loop 3
        Write data_background to base_cell
    end loop // loop 2
end loop // loop 1
```

The complexity of the Butterfly algorithm can be denoted as $O(n.\log_2(n))$, where n is the number of memory words that have to be tested.

The Butterfly and Sliding diagonal have two levels of looping and may need two address generators for at-speed testing.

Variations in algorithms that have two-levels of looping and require two or more address generators such that the second address can have any arithmetical or logical relationship to the first address, are also desirably supported by the architecture of certain embodiments of a field programmable BIST controller as disclosed herein. The addresses can also use any increment as specified in an index register.

2.1.3 Additional Memory Test Algorithms

These exemplary tests cover some of the faults that are not detected by the algorithms described earlier. The faults that these algorithms target manifest themselves in the address decoder, in the memory cells, in the write enable signals, etc. Various algorithms and updated versions of the same have been proposed to target these faults. Some algorithms targeting such faults are described in the following sub-sections.

2.1.3.1 Address Decoder PMOS Open Faults

These faults usually occur in the address decoders built out of CMOS technology and are primarily caused by a missing contact or via during the manufacturing process. In CMOS technology, only a subset of open defects cause stuck-at behavior and can be detected using March tests. However, other such defects cause the combinational circuit of the decoder to behave as a sequential circuit and cannot be detected using the traditional March tests. Occasionally, these faults also change the delay behavior of the circuit, and therefore, have to be tested at full-speed in order to detect any failures.

This class of algorithm in general does not target faults in the memory array and are primarily used to generate two pattern tests for stuck-open faults in the PMOS part of the address decoder. In this case, the algorithm has two levels of nested looping. The local address, however, is related in a specific way to the base address. The local address may be generated by XORing base address and $2^n$, where n is from 0 to N−1 and N is the number of address bits.

FIG. 1 illustrates a typical implementation for a 2-input NAND gate 10, which consists of two pull-up transistors 12,14, namely, p1 and p2 (PMOS), and two pull-down transistors 16,18, namely, n1 and n2 (NMOS).

The functionality of the above NAND gate can be briefly explained as follows: When, both inputs a=b=1, the output z of the NAND gate is zero, whereas, when any one of the inputs are set to 0, then the output changes to $V_{dd}$. Any stuck-open defect in the NMOS transistors will manifest itself as a stuck-at fault in the memory cell, and the March test should pick the defect(s) up. However, the remaining faults that affect the PMOS transistors result in imposing a sequential behavior to the NAND gate and require a pair of patterns for their detection. It is desirable to detect such stuck-open defects in the PMOS transistors. Assuming that one of the PMOS transistors p2 has a stuck-open fault, the behavior of the NAND gate changes as set forth in Table 1 below:

TABLE 1

NAND gate behavior with PMOS open defect.

| a | b | p1 | p2 (faulty) | N1 | n2 | z |
|---|---|-----|-------------|-----|-----|------|
| 0 | 0 | on  | on          | off | off | 1 |
| 1 | 0 | off | on          | on  | off | $z_{old}$ |
| 1 | 1 | off | off         | on  | on  | 0 |
| 1 | 0 | off | on          | on  | off | $z_{old}$ |

Figure 2:
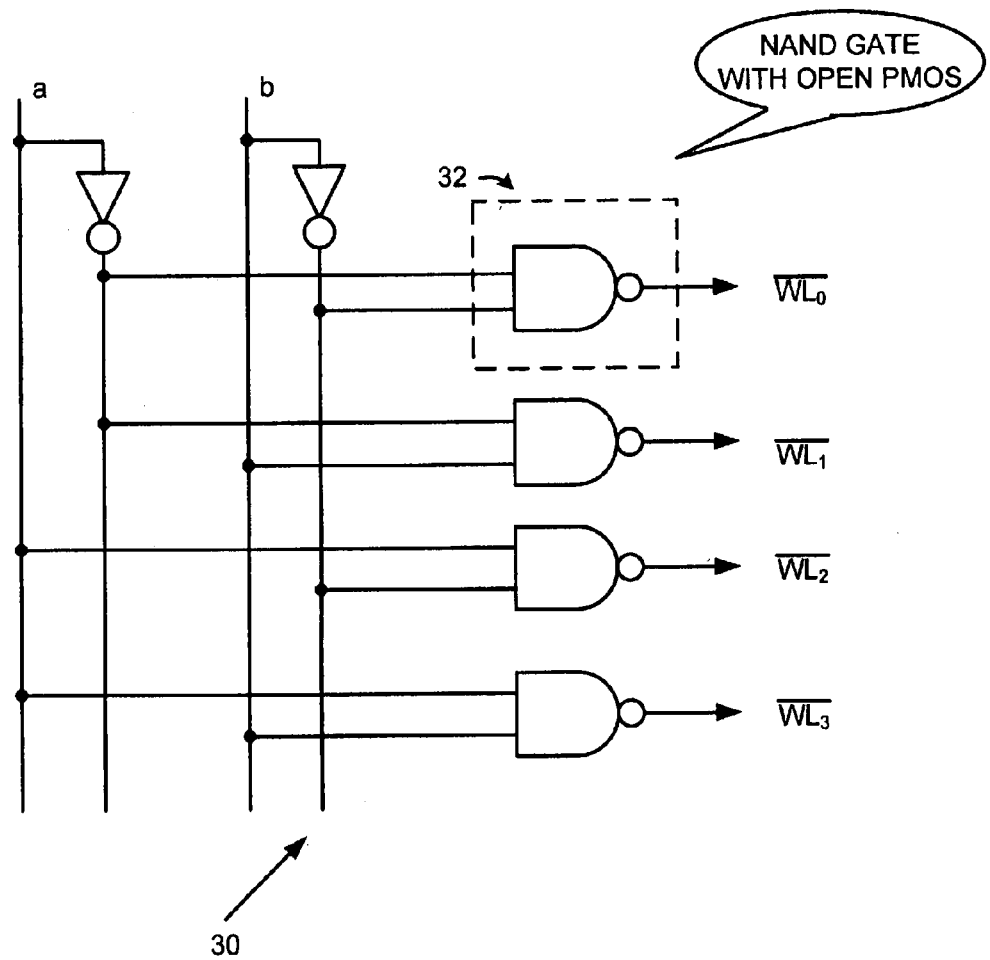
FIG. 2 is a portion of an address decoder for two address lines.

A circuit diagram of an exemplary address decoder, assuming two input address lines, is shown in FIG. 2.

TABLE 2

Truth table for the Address Decoder in the presence of a fault.

| A | b | $WL_0$ | $WL_1$ | $WL_2$ | $WL_3$ |
|---|---|--------|--------|--------|--------|
| 0 | 0 | 1      | 0      | 0      | 0 |
| 0 | 1 | "1"    | 1      | 0      | 0 |
| 1 | 0 | 0      | 0      | 1      | 0 |
| 1 | 1 | 0      | 0      | 0      | 1 |

The address decoder 30 of FIG. 2 is supposed to select any one of its selector lines depending on the input address values, such that one of the memory locations gets written. Assume that the NAND gate 32 that controls the first selector line ($WL_0$) has an open PMOS transistor. In this case, the behavior of the faulty address decoder is indicated in Table 2 above. When the value of the address lines (a, b) are "00", data is written into the first memory location. However, when the address is changed to "01", then data is written at both the first and the second memory locations. In a fault free environment, when the address bits are "01", only the select line $WL_1$ should have been selected. However, due to the stuck-open fault in the first NAND gate, the select line $WL_0$ stores the old value and gets selected. In other words, if a sensitized value is written in address "01" that is different from what is in address "00", the fault could be detected by reading the address location "00" later.

The following exemplary algorithm can detect most of the PMOS open defects in the address decoder lines.

```
Initialize memory with data_background
for base_address = 0 to n-1                    // loop 1
    Write ~data_background to base_address
    for i = 0 to N-1 do // loop 2
        local_address = base_address XOR (1 << i) // Hamming
            distance of 1
        write ~data_background to local_address
        Read data_background from base_address
    end loop // loop 2
    Write ~data_background from base_address
end loop // loop 1
```

The complexity of the algorithm can be determined as follows. The inner loop is executed (N−1) times (N=$\log_2 n$, n being the number of memory words) and it has one read and one write operation. The outer loop is executed n times once for each memory word. Therefore, the overall complexity of the algorithm is of the order $O(n.\log_2 n)$.

It should be noted that the five groups of algorithms (March, Galloping/Walking, Butterfly, Sliding Diagonal and PMOS open fault) can use any data background.

2.1.3.2 Bit/byte Write Enable Faults

These fault models manifest themselves when there are multiple write enable signals for a particular memory. When the conventional algorithms are applied, the controller assumes that all the write enable signal are asserted during the application of the algorithm. Therefore, if there are certain write enable signals that are stuck at an asserted value, those faults remain undetected. Similarly, coupling faults between pairs of write enable signals remain undetected by such algorithms. The following exemplary test is desirably designed to target faults in write enable signals that are independent of the tests for address decoders or the actual memory cells.

These write enable mask tests are a class of algorithms that desirably allow testing of all write enable signals associated with different bits of a memory word. These algorithms are desirably not used to test memory arrays, but desirably test the write mask enable signals to see if there are any stuck-at or coupling faults between them.

These algorithms can be extended to test any memory control signal and not just write enable mask signals. The exemplary architecture discussed below will allow such an extension.

The basic operation of one such exemplary algorithm assumes selective assertion of the write enable signals and evaluates whether the memory cells have different values depending upon whether the corresponding write enable signal is asserted (or de-asserted). When performing a write operation to a particular memory location, desirably only a subset of the write enable signals are asserted. When reading back the data from the same memory location, the algorithm will check if the bits corresponding to the enable bits have been updated whereas the remaining bits are not. In addition, this algorithm is usually applied at the very end after the verification of the address decoder and the memory cells, such that any error occurring then can be attributed to faults in the write enable signals.

Assuming bit write enable signals, a particular implementation of the algorithm described below targets all stuck-at faults in the individual write-enable signals as well as all coupling faults between pairs of write-enable signals. Note, the write-enable signals in this example are assumed to be active low.

WEN=0x00, Write 0x00 to the lowest and highest memory address locations

WEN=0x55, Write 0xFF to the lowest and highest memory address locations

Read 0xAA from the lowest and highest memory address locations

WEN=0x00, Write 0x00 to the lowest and highest memory address locations

WEN=0xAA, Write 0xFF to the lowest and highest memory address locations

Read 0x55 from the lowest and highest memory address locations

The above algorithm entails the application of only twelve vectors. Depending on how one wants to test the write enable signals, the complexity of the algorithm can vary. However, the algorithm is desirably always a linear function of the number of write enable signals corresponding to a single memory word.

2.1.3.3 Multi-port Testing

The exemplary architecture in some embodiments desirably supports algorithms related to multiple-port tests. For example, port-interaction algorithms can be supported. In addition, the architecture also desirably supports "port isolation" tests that check whether a memory can be read and written simultaneously through various ports. Variations of these algorithms that require addressing schemes requiring one or two address generators can be supported.

2.1.3.4 Checksums

The exemplary architecture in some embodiments will also desirably be able to do a checksum of the bits by reading a memory location. This is useful for cases in which it becomes difficult to predict the data that is written into the memory. For example, if desired to write a memory in the functional mode and for the BIST controller to read the contents of the memory and generate a check-sum, this would be supported by the exemplary architecture.

2.1.3.5 Nested Loops

An alternative architecture disclosed below is designed to test any number of nested loops in a specific algorithm step. If there are algorithms that have more than two nested loops, the alternative architecture can, for example, either synthesize multiple address generators or re-use existing generators to address different schemes used in different loops.

3.0 Exemplary First Embodiments of a Programmable MBIST Controller

The architecture for an exemplary embodiment of a programmable controller desirably comprises two primary parts, an instruction set and hardware design. The instruction set is desirably designed in a way such that the programmable controller is able to run all the algorithms that are described in the previous section and other algorithms that may be selected in the future. In some embodiments, the controller may be programmable to support a smaller set of algorithms or only one algorithm type. Additionally, the architecture will desirably provide flexibility for supporting customized algorithms at least for certain classes of algorithms. For some classes of algorithms, although there is flexibility, the selectability of algorithms may be restricted or limited to ensure that the hardware overhead for a programmable controller doesn't become excessive when compared to a conventional hard wired MBIST controller.

Various exemplary addressing schemes and data that is written at different memory locations in order for a programmable MBIST controller to support all the algorithms that are listed in Section 2 will next be described.

1. Addressing schemes: The address space for different algorithms can desirably be divided into two categories, namely, base address and local address. The base address refers to an address that is used as a reference when applying a specific test and is loaded, for example, into a primary address register. For example, in case of March or Checkerboard patterns, there is only one address of interest for any operation (or combination of operations) and such address is denoted as the base address. In GALPAT or Walking 1/0 algorithm, the memory cells are desirably divided into two groups, namely, the base cells and the remaining cells. The address for the base memory cells are referenced by the base address, whereas, given a particular base address, the local address indicates all the remaining cells that are of interest during the algorithm test application. The local address loops through all the remaining memory cells or loops through only a subset of the remaining cells depending upon the algorithm. The manner in which the base and the local address have to change and the relationship between the two, in one specific example, are indicated below.

A desirable form of programmable MBIST controller is able to increment/decrement the base address only—specifying the order of access either in an ascending or descending manner (March and Checkerboard).

A desirable form of programmable MBIST controller is able to perform addressing in a row-first/column-first manner for the base address. This indicates the addressing schemes desirably required for either Col_March1 (type of March test algorithm) or row-first/column-first algorithms. In case of the Sliding Diagonal algorithm, the base address is desirably set in a way such that certain patterns are written along the diagonal in the cell array and then the entire memory is read back.

Presently, in most of the March algorithms, whenever there is a step like $(rwr)_B$, the step indicates that the operations are done at the same base address (B). However, a desirable form of the programmable controller will support a read or a write operation in an address that is in the neighborhood of the base address. For example, $(r_B w_B r_{B+1})$ or $(r_B w_B r_{B-1})$ indicates that the second read operation is done from the memory address obtained after respectively incrementing or decrementing the base address.

Desirably, a user or the controller in one form is able to set the maximum and minimum addresses where the test is to be applied. This provides flexibility in choosing the range of memory addresses during test application.

The programmable MBIST controller in a desirable form is able to set the local address relative to the value of the base address. This could be equal to the base address or all the remaining addresses except the base address (GALPAT and Walking 0/1).

The programmable MBIST controller in one form also desirably is able to set the local addresses by a certain offset (1, 2, 4, . . . ) in every desired direction from the base address. This accommodates the Butterfly algorithm.

The programmable MBIST controller in one form also desirably has the capability to set the local address by a certain offset that is a Hamming distance of 1 with respect to the base address (accommodates the detection of address decoder PMOS open faults).

In addition, the programmable MBIST controller in one form desirably is able to change the local address direction in either row-first, col-first, row-only, and col-only fashion. An exemplary default approach is to change the local address in a row-first manner.

2. Read/write: Desirably, one form of programmable MBIST controller is capable of differentiating whether an instruction is a read or write instruction.

3. Data/data inverse: It is desirable to indicate to a programmable MBIST controller whether the data will be written as it is or be inverted before writing to a particular memory address. This also helps in selecting the data background or the inverse of data background when initializing a memory.

4. Support for different loops in the algorithms. Generally, most of the March and Checkerboard algorithms have two loops, namely, a loop that specifies the data background and a loop that goes through all the memory locations. On the other hand, some of the more complex algorithms, like the Address decoder PMOS open or GALPAT/Walking 0/1, have three loops. The additional loops permit specification of how the local address is changed for every reference base address. The first loop that denotes the data background can be unrolled. However, desirably the programmable MBIST controller supports operations that loop through the base and the local addresses.

5. Some algorithms require more complex looping behaviors with more levels of looping. A desirable form of MBIST controller supports a generic looping capability, such as to concurrent levels of looping. Each level of looping in this example utilizes an address register.

Each address looping activity will in one form, allow the loop's address register to be modified in the following ways:

a. Increment or decrement in either column first or row first manner.

b. Increment or decrement along either a single column or single row.

c. Increment or decrement along the leading diagonal.

As an alternative to the above absolute address operations, a number of relational address generation schemes can be used. These can, for example, use the address register to hold an intermediate, walking 1, value that is then applied to the address register of either the enclosing nesting level or level 0. This form of address computation in one embodiment is not supported for the outer nesting level, level 0. The following relative modifiers are desirably supported:

a. XOR. The walking one is exclusive-ored with the selected address register, this generates the address sequence that contains all addresses that are a Hamming distance of one away from the selected address register.

b. Offset. The walking one can be used as an offset from the selected address register.

6. Memory Access Address Computation. A loop can contain one or more memory access operations. These operations can perform individual read or write accesses to the memories under test. Each access is desirably able to specify which level of loop's address register is to be used for that operation. In one example, the operations in an outer loop, nesting level 0, can only use address register 0. However, those in an inner loop, for example at nesting level 3, can in this example use the address register for level 0, 1, 2 or 3.

As well as desirably being able to specify the address register to use, each memory access operation can also, in one form, specify a limited set of modifications to be made to the address register value before it is used. The following modifications are examples of this approach.

a. Address unmodified.

b. Inverse of address c. Address plus index offset d. Address minus index offset 7. Memory Address Range. A loop can desirably operate over the entire memory address range or can be constrained to a region of the address space, such as by specifying the initial and last address values. The memory test assembly process desirably evaluates the test algorithm and verifies the validity of the given address range. For example, an evaluation to confirm that it is possible to reach the last address given the starting address and address manipulation definition.

8. Memory Access Operation Type. During the conventional read and write operations at the selected memory address a programmable MBIST controller will, in one form, be able to perform a read without comparison operation. For example, in a read without comparison operation, the value read from memory can be ignored, unless MISR (multiple input shift register) compression is selected, in which case the value will be captured by a MISR. It can also be possible to update an internal data register with the value read from the memory.

9. Data Inversion. Each memory access operation desirably in one form will be able to specify that the data being written or read is either the inverted or non-inverted form of the base data value.

A programmable MBIST controller of more limited utility need not have all of the features set forth above. That is, one or more subsets of such features can be included in a programmable MBIST controller as desired.

3.1 Instruction Design

The functionality of different instructions is desirably grouped into two categories or instruction types, namely, Algorithm Instructions and Configuration Instructions. Algorithm Instructions are desirably the ones that are directly related to specifying the operation that needs to be performed in the address space. Algorithm Instructions correspond to the memory access operations that are to be performed during a test algorithm step to be executed. In one form, Algorithm Instructions select an address register and modifier to be used, a data pattern modifier, and a memory access operation. In contrast, Configuration Instructions are desirably those instructions that specify the control of various operations during execution of the test algorithm. The Configuration Instructions in selected first embodiments of a programmable MBIST controller desirably specify the algorithms that are applied so that the controller knows how to decode the subsequent instructions; how the address changes corresponding to the scheme needed for the algorithm; and how data is changed between different operations. The Configuration Instructions also establish how an instruction decoder is loaded with an instruction and generates appropriate control signals. Configuration Instructions in one form are decoded and are executed to modify the configuration of the programmable MBIST controller and other activities across the entire test algorithm step that is about to be executed. Differentiating the instructions into two separate sets provides flexibility to address the timing issues associated with decoding the instructions and ensuring that the instructions can be fetched and decoded at-speed in particularly advantageous embodiments. The separation of instructions into these two categories allows a desirable form of programmable MBIST controller to process the Configuration Instructions as they are encountered and buffer the Algorithm Instructions until an entire algorithm step is complete. When an entire test algorithm step has been encountered, an exemplary programmable MBIST controller will commence execution of the memory access operations and loops. In one example, Configuration Instructions can interact with the programmable MBIST controller's loop nesting mechanism, causing it to enter a loop or to terminate a loop.

Although this can be changed, desirably the instruction word size for a proposed exemplary Algorithm Instruction architecture is nine bits (see the examples of FIGS. 3, 3A). Although this can be changed, the instruction word size for a proposed, exemplary Configuration Instruction word architecture is also nine bits (see the example of Tables 3 and 4). Although the reverse can be used, in a specific example, all Configuration Instructions have bit 0 set to 0 and all Algorithm Instructions have bit 0 set to 1.

3.1.1 Algorithm Instructions

Assume, for example, that bit [0] designates whether the instruction is an Algorithm Instruction or a Configuration Instruction. Also, assume that, if bit [0] is "1", the instruction is an Algorithm Instruction. In the example of FIG. 3, the definition of an exemplary Algorithm Instruction word is as follows.

Bit [0]—differentiates between two types of instructions—algorithm or configuration. In this case, it is "1" for an Algorithm Instruction.

Bit [1]—specifies whether it is a read or write operation that is performed on a specific memory location. A read or write operation, desirably is applied for the entire memory word. As a specific example, a value of "0" in this bit indicates a Read operation, whereas, a value of "1" in this bit indicates a Write operation.

Bit [2]—in this example, indicates whether the data to be read or written from a memory location is the data background or inverse of data background. A value of "0" in this bit indicates, in this example, that the data corresponding to the data background is selected, whereas, a value of "1" indicates that the inverse of the data background is selected.

Bits [4:3]—these two bits, in this example, denote the addressing scheme that is used to write or read data. As mentioned earlier, there are two addresses that are of concern in this example, the base address and the local address. For most March algorithms, the base address is the only one required. However, for some of the above algorithms like GALPAT, Walking 0/1, Butterfly, Sliding diagonal, and Address decoder PMOS open algorithms, a local address is also necessary. Depending on the value of these bits, the controller knows whether the operation is intended for the base address or the local address. An exemplary addressing scheme that can be supported is as follows.
  a) "11"—Means (base_addr−1). In other words, a read/write operation should be done at a previous address location relative to a base address. This is often necessary to support certain March algorithm steps such as $(R_B, W_B, R_{B-1})$.
  b) "10"—Means (base_addr+1). Similar to the above case, a read/write operation should be done at the next address location relative to a base address. This is necessary to support certain March algorithm steps such as $(R_B, W_B, R_{B+1})$.
  c) "01"—Denotes local_addr. In other words, the corresponding read/write operation should be done at the local address.
  d) "00"—Denotes base_addr. In other words, the corresponding read/write operation should be done at the base address.

Bits [8:5]—these four bits, in this example, help in specifying the loop boundaries. As mentioned before, some of the algorithms described above necessitate support for two types of loop structures, namely, a base loop and a local loop. The base loop denotes the primary loop and, in this example, is also the reference loop for all the algorithms. On the other hand, the local loop provides the ability to loop through the local addressing scheme for a particular base address. For example, in case of March algorithms, the base loop is the only loop and the local loop is non-existent. Whereas, for GALPAT, for every base address, the local address loops through the entire address space with the exception of the base address location. Since four bits are necessary in this example, a one hot encoding is desirably employed. Exemplary individual bit assignment are as follows.

Bit [5]—Begin of local loop (BLL).
Bit [6]—End of local loop (ELL).
Bit [7]—Begin of base loop (BBL).
Bit [8]—End of base loop (EBL).

Assuming the above bit allocation, the various combinations that are required for the algorithms described above are as follows.
  a) "0000"—indicates intermediate operation and not any loop boundary (IOP).
  b) "0100"—indicates the beginning of base loop (BBL).
  c) "1000"—indicates the end of the base loop (EBL).
  d) "0001"—indicates the beginning of the local loop (BLL).
  e) "0010"—indicates end of the local loop (ELL).
  f) "1100"—indicates beginning and end of base loop (BBL-EBL). This type of loop structure in an instruction indicates a single operation step.
  g) "0011"—indicates beginning and end of the local loop (BLL-ELL). This also indicates a single operation step in the local loop.
  h) "1010"—indicates end of both the base and the local loop (ELL-EBL).
  i) "1011"—indicates the beginning and end of local loop as well as the end of base loop (BLL-ELL-EBL).

In an alternative example of FIG. 3A, the definition of an exemplary Algorithm Instruction Word is as follows.

Bit[0] is a 1, and specifies this as an Algorithm Instruction.

Bits [2] and [1] select the type of memory access operation to perform at each address that this instruction is executed for. The options in this example are read, read without comparing the value, write, or NOP (no operation).

Bit [3] determines if the currently configured data pattern or its inverse is used for the memory access operation of the instruction.

Bits [4] and [5] control how the address will be modified before it is applied to the memories under test. In this example, the address can be used as is, inverted or subject to an index offset. The value of the index register can be loaded using, for example, a configuration instruction "control/load/index".

Bits [6] and [7] select the address register that is to be used by this instruction. Since, in this example, the address registers correspond to the loop nesting levels within the test algorithm step, selecting an address register beyond the current loop depth that is not currently active, will cause undefined behavior.

Currently bit [8], in this example, is always 0, leaving this bit available for extensions of this exemplary Algorithm Instruction word by using this bit.

Other Algorithm Instruction word examples are described below.

3.1.2 Configuration Instructions

Exemplary Configuration Instructions are used in these first embodiments to indicate the class of algorithm, the addressing schemes, data backgrounds to be used, and certain program control definitions. Example Configuration Instructions are set forth in Tables 3 and 4. Alternative examples are set forth below.

Assume that bit[0] is "0", corresponding to a Configuration Instruction in this specific example. The Configuration Instructions are desirably designed hierarchically, in this example, such that each field could be re-used depending on the definition in the preceding field. Since the Configuration Instructions need not change after every operation of a test step, there is sufficient time to decode these instructions as more time is typically available between such decoding in comparison to the more rapidly occurring Algorithm Instructions. Starting from the MSB (most significant bit), one exemplary Configuration Instruction is encoded as follows.

Bit [8]—currently not used—and can be incorporated for later extensions.

Bits [7:6]—these bits are desirably used to select between different types of Configuration Instructions such as algorithm selection, program control, address configuration, data configuration, or other questions.

Bits [5:4]—these two bits are desirably used to further divide the different Configuration Instructions into sub-categories. For example, the address Configuration Instructions can be sub-divided into four categories to specify the base address direction, base address loading (ability to load the maximum and minimum address values in which the test can be applied), local address direction with reference to the base address, and local address offset bits.

Bits [3:1]—these three bits desirably further define the function of each sub-category of the Configuration Instruction. For example, the base address direction can be classified into seven groups, namely, increment, decrement, diagonal, row only, column only, row addressing, and column addressing.

Bit [0]—this is set to "0" when the instruction is related to configuration management.

The details of exemplary Configuration Instructions and the opcode associated with each are illustrated in Table 3 and Table 4 below. Note that, depending on the type of instruction, the fields have different implications. For example, if bits [7:5] are "000", then in the Table 3 example the next four bits [4:1] can be used to define the various classes of algorithms that the programmable MBIST controller supports.

TABLE 3

Exemplary Configuration Instruction

| [7:6] | [5] | [4] | [3:1] | [0] |
|---|---|---|---|---|
| MISC (00) | Algorithm Selection (0) | | Test Algorithms (0000-1111) | Config (0) |
| | | Program Control (10) | NOP (000) Pause (001) Stop (010) | |
| | | Special OP (11) | Set Write Mask 0 (000) Set Write Mask 5 (001) Set Write Mask A (010) | |
| ADDRESS (01) | | Base Direction (00) | Column Addressing (000) Row Addressing (001) Row Only (010) Column Only (011) Diagonal (100) Increasing (110) Decreasing (111) | |
| | | Base Load (01) | Load MAX Address (000) Load MIN Address (001) | |
| | | Local Direction (10) | Column Addressing (000) Row Addressing (001) Row Only (010) Column Only (011) | |
| | | Local Offset (11) | Set Local To Base (000) Offset Scheme 1 (101) Offset Scheme 2 (110) | |
| DATA (10) | Data Selection (0) | | Data Backgrounds (0000-1111) | |
| | | Data Type (10) | Solid (000) Checkerboard (001) Row Stripe (010) Column Stripe (011) Unique (100) | |
| | | Data Update (11) | Update Data Background (000) Update Scheme1 - Next (001) Update Scheme2 - Shift (010) Data Start (011) | |
| EXTENSION (11) | | | | |

Another specific example of a configuration word is set forth in Table 4 below.

TABLE 4

Exemplary Alternative Configuration Instruction Word

| [8] | [7] | [6] | [5] | [4] | [3] | [2] | [1] | [0] | N° |
|---|---|---|---|---|---|---|---|---|---|
| 0 | 00 Control | | | 000 Program | | 000 NOP | | 0 | 1 |
| | | | | | | 001 Pause | | | 2 |
| | | | | | | 010 Stop | | | 3 |
| | | | | | | 011 Reserved | | | 4 |
| | | | | | | 100 Reset_Fail_flag | | | 5 |
| | | | | | | 101 Reset_State | | | 6 |
| | | | | | | 110 Reset_Mask | | | 7 |

TABLE 4-continued

| [8] | [7] | [6] | [5] | [4] | [3] | [2] | [1] | [0] | N° |
|---|---|---|---|---|---|---|---|---|---|
| | | | | | 111 Algorithm_Start | | | | 8 |
| | | | 01 Loop | | Loop Offset | | | | 9 |
| | | | 10 Mask | | 000 Set0 | | | | 10 |
| | | | | | 001 Set1 | | | | 11 |
| | | | | | 010 Set2 | | | | 12 |
| | | | | | 011 Set3 | | | | 13 |
| | | | | | 100 Set4 | | | | 14 |
| | | | | | 101 Set5 | | | | 15 |
| | | | | | 110 Set6 | | | | 16 |
| | | | | | 111 None | | | | 17 |
| | | | 11 Load | | 000 Start Address | | | | 18 |
| | | | | | 001 Stop Address | | | | 19 |
| | | | | | 010 Index | | | | 20 |
| | | | | | 011 Memory | | | | 21 |
| | | | | | 100 Port | | | | 22 |
| | | | | | 101 Block | | | | 23 |
| | | | | | 110 Page | | | | 24 |
| | | | | | 111 Slice | | | | 25 |
| | 01 Data | 0 Background | | Data Background Index | | | | | 26 |
| | | | 10 Pattern | | 000 Solid | | | | 27 |
| | | | | | 001 Checkerboard | | | | 28 |
| | | | | | 010 Row_Stripe | | | | 29 |
| | | | | | 011 Column_Stripe | | | | 30 |
| | | | | | 100 Unique | | | | 31 |
| | | | 11 Write Mask | | 000 Select Write Mask | | | | 32 |
| | | | | | 001 Set Write Mask | | | | 33 |
| | | | | Exemplary Configuration Instruction Word | | | | | |
| 0 | 10 Address | 0 Loop | | Direction | 000 Row | | | 0 | 34 |
| | | | | 0 Increment | 001 Column | | | | 35 |
| | | | | 1 Decrement | 010 Row_Only | | | | 36 |
| | | | | | 011 Column_Only | | | | 37 |
| | | | | | 100 Diagonal | | | | 38 |
| | | 1 Relationship | | Primary | 000 None | | | | 39 |
| | | | | Address | 001 Offset $2^n$ | | | | 40 |
| | | | | 0 Outer | 010 XOR $2^n$ | | | | 41 |
| | | | | 1 Enclosing | 011 Invert data if addr same | | | | 42 |
| | | | | | 100 Invert data if addr diagonal | | | | 43 |
| | 11 Other | | 00 Diagnostic | | 000 Enable | | | | 44 |
| | | | | | 001 Disable | | | | 45 |
| | | | | | 010 Restart | | | | 46 |
| | | | | | 011 NoRestart | | | | 47 |
| | | | 0100 Interleaving | | | 0 Enable | | | 48 |
| | | | | | | 1 Disable | | | 49 |
| | | | 0101 Port_Test | | | 0 Enable | | | 50 |
| | | | | | | 1 Disable | | | 51 |
| | | | 10 Next | | 000 Memory | | | | 52 |
| | | | | | 001 Port | | | | 53 |
| | | | | | 010 Block | | | | 54 |
| | | | | | 011 Page | | | | 55 |
| | | | | | 100 Slice | | | | 56 |

Details of the configuration instructions of Table 4 are explained below. These details can be modified as the approach of this example is only one suitable embodiment.

1. Control/Program/NOP. This instruction does nothing, the programmable MBIST controller configuration remains unchanged.

2. Control/Program/Pause. Pauses the current algorithm, waits for an externally generated resume signal to be asserted. This instruction can, for example, be used to perform retention testing, causing algorithm execution to pause under control of an ATE.

3. Control/Program/Stop. The last instruction of an algorithm. When encountered, the programmable MBIST controller will now that the entire algorithm has been seen and executed. In one approach, the programmable MBIST controller will then go into an inactive state, although desirably any pending diagnostic output can still be collected.

4. Control/Program/Reserved. Reserved instruction word.

5. Control/Program/Reset_Fail_Flag. Causes the programmable MBIST controller to reset the state of a fail flag. When diagnostics is inactive the fail flag in this example will either stick active upon the first failure or will become active for each fail and then be asserted at the end of the test to signify that failures were encountered. This instruction resets the underlying bit of storage associated with the failure state. If a comparator test is performed, the fail flag is asserted and then the failure state is reset.

6. Control/Program/Reset_State. Reset various registers including data backgrounds, addresses, address boundary, address index, diagnostic enable and restart enable registers. It should be noted that a 'NOP' instruction desirably should be inserted after the instruction as the instruction following the 'reset_state' will not be executed. The instruction can be used, for example, to reset state between two test algorithms in a test program.

7. Control/Program/Reset_Mask. Set no mask.

8. Control/Program/Algorithm_Start. Specify the starting point of an algorithm. The instruction will reset address boundary of memories under test.

9. Control/Loop. This instruction uses a "loop offset" field to specify which operation the controller should jump to if the current address sequence has not been completed once the preceding memory access operation has been performed. This instruction forms the end point of a loop in an algorithm step. Exemplary algorithm looping is described above in connection with FIG. 3A.

The programmable MBIST controller can be configured, at generation time, to allow selected memory control signals to be masked. These control signal masking activities can be arranged in, for example, up to seven sets. The default behavior, in this example, is for none of the sets to be active. The following instructions allow one of the masking sets to be activated. When a masking set is activated in this example, all of the control signals in that set are masked and will remain inactive, in spite of any control signal assertions the controller may need to make during a memory access operation. Control signal masking desirably operates independently of write enable masking; if a write enable signal is placed in a masking set, it will be masked when the set is activated, irrespective of the data/write/mask state.

10. Control/Mask/Set0. Forces the programmable MBIST controller to mask the control signals associated with set 0.

11. Control/Mask/Set1. Like Control/Mask/Set0 above, forces the programmable MBIST controller to mask the control signals associated with set 1.

12. Control/Mask/Set2. Like Control/Mask/Set0 above, forces the programmable MBIST controller to mask the control signals associated with set 2. programmable MBIST controller to mask the control signals associated with set 3.

14. Control/Mask/Set4. Like Control/Mask/Set0 above, forces the programmable MBIST controller to mask the control signals associated with set 4.

15. Control/Mask/Set5. Like Control/Mask/Set0 above, forces the programmable MBIST controller to mask the control signals associated with set 5.

16. Control/Mask/Set6. Like Control/Mask/Set0 above, forces the programmable MBIST controller to mask the control signals associated with set 6.

17. Control/Mask/None. Removes any control signal masking that has been configured using any of the previous seven Configuration Instructions. Returns the programmable MBIST controller to the default state where none of the control signal sets are masked, that is, all are actively controlled by the programmable MBIST controller.

18. Control/Load/Start Address. A multiple word command that is, in this example, followed in the instruction memory by three words that are read in to form up to 27 bits of data that is then written to the start address register. These three words are desirably arranged in big endian order, so the word immediately following this instruction is the most significant word of the address, followed by the middle word and finally the least significant word. Regular address loops performed by the programmable MBIST controller will start with this address value. The actual address loop being performed may cause the address to be modified before the loop commences.

19. Control/Load/Stop Address. A multiple word command that, like control/load/start, is followed by three words of data in this example. This command and accompanying data words specify the data to write into the programmable MBIST controller's stop address value register. All regular address loops performed by the programmable MBIST controller in this example will terminate after this address value is reached. The actual address loop being performed may modify the way this address is used.

20. Control/Load/Index. A multiple word command that, like control/load/start address that loads a value into an offset index register of the programmable MBIST controller. This value can then be used to offset the selected address within an algorithm instruction.

21. Control/Load/Memory. A multiple word command that loads a memory number selection register of the programmable MBIST controller. In this example, this word is only usable if the programmable MBIST controller has been configured at generation time to support multiple memories with sequential algorithm access, as opposed to multiple memories and concurrent algorithm access.

22. Control/Load/Port. A multiple word command that loads a port number selection register of the programmable MBIST controller. In this example, this word is only usable if the programmable MBIST controller has been configured at generation time to support multiple memories.

23. Control/Load/Block. A multiple word command that loads a block number selection register of the programmable MBIST controller. In this example, this word is only usable if the programmable MBIST controller has been configured at generation time to support block selection.

24. Control/Load/Page. A multiple word command that loads a page number selection register of the programmable MBIST controller. In this example, this word is only usable if the programmable MBIST controller has been configured at generation time to support page selection.

25. Control/Load/Slice. A multiple word command that loads a slice selection register of the programmable MBIST controller. In this example, this word is only usable if the programmable MBIST controller has been configured at generation time to support slice selection.

26. Data/Background. Sets the current data value to one of the, up to 16, hard encoded data background values contained in an exemplary programmable MBIST controller. These background values are specified in this example during the programmable MBIST controller generation process.

27. Data/Pattern/Solid. Sets the current data value to be the solid all 1s pattern.

28. Data/Pattern/Checkerboard. Sets the current data value to be a checkerboard. This is a topologically driven checkerboard, using the address value and memory model topology information.

29. Data/Pattern/Row_Stripe. Sets the current data value to be a stripe across a row.

30. Data/Pattern/Column_Stripe. Sets the current data value to be a stripe across a column.

31. Data/Pattern/Unique. Sets the current data value to be address unique—data that does not repeat on regular boundaries within the memory.

32. Data/Write Mask/Select Write Mask. A multiple word command that selects one of a hard coded write enable mask value to be used to mask the write enable signals driven from the programmable MBIST controller to the memory. These mask values are desirably specified at programmable MBIST controller generation time. Write enable masking, in this example, operates independently of the control signal mask sets activated with the control/mask Configuration Instructions.

33. Data/Write Mask/Set Write Mask. A multiple word command that allows the user to specify an arbitrary write mask.

Within a test algorithm step, a loop is implied by one of the Address/Loop configuration instructions. The actual behavior of the loop can be modified by any preceding address/relationship instruction. See the above discussion of FIG. 3A for more information about address loops. The Address/Loop instructions below in this example are only for the default case where there is no relationship between the loop address and any other primary address (Address/Relationship/None), specifying some other relationship will modify the address loop behavior and is described more fully below.

34. Address/Loop/Row. The loop address register is initialized with the start address register value. Each step of the loop modifies the address, moving it first along the row direction and then, as each row is exhausted, moves one position along the column and back to the beginning of the row. The loop ends when the stop address register value is reached.

35. Address/Loop/Column. The loop address register is initialized with the start address register value. Each step of the loop modifies the address, moving it first along the column direction and then, as each column is exhausted, moves one position along the row and back to the beginning of the column. The loop ends when the address register reaches the stop address register value.

36. Address/Loop/Row Only. The loop address register is initialized with the start address register value. Each step of the loop modifies the address, moving it only along the row, the column value remains static. As with column only addressing above, the loop ends when the row has reached the row value in the stop address register.

37. Address/Loop/Column_Only. The loop address register is initialized with the start address register value. Each step of the loop modifies the address, moving it only along the column, the row value remains static. The loop ends in this example when the column has reached the column value in the stop address register.

38. Address/Loop/Diagonal. The loop address register in this example is initialized with the start address register value. Each step of the loop modifies the address, moving it only along the leading diagonal, both row and column move together, in the same direction. The loop ends when the address has reached its value in the stop address register. Caution must be exercised with this loop type to ensure that the stop address is reachable by a sequence of diagonal increments from the start address, otherwise the loop will never terminate.

The following four configuration instructions alter how the address loop will be performed in this example. Within the test algorithm step instruction stream the address/relationship instructions modify the behavior of the next address/loop instruction. Where a relationship is specified, in this example, it is between the current loop address register and a primary register, as specified by bit 3 of the exemplary instruction: either the outermost or immediately enclosing loop address register 39. Address/Relationship/None. Restores the default address loop behavior, there is no relationship between this address loop and any enclosing one.

40. Address/Relationship/Offset. The active part of the loop address register is used as an offset from that part of the selected primary address register to form the actual address. If the direction is increment then the offset is added, otherwise it is subtracted. Rather than incrementing the active part of the loop address register, the loop will walk a 1 from LSB (least significant bit) to MSB (most significant bit).

41. Address/Relationship/XOR. The active part of the loop address register is XORed with the selected primary address register to form the actual address. Rather than incrementing the active part of the loop address register the loop, will walk a 1 from LSB to MSB.

42. Address/Relationship/Invert if same. The loop will behave as normal, however, when the loop address register has the same value as the primary address register, the data being written or read will be inverted.

43. Address/Relationship/Invert if diagonal. The loop will behave as normal, however, when the loop address register is in the diagonal of the primary address, the data being written or read will be inverted (primarily used for sliding diagonal algorithm).

44. Other/Diagnostic/Enable. Causes diagnostic activity to become enabled within the programmable MBIST controller. Once this Instruction is encountered, the programmable MBIST controller will commence the scanning out of diagnostic failure information when a read operation encounters a miss compare.

45. Other/Diagnostic/Disable. The MBIST controller's diagnostic mode is disabled. Any pending diagnostic data can desirably continue to be output by the programmable MBIST controller.

46. Other/Diagnostic/Restart. Causes the programmable MBIST controller to perform restarts, from this point in the current test algorithm step, when multiple failures cause the diagnostic monitor to halt the programmable MBIST controller. When executing an algorithm at-speed, a diagnostic monitor triggered halt can cause the test algorithm to ignore the next few memory access operations, since it causes the execution pipeline to flush. This may result in failures being missed. Restart behavior causes the algorithm to restart and rerun up to the previous point of failure.

47. Other/Diagnostic/NoRestart. Disables restart behavior during diagnostics.

48. Other/Interleaving/Enable. Enables the support for interleaved algorithm step execution (for sequential interleaved memory testing).

49. Other/Interleaving/Disable. Disables the support for interleaved algorithm step execution (for sequential contiguous memory testing).

50. Other/Port_Test/Enable. Enables port testing.

51. Other/Port_Test/Disable. Disables port testing.

52. Other/Next/Memory. Advances the programmable MBIST controller's memory number selection register to the value for the next memory.

53. Other/Next/Port. Advances the programmable MBIST controller's port number selection register to the value for the next port.

54. Other/Next/Block. Advances the programmable MBIST controller's block number selection register to the value for the next block.

55. Other/Next/Page. Advances the programmable MBIST controller's page number selection register to the value for the next page.

56. Other/Next/Slice. Advances the programmable MBIST controller's slice number selection register to the value for the next slice.

These Configuration Instructions are desirably immediate in nature. They are evaluated as they are read from the instruction memory. The Algorithm Instructions, on the other hand, are desirably buffered until a complete algorithm step has been encountered. Hence, the Configuration Instructions do not need to be able to be evaluated at speed, in contrast to Algorithm Instructions which are desirably evaluated at speed. The typical pattern of usage is for an algorithm step to require a number of Configuration Instructions, setting up the environment for a sequence of Algorithm Instructions to execute within.

A specific example of a basic form of programmable MBIST controller can be configured to support the following classes of algorithms—March (includes the Checkerboard algorithm), Address decoder PMOS open, Write enable, Walking, Galloping, Sliding diagonal, and Butterfly. In addition, certain algorithms for multi-port memories, such as port interaction, unique addressing, as well as others, can also be supported.

For local address Configuration Instructions, the programmable MBIST controller, in one example, desirably supports at least two schemes for offsetting with respect to the base address. The first scheme in a desirable form generates a local address in accordance with the following equation.

local_address=base_address XOR (1<<i), where
0<=i<n (address bus size)

In scheme 2, the local address is desirably generated by either incrementing or decrementing the base address by $2^n$. The first scheme supports the algorithm for detecting address decoder open faults. The second scheme supports the Butterfly algorithm.

Similarly, the data Configuration Instructions desirably, in one example, includes two schemes for updating the data background. The first scheme selects the next background from the possible ($\log_2 w+1$) backgrounds, where w is the memory word size. As part of the second scheme, the data background is shifted by one bit, starting from $2^{w-1}$.

The instructions set forth above (Algorithm and Configuration Instructions of FIG. 3 and Table 3) can also be classified in terms of their length, namely as single word instructions and multi-word instructions. There are desirably just two multi-word instructions, in this example, corresponding to loading the MAX and the MIN addresses ("load MAX address" and "load MIN address"). This approach allows the user to specify the bounds for application of an algorithm. At any point of time only one of the MAX or MIN addresses could be specified. The load instruction word is desirably always followed by an address location, and therefore, in this case, will not be confused with any other algorithm or Configuration Instruction.

Although it can be extended, the above described exemplary programmable MBIST controller architecture allows up to four levels of nested loops per algorithm step and a total of eight memory access operations to be applied within these algorithm step loops. The simple March algorithms use only a single loop, over the address space and up to three memory operations RWR. More complex algorithms can make use of the loop nesting and the full set of step operations.

For example consider the simple march2 algorithm:

$W_0$ up $R_0 W_1 R_1$ up $R_1 W_0 R_0$ up $R_0 W_1 R_1$ down $R_1 W_0 R_0$ down $R_0$ down This could be expressed using the following instruction sequence:

```
// W_0 up
CFG data/pattern/solid
CFG address/loop/increment/row
    OP addr0, address, data, write
```

```
-continued

CFG control/loop/0
// R_0 W_1 R_1 up
CFG address/loop/increment/row
    OP addr0, address, data, read
    OP addr0, address, inverse_data, write
    OP addr0, address, inverse_data, read
CFG control/loop/0
// R_1 W_0 R_0 up
CFG address/loop/increment/row
    OP addr0, address, inverse_data, read
    OP addr0, address, data, write
    OP addr0, address, data, read
CFG control/loop/0
// R_0 W_1 R_1 down
CFG address/loop/decrement/row
    OP addr0, address, data, read
    OP addr0, address, inverse_data, write
    OP addr0, address, inverse_data, read
CFG control/loop/0
// R_1 W_0 R_0 down
CFG address/loop/decrement/row
    OP addr0, address, inverse_data, read
    OP addr0, address, data, write
    OP addr0, address, data, read
CFG control/loop/0
// R_0 down
CFG address/loop/decrement/row
    OP addr0, address, data, read
CFG control/loop/0
CFG control/program/stop
```

3.2.1 Nesting Loops

The example above shows only a single loop. Now consider an algorithm that requires nested loops. For example, the GALPAT algorithm.

```
for data_background = 0 to 1 do // loop 1
    for base_cell = 0 to n-1 do // loop 2
        write ~data_background to base_cell
        for (local_cell = 0 to n-1) do // loop 3
            if (local cell != base_cell)
                Read data_background from local_cell
            else
                Read ~data_background from base_cell
            endif
        end loop // loop 3
        write data_background to base_cell
    end loop // loop 2
end loop // loop 1
```

In this algorithm, once the memory is initialized, the base cell is moved over the memory, at each base cell address the inverse pattern is written and then the whole memory is read again looking for the pattern at all addresses other than the base cell address (where inverse pattern is expected). Once the whole memory has been validated the pattern is rewritten at the base address and the algorithm moves the base cell address. Hence, this exemplary test algorithm uses not only two levels of loop, but a relationship between the inner and outer loop where the data pattern will be inverted if they are the same value. This algorithm can be represented using the following instruction sequence, with the outer loop explicitly unwound:

```
// initialize the memory
CFG data/pattern/solid
CFG address/loop/increment/row
```

```
       OP addr0, address, data, write
    CFG control/loop/0
    // Outer loop over address space
    CFG address/loop/increment/row
       // write inverse pattern at outer address
       OP addr0, address, inverse_data, read
       // loop over addresses again reading the value (or inverse)
       CFG address/relationship/outer/invert
       CFG address/loop/increment/row
          OP addr1, address, data, read
       CFG control/loop/1
       // reset the base address and continue with outer loop
       OP addr0, address, data, write
    CFG control/loop/0
```

In the inner loop, one can observe in this example the use of the address configuration instruction to ensure that the inverse data is used when the loop address and primary address are the same. Also, that loop repeats memory access operation 1 until all addresses have been used.

3.2.2 More Complex Loop Relationships

Now consider a more complex algorithm such as the one to detect PMOS opens in the address decoder. This uses two levels of loop in this example and uses a complex relationship between the inner and outer loop, to access all addresses within a Hamming distance of one.

```
    Initialize memory with data_background
    for base_address = 0 to n−1 // loop 1
       Write ~data_background to base_address
       for i = 0 to N−1 do // loop 2
          // move address by Hamming distance of 1
          local_address = base_address XOR (1 << i)
          write ~data_background to local_address
          Read data_background from base_address
       end loop // loop 2
       Write ~data_background from base_address
    end loop // loop 1
```

It could be expressed using the following instruction sequence:

```
       // Initialize memory with data_background
       // for base_address = 0 to n−1 // loop 1
       CFG data/pattern/solid
       CFG address/loop/increment/row
          OP addr0, address, use_data, write
       //for i = 0 to N−1 do // loop 2
       // move address by Hamming distance of 1
       CFG address/relationship/base/XOR
       CFG address/loop/increment/row
          OP addr1, address, inverse_data, write
          OP addr0, address, data, read
       CFG control/loop/1
       OP addr0, address, inverse_data, write
    CFG control/loop/0
```

This algorithm shows the use of a local loop inside an outer loop. The inner loop uses the value of the outer loop address register and loops over the addresses that are a Hamming distance of one from the address in the outer loop. Until the last address is reached in the inner loop, the loop control configuration command causes the loop to perform the write and read operations at each loop address. The outer loop traverses all addresses using a column increment order.

4. Exemplary Hardware Design for First Embodiment

Figure 4:
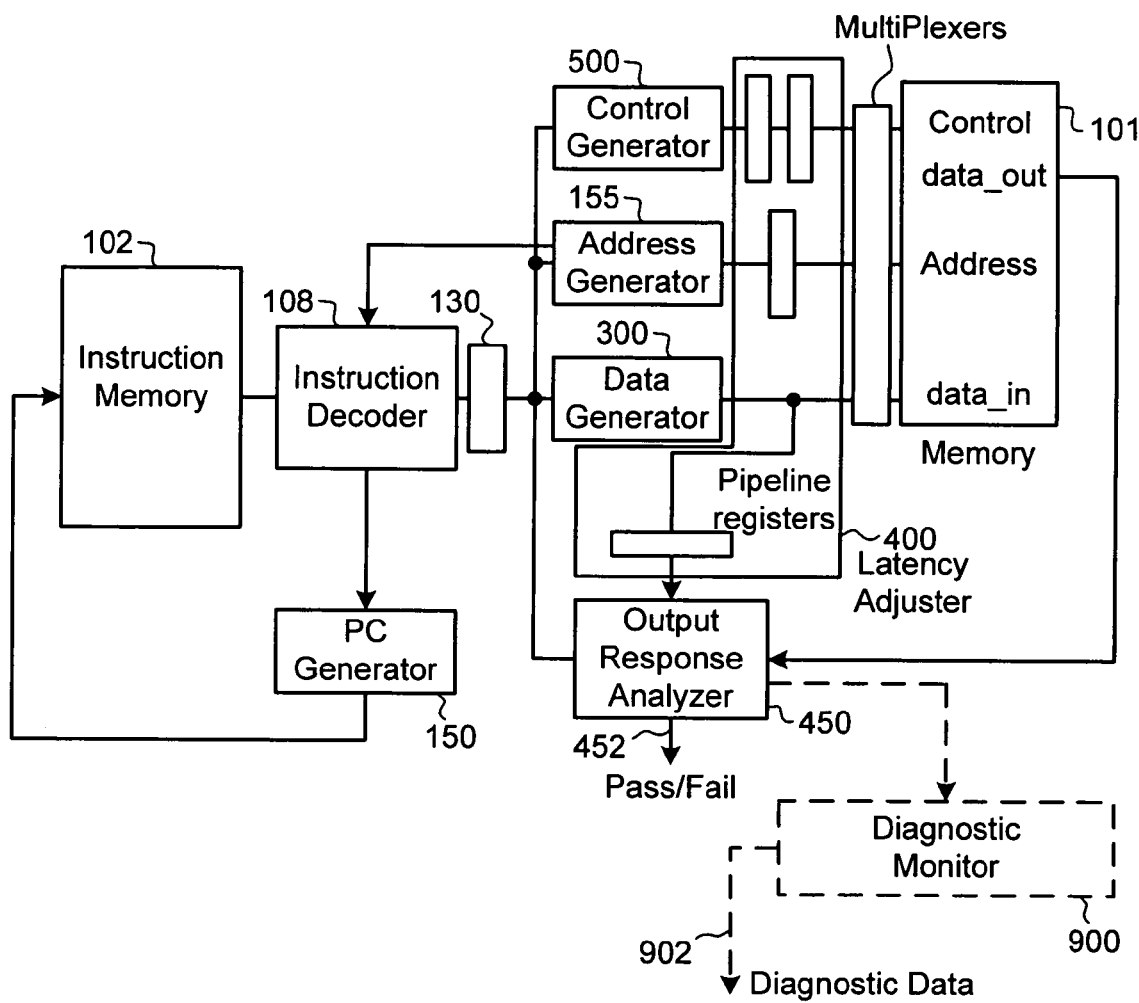
FIG. 4 is a schematic block diagram of an exemplary programmable MBIST controller hardware design.

The basic hardware for a first embodiment of an exemplary programmable memory BIST controller is illustrated in FIG. 4. This embodiment has particular applicability for use with Algorithm Instruction words of the form of FIG. 3 above and configuration words of the form of Table 3 above. Note, there are other blocks that are omitted in this basic embodiment, and that may be included to encompass additional functions, such as diagnostics, MISR for ROM BIST, built-in self repair analysis, and others. Fundamentally, the functionality of these omitted blocks remains the same and would not be affected by changing the controller to a programmable MBIST controller as described herein. As the basic architecture of the programmable MBIST controller generator is expanded, some of these other blocks and features can be added.

The overall architecture of an exemplary programmable memory BIST controller 100 in accordance with these first embodiments, is illustrated in FIG. 4. The memory being tested or memory under test (MUT) is indicated at 101 in FIG. 4. In the following sub-sections, each of the blocks of this exemplary controller will be described. It should be noted that the various components need not be discrete, as they can be combined with other components if desired. Also, other hardware implementations can be used.

4.1 Instruction Memory

In one exemplary form of the programmable MBIST controller 100, registers are used to store the 9-bit instruction words. These instructions are used for describing the algorithm steps as well as various data and address configurations. In addition, the instructions also specify the control signals. Depending upon the number of instructions for an algorithm, the entire algorithm could be stored on-chip and subsequently executed. In another scenario, the instructions corresponding to an algorithm can reside on an ATE (Automatic Test Equipment). In such a case, when first instructions are being executed (e.g., a first pair of instructions), the next instructions (e.g., a second pair of instructions) can be up-loaded on-chip from the ATE. This would require less memory on-chip, but at the same time will allow the algorithm to desirably be run at the functional speed of the memory. Depending upon user requirements, the instruction memory 102 can be distributed between on-chip and an ATE. Remaining or residual portions of the MBIST controller hardware in this example are included on the integrated circuit chip containing memory (e.g., MUT101) circuits that are being tested. A JTAG controller can be utilized to load the instructions on-chip.

4.2 Instruction Decoder

Figure 5:
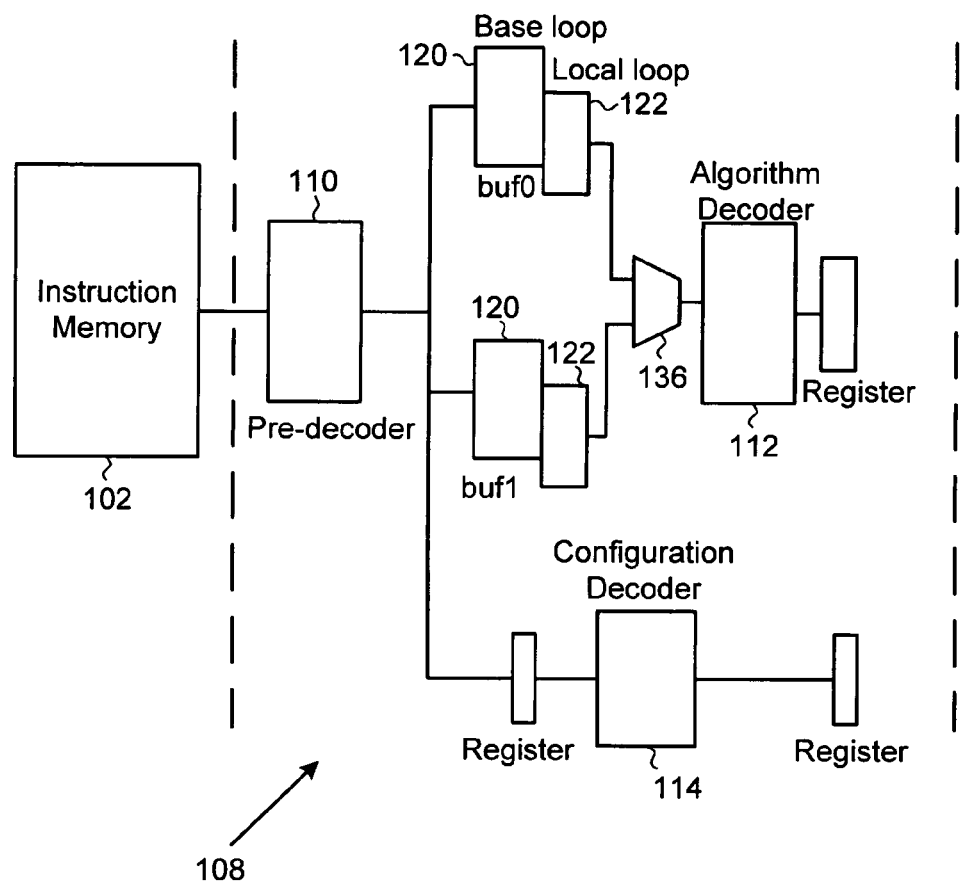
FIG. 5 is a schematic block diagram of an exemplary instruction decoder.

It is desirable for the programmable controller 100 to be able to run at the functional speed of the memory. To facilitate an architecture that can run at very high speed, one desirable form of instruction decoder 108 comprises or consists of three sub-decoders, namely, a pre-decoder 110, an Algorithm Instruction decoder 112, and a Configuration Instruction decoder 114 (FIG. 5).

The exemplary pre-decoder 110 determines whether an instruction is either a algorithm or a Configuration Instruction. This is based on the LSB (least significant bit) of the instruction word in this example. In addition, the pre-decoder desirably also decodes the loop boundaries for the instructions that are in the instruction memory, thereby assisting in loading a single algorithm step for the base-loop to a base-loop buffer 120 along with all the operations related to a nested local-loop 122.

The Algorithm Instruction decoder is activated only if the instruction is classified as pertaining to the operations that need to be actually performed on the memory under test (e.g., classified as an Algorithm Instruction).

The Configuration Instruction decoder is activated only if the instruction is classified as being associated with defining the configuration for the subsequent algorithm steps (e.g., classified as a configuration construction).

The details of exemplary algorithm and Configuration Instructions have been described above. Note, the Algorithm Instructions change at every algorithm step but the Configuration Instruction may or may not change after every algorithm step. In other words, some of the Configuration Instruction decoding may not be as time critical and can be decoded over multiple clock cycles. Dividing the decoder into independent sub-modules allows the decoding of algorithm and Configuration Instructions in parallel. FIG. 5 sets forth block-level modules in an exemplary form of instruction decoder.

In the embodiment of FIG. 5, the step controller 130 (FIG. 4) can be merged into the instruction decoder. As shown in FIG. 5, although not limited to this construction, two buffer pairs (buf0 and buf1) have been introduced to store a pair of base loop and local loop instructions. Each of the buffers in this example have a base loop buffer 120 and a local loop buffer 122. Test steps of a test pattern are desirably loaded alternately into the two buffer pairs. The base loop in this example indicates a sequence of operations that are performed on all the base addresses, whereas, the local loop is a sequence of operations that are performed on all local addresses. For example, most of the March algorithms do not require a local loop. On the other hand, for a GALPAT step denoted as (w, (r,r), w), there is a local loop with two read operations between a pair of write operations in the base loop. For the algorithms listed in Section 2 above (except in some cases under Section 2.1.3.5 above), the local loop is desirably always nested within the base loop. The local addresses are derived for each base address according to a particular scheme as described in the algorithms.

Although variable, in order to minimize the area overhead, the size of the buffers 120,122 are assumed to be 4-bits. For executing a step in an algorithm, the MBIST controller needs to know whether to do a read or write operation, whether to write data or inverse of data to a particular memory location, and an addressing scheme denoting where to perform the read or write operation, (i.e., base address location, local address location, or at a location that is the previous or next base address location) (e.g., base +1 or base −1)). As described above, the above required information can be encoded in just four bits of an Algorithm Instruction. The remaining 4 bits that indicate the loop boundaries are desirably decoded by the pre-decoder 110 to provide information regarding which set of instructions have to be loaded into the base versus the local loop buffers. The number of operations within a step is fairly limited, typically 8 words for the base loop buffer 120 and 4 words for the local loop buffer 122 are enough to run algorithms that would be supported by an exemplary basic form of programmable controller. Assuming a word size of 4-bits, a total of 96 registers are required. In addition, since the number of buffers and the buffer size are fairly small, the decoding time for these instructions are much less in comparison to reading instructions from the instruction memory.

A set of two buffer pairs are desirably employed in the FIG. 5 example to allow rapid switching from one operation to the other. Thus, one step can be executed immediately after the previous step is finished. When instructions in one buffer pair are running, the following Algorithm Instructions can be loaded into the other buffer pair. An exemplary sequence of operation for an algorithm that has both base-loop and local-loop operations is as follows.

For each base address, the base-loop instruction is read from the base-loop buffer and executed.

If there is a nested local loop, the local-loop operations reside in the local-loop buffer. Immediately, the control is shifted to the local buffer and the local loop operations are executed.

Once the local-loop operations are completed, the control is passed back to a base-loop program counter. If there is a subsequent operation in the base loop, that is executed. Or else, the control is switched to buf1, where the next step for the base loop resides. A multiplexer 136 then selects buf1 and the operations corresponding to buf1 are decoded and executed.

The same process is repeated by switching from one buffer to another for two subsequent base loop steps. When an operation is being executed from one buffer pair, the other buffer pair can be loaded from the instruction memory with the next base step along with the nested local-loop step.

The above design for an instruction decoder also makes the design of a program counter (PC) 150 (FIG. 4) for the main instruction memory very simple. This is because the program counter doesn't need to jump back and is always progressing forward. However, the program counter may jump backward when a different data background is used. Note, the exemplary design described above does not consider diagnostics and can be enhanced to support operations such as a "restart" operation for at-speed diagnostics. Each buffer (buf0 and buf1) desirably has its own buffer program counter. The buffer program counters desirably start from the beginning of the buffers, proceed to the next location, and go back to the first location once the last instruction of the loop has been executed. When instructions are loaded into the local-loop buffer as well, a wait pointer can be used to remember the location of the base-loop operation to indicate where execution should resume after completion of the instructions in the local-loop buffer.

The program counter (PC) is incremented by one, in this example, under the following situations: instructions are being loaded into the buffers, Configuration Instructions are being decoded while no instructions in the buffer are actually being executed, or the field indicating the address updating scheme is being decoded while Algorithm Instructions from the buffer are being executed in parallel. Currently, in this exemplary design, the only situation where the PC has to jump to a different location is when an algorithm has to be run using a number of data backgrounds. The program counter desirably goes back to the start point of data background iteration if the instruction of updating data background is met. A register may be dedicated to remember the value of PC at the start point of a data background iteration. This approach is beneficial towards reducing the instruction memory size when trying to run the same algorithm with multiple data backgrounds.

4.2.1 Decoding Address Direction

The way in which the base address should change is desirably encoded in the Configuration Instruction. The scheme in which the memory has to be addressed desirably stays the same for all operations within a step and changes only between steps. Therefore, the addressing scheme for a subsequent step can be determined by the pre-decoder while the current step is still running. This allows more time for decoding the addressing scheme and does not, in this approach, become part of a critical timing path. A state machine can be used to control the change in the addressing scheme between various steps.

4.2.2 Calculation of the Last Address

The Algorithm Instruction decoder 112 switch between the two buffers via the multiplexer 136. The switching, in this example, is dependent upon calculating the last address for both the base-loop operation and a local-loop operation. Typically, the last address will be the highest memory address, but could be user-specified too, as the user desirably can specify any address range for the memories under test. While the controller is running at-speed, it is almost impossible to compare the current address with the maximum intended address (without incurring huge area overhead) and come up with a decision within one clock cycle. To avoid slowing down the BIST operation, two pipeline stages (or more) are desirably inserted between the Algorithm Instruction decoder and the logic to generate a signal indicating the last address. In essence, the process to determine whether it's the last address begins two cycles prior to execution of the operation on the last address. This gives adequate time for a comparator operation (last address detection operation) to finish before the last address is actually needed.

Assuming two pipeline stages, for March algorithms without nested loops, the signal denoting whether the last address has been reached remains asserted for 1 clock cycle before executing the algorithm step in the last address. This happens either when the address is being incremented or decremented. However, for some of the more complex algorithms that have nested local loops, the signals denoting the last address can't be computed the same way. This is because within a base-address step there can be numerous local-address operations requiring hundreds of clock cycles. In such cases, the base address is calculated early but the signal pertaining to the last base address is actually asserted on the last local address. However, in both cases, the assertion of the signal indicating the last base and local addresses can be done over multiple clock cycles, thereby reducing any timing constraints on the controller.

4.3 Address Generator

One exemplary form of address generator 155 (FIG. 4) desirably comprises two parts, namely, the address generator for the base-loop 160 (FIG. 6) (a.k.a. the base address generator) and the address generator for the local-loop 200 (FIG. 7) (a.k.a. the local address generator). A last address indicator (last base address indicator 180, FIG. 6 and last local address indicator 182, FIG. 7) may also be included. Both the base and the local addresses have desirably been divided, in this example, into two parts, namely, the row address and the column address. This approach allows independent manipulation of the row and column addresses.

Figure 6:
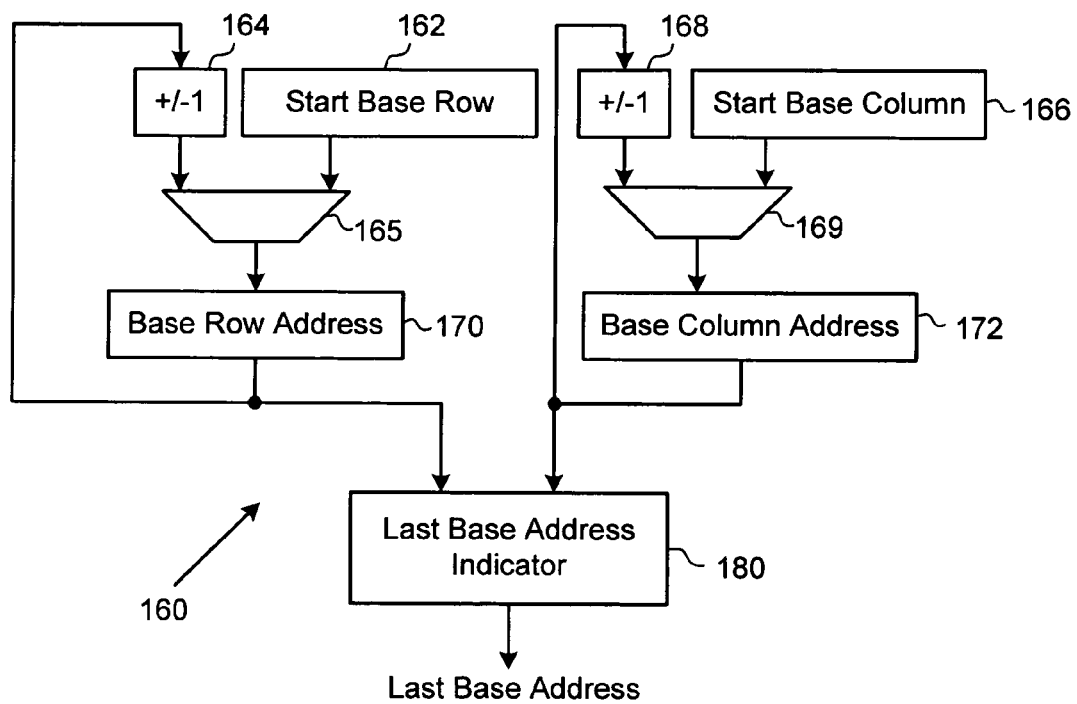
FIG. 6 is a schematic block diagram of an exemplary base address generator.

The base address generator (see e.g., 160 in FIG. 6) desirably controls the generation of the base row address and the base column address. The base row address in this example is set to its initial value (at block 162) when the addressing scheme is being set or when the last address has been reached. The illustrated form of base row address register (block 170) generally changes at the end of the base-loop when the address direction or addressing scheme has changed. The base row address thus, for example, increases or decreases by 1 (see block 164) if the addressing scheme is row addressing (e.g., fast-x addressing), row only addressing, diagonal addressing, or if the column address register has changed such that a carry is generated and the row address needs to be incremented. The base column address (see block 172) in this example starts at an initial value (block 166) and is incremented or decremented by 1 (block 168) if the addressing scheme is column addressing (e.g., fast-y addressing), column only addressing, diagonal addressing, or if row address register has changed such that a carry is generated and the column address needs to be incremented. Again, the block diagram for an exemplary base address generator is shown in FIG. 6. A Mux 165 couples blocks 162,164 to block 170 and a Mux 169 couples blocks 166,168 to block 172.

The local address generator 200 (FIG. 7) desirably supports complex addressing schemes in addition to the ones that are supported by the base address generator 160. The local address generator also desirably supports address generation schemes that are based relative to the base address. The illustrated form of local address generator is also desirably subdivided into two parts, namely, the local row address 210 and the local base or column address 220. The different addressing schemes for an exemplary local address generator are as follows:

Set local address that is equal to the base address (blocks 221,223).
Generate local address by XOR-ing the base address with $2^n$, where n is the number of address bits (blocks 229, 231).
Generate local address (blocks 233,235) by adding or subtracting the base address from $2^n$.

The value $2^n$ may be generated by left shifting a local address register (blocks 225,227) initialized to 1. The address generator may also include functionality to indicate when a maximum address has been reached. The maximum address can, for example, be either inherent to the size of the memories or could be specified by the user. The last base address signal indicator, to indicate that the last base address has been reached, may, for example, be asserted under the following conditions.

Alternatively, the Start Local Row and Start Local Column in blocks 211,213 are used to start at specific local row and column addresses, not necessarily from the beginning. These can be incremented, for example, at respective blocks 215, 217.

The last base row address has been reached. For row only and diagonal addressing schemes.
The last base column address has been reached. For column only addressing.
Both the last row address and the last column address has been reached. For row addressing or column addressing.

Figure 7:
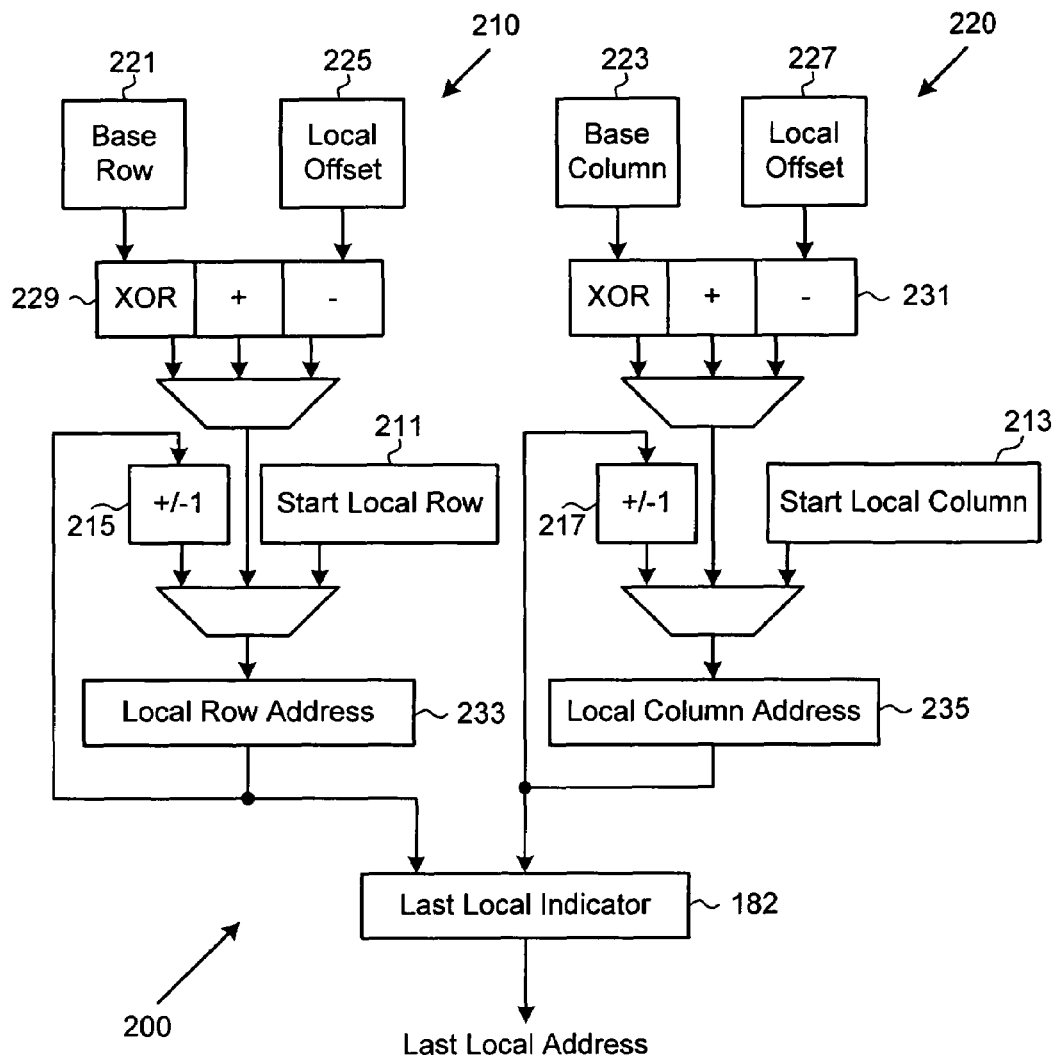
FIG. 7 is a schematic block diagram of an exemplary local address generator.

A block diagram for an exemplary local address generator is illustrated in FIG. 7.

In case of the local address, the last address signal indicator may, for example, be asserted under the same conditions as stated above only if the local address is independent of the base addressing scheme. However, if the local addressing scheme is dependent on the base_address, then the MSB (most significant bit) can be used to indicate the last local address provided that all the memories being tested by the controller are of the same size. If not, a separate comparison scheme may be used to determine whether the maximum address has been reached. The last address indicator (last local indicator) 182 in this example may generate last base address and last local address signals. The last base address signal will desirably be asserted if one of the following conditions is satisfied: (1) Last base row address is reached for row only and diagonal addressing, (2) Last base column address is reached for column only addressing, or (3) Both last base row address and last base column address are reached for row addressing or column addressing. For last local address signal, the conditions are same as those for last base address signal if the local address is generated independently from the base address. However, if the local address is generated by XORing, adding or subtracting the base address with $2^n$, the most significant bit (MSB) will indicate the last local address.

4.4 Data Generator

The illustrated form of data generator 300 (FIG. 4) has two major functions. The first task is to generate the correct data that is to be written at a particular memory location in the present clock cycle. The second task is related to generating the correct expected data that should be compared with the data read from the memory location during a read operation. The complexity of generating the correct expected data increases in an example where the read and write operations are desirably pipelined. The programmable MBIST controller desirably ensures that the expected data that is generated matches (corresponds to) the data that was actually previously written into the memory (e.g., a couple of clock cycles earlier).

The data generator also desirably updates the data background according to different update schemes. For unique data, checkerboard, row stripe and column stripe data backgrounds, the data backgrounds are a function of address. Unique data background uses address as data background. For interleaving and multiplexed word-oriented memories, the data backgrounds of checkerboard, row stripe and column stripe can be expressed by the following equations:

$D_{Checkerboard} = (\text{row}[0] \text{ EXNOR column}[0]) \text{ EXNOR } D$ $D_{rowstripe} = \text{row}[0] \text{ EXNOR } D$ $D_{columnstripe} = \text{column}[0] \text{ EXNOR } D$ Where row[0] and column[0] are the LSB of row address and column address, D is 0 or 1 specified by instructions, and EXNOR is operation of exclusive NOR.

Various types of exemplary data generation schemes that are supported by a desirable first embodiment of a programmable controller are listed below. In all cases, desirably both data background and inverse of the data background are supported.

1. For March algorithms, besides the solid "0" and "1" data backgrounds, a user can specify any of the backgrounds that can be used from a total of ($\log_2 w + 1$) different backgrounds, where w is the width of a data word.

2. For the Checkerboard algorithm, the data background of "01 . . . 01" and its inverse are used. Moreover, the data that is written to the memory location is dependent on the address.

3. For row stripe and column stripe algorithms, the data is generated based on the even and odd address of the memory. In a row stripe algorithm, for example, in one run, the even rows are written with "11 . . . 11", whereas the odd rows are written with "00.00". In a second run, the data backgrounds are reversed. Similarly, in a column stripe algorithm, the data is written in a way such that the alternate columns have all 1s and all 0s respectively.

4. For unique data algorithms, the corresponding memory address may be used as a unique data for every memory location.

The data background desirably may be updated, for example, based on two schemes. First, the user can select any data from the ($\log_2 w + 1$) possible data backgrounds that are available. Second, for some of the algorithms that are listed in Section 2, the data background can be changed by shifting the current background, which is set to $2^{w-1}$, by one bit (w being the width of the data word). The programmable controller will desirably support both the schemes based on the algorithms.

A latency adjuster 400 (FIG. 4) may be used to make the control signals, address and data be synchronized as they are generated in a different clock cycle. The adjuster 400 desirably also adjusts the latency of data to synchronize the memory input data and the memory output data.

4.5 Control Generator

The control generator 500 (FIG. 4), in one form depicted in this example, is responsible for generating all the necessary control signals that manage the execution of the algorithms. Since the functionality is desirably one-hot encoded in the instruction itself, the structure of the control generator is simple and straight forward. The control signals in the illustrated example come directly from the instruction decoder and are routed to various blocks within the programmable MBIST controller.

4.6 Output Response Analyzer

One illustrated form of output response analyzer 450 compares the data that is read from the memory and the expected data that is generated from the programmable MBIST controller. This analyzer may comprise a comparator that compares the two values. If the width of the memory is quite high, then the depth of comparator logic increases, and therefore, pipeline stages can be inserted to desirably provide at-speed BIST operation. The output response analyzer may alternatively be a compressor that compresses memory response. This latter approach is particularly applicable to ROM testing. The output analyzer can provide any suitable output, such as an output 452 indicating whether the tested memory passed or failed a test or whether a particular cell in the memory passed or failed. Alternatively, the results can be passed to a diagnostic monitor 900 for analysis and production of diagnostic data at an output 902, as explained below.

5.0. Exemplary Alternative Form of Hardware Design

The basic hardware of this embodiment is also illustrated in FIG. 4. However, this embodiment utilizes alternative component forms, such as a step controller of an alternative design. The hardware design of this alternative embodiment has particular applicability to Algorithm Instruction words of the form described in FIG. 3A.

5.1 Instruction Memory

In another form, the instruction memory 102 forms a FIFO buffer between the programmable MBIST controller and the source of the instruction sequence being executed by the MBIST controller. Typically, this can be formed from a register file of about eight nine bit words. The control logic within this block allows the external source to scan load further instructions into the instruction memory when it is not full. So, once the MBIST controller has started to process instructions, removing them from the instruction memory, further instructions can be loaded into the memory.

The external test instruction source can use a slow clock domain, many times slower than that of the MBIST controller. For example IEEE 1149.1 TAP TCK or an external ATE clock can be used for instruction loading. The instruction memory block desirably contains synchronization logic between the two clock domains in such an example. Since most BIST algorithm steps operate over a range of addresses and take a number of fast clock domain cycles, there would be ample scope for concurrent loading of the next instruction sequence into the memory as the BIST controller is executing the current set.

The size of the instruction memory can be reduced, or increased. As the size is changed the amount of linkage between the MBIST controller and the source of instructions will vary. Consider an algorithm that fits entirely within the instruction memory, as the number of words is reduced, the MBIST controller may need to wait longer for the slow external source to make new instructions available. A value of 8 words of instruction memory is believed to form a good compromise between performance and register size.

5.2 Instruction Decoder

There are two parts to an alternative form of instruction decoder 108 (FIG. 4), namely:
  Deciding if the instruction is an algorithm instruction or a configuration instruction.
  Decoding the configuration instruction.

The first decision can be done by simply inspecting bit 0 of the instruction word. If it is set then the instruction is a configuration instruction. This can be done using a predecoder such as described above in section 4.2.

Decoding of Configuration Instructions is done in this example by inspecting the most significant bits of the Configuration Instruction word, to determine the specific configuration instruction. For most Configuration Instructions the state of the programmable MBIST controller is updated immediately. Address Configuration Instructions are desirably processed differently in this example, as explained below. For example, they may be partially decoded and then passed onto a step controller, where they are buffered along with other information for the test algorithm step instruction loop currently being built ready for execution. The step controller is described more fully in the next section.

5.3 Step Controller

Although this can vary, in one specific example, the step controller 130 can store one step of pre-decoded algorithm instructions and address configurations for loops in the step and controls for the execution of a test step.

Figure 8:
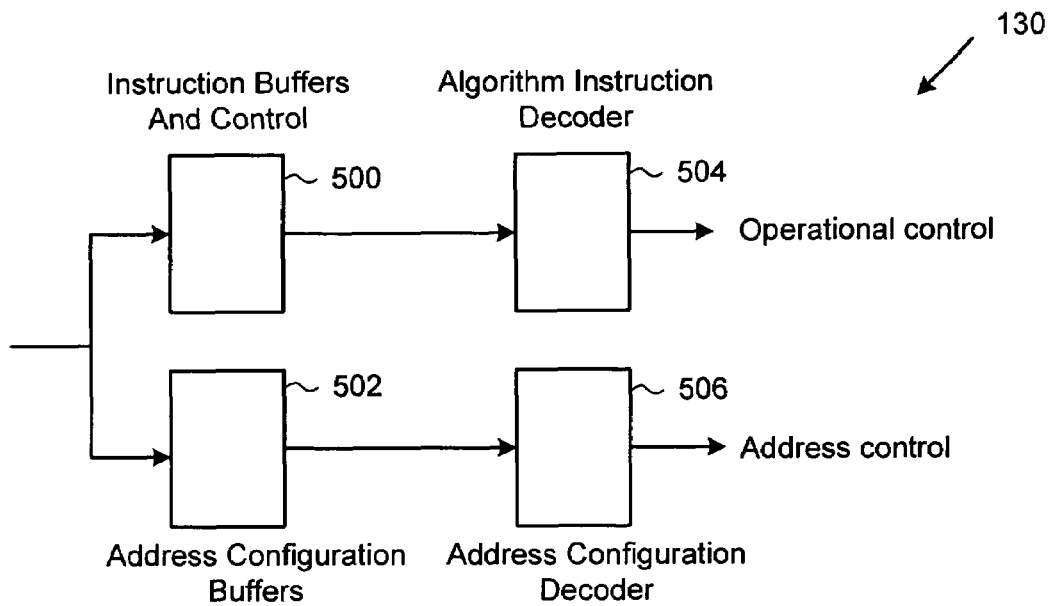
FIG. 8 is a schematic block diagram of an exemplary step controller.

The illustrated step controller of FIG. 8 comprises four sub-blocks as follows: instruction buffer and buffer control 500, address configuration buffers 502, algorithm instruction decoder 5-4 and address configuration decoder 506. The diagram of an exemplary step controller is shown in FIG. 8 and described in the following sub sections.

5.3.1 Instruction Buffers and Buffer Control

A memory test program can be considered as the execution of a number of memory test algorithms on the memories associated with the programmable MBIST controller. These test algorithms can be applied to all the memories at the same time in the case of a programmable MBIST controller configured, at generation (e.g., during field programming) time, for concurrent memory testing. Alternatively the algorithms can be applied to each memory in turn with a programmable MBIST controller configured, at generation time, for sequential memory testing. In this latter case, with the programmable MBIST controller, the different algorithms can be applied to each memory. This allows the exact tests to be customized to the specific requirements of memories and any die position specific variations.

Each memory test algorithm is composed of a sequence of memory access operations. These are grouped together into a number of loops over selected memory addresses. These loops can be as simple as the single pass through a sequence of addresses for the simple March like algorithms or something entirely more complex; for example, the looping required for the GALPAT algorithm or open PMOS address decoder test. The programmable MBIST controller in this embodiment, although it can be extended, supports a maximum of eight memory access operations within the outermost loop. These instructions can be organized into a number of inner loops. Although extendable, in this example they can be a maximum of four levels of loops active at any one time. The number of memory access operations and loop nesting depth can be extended to be configurable at programmable MBIST controller generation time.

As described earlier, a loop can be defined by a sequence of memory access operations contained within an initial "address/loop" configuration instruction and a terminating "control/loop" configuration instruction. All of the memory access operations within this pair of loop configuration commands are desirably within the body of the loop.

Loop nesting occurs when a further pair of loop configuration commands is encountered in the body of a loop. The memory access operations contained within this nested loop are considered to be at the higher nesting level.

For example, a simple loop could be:

CFG address/loop/increment/row

OP addr0, address, data, write

CFG control/loop/o

The "address/loop" configuration command and matching "control/loop" configuration command in this example cause information to be written into the address configuration buffer. The memory access operations are placed into the instruction buffer.

In the following sub-sections, we consider the execution of the following nested loop:

(OP0, ((OP1), (OP2, OP3)), (OP4, OP5))

This could be written using the following test Algorithm Instructions. (In this example test, algorithm step does nothing useful, other than act as a vehicle for demonstrating the internal workings of the instruction buffers and address configuration buffers.)

```
    CFG address/loop/increment/row
        // OP0
        OP addr0, address, data, write
        CFG address/loop/increment/row
            CFG address/loop/increment/row
                // OP1
                OP addr0, address, data, write
            CFG control/loop/1
            CFG address/loop/increment/row
                // OP2
                OP addr0, address, data, write
```

-continued

```
            // OP3
            OP addr0, address, data, write
        CFG control/loop/2
    CFG control/loop/1
        CFG address/loop/increment/row
        // OP4
        OP addr0, address, data, write
        // OP5
        OP addr0, address, data, write
    CFG control/loop/4
CFG control/loop/0
```

In this test algorithm step, there are six operations: OP0, OP1 . . . OP5. The algorithm step, in this example, is composed of a total of five loops. All the five operations form the first loop. Operations OP1, OP2 and OP3 form the second loop. Operation OP1 forms the third loop. Operations OP2 and OP3 form the fourth loop. Operations OP4 and OP5 form the fifth loop.

The first loop nests all the other loops. The second loop nests the third and fourth loop. There are three levels of concurrently nested loops. The third and fourth loops are nested within the second loop and the first loop.

5.3.1.1 Instruction Loading

Memory test step instruction execution is loop based. As soon as the first complete loop is encountered, the execution of the memory access operations within that loop and the loop itself will be triggered. In this way, execution of the loop will be at speed but between loops there may be a delay as further instructions are transferred from the instruction buffer and decoded.

When an address/loop configuration instruction is decoded the decoded information is placed into an address configuration buffer 502 (FIG. 8). This information, in this example, determines how the address will be manipulated and generated for the whole of the loop. The first memory access operation for that loop is placed into an instruction buffer 500, and is marked as requiring the address register to be set up according to the information in the address configuration buffer before the loop can be executed. Subsequent memory access operations are added to the instruction buffer. When the control/loop configuration instruction is encountered, the last instruction in the instruction buffer is marked as terminating the loop, with a loop iteration jump address (back to the first instruction in the loop).

In the example test algorithm step memory access operation OP1 is the first operation in both the second and third loop. This requires that both loops be initialized prior to the execution of operation OP1. This information is stored alongside the operation in the instruction buffer.

Figure 9:
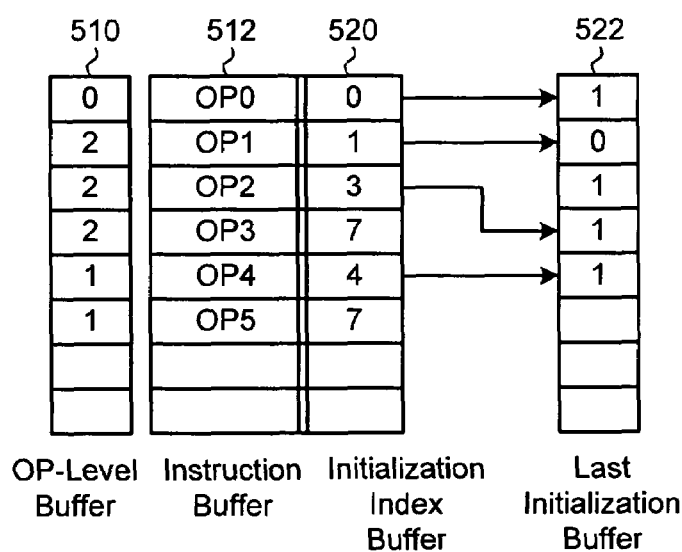
FIGS. 9 and 10 illustrate exemplary buffers for a test step.

The OP-level buffer 510 (FIG. 9) stores the highest level of the loop that an operation resides within. The instruction buffer 514 stores the algorithm memory access operations themselves. The initialization index buffer 520 stores the loop number that begins with the corresponding operation. A value of all ones, decimal 7 in this case, is used to denote that no initialization is required. The last initialization buffer 522 stores information about whether or not the corresponding loop is the last loop to be initialized.

In this example operation OP0 is in the first loop (loop level 0) and needs to be initialized. Operation OP1 is the beginning of the second and third loop (loop level 1 and 2), both loop level 1 and loop level 2 need to be initialized. For operation OP3 no initialization is required.

Figure 10:
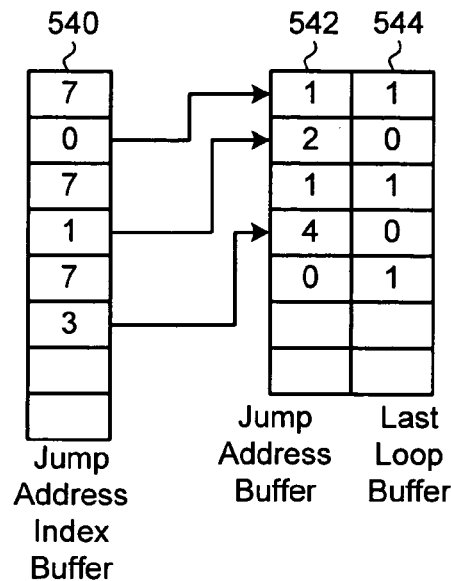

The values in the jump address index buffer 540 (FIG. 10) indicate whether an operation is the end of one or more loops. Again the all ones value, decimal 7 in this case, indicates that no jump is required after this memory access operation. Other values indicate the address to fetch the jump information from the jump address buffer. The jump address buffer 542 stores the index into the instruction buffer that will be jumped to when the next iteration of the current loop. The corresponding value in the last loop buffer 544 indicates if the loop is the last loop to be executed for the operation.

In this example operation OP0 is not the end of a loop. However, operation OP1 is the end of a loop and the next iteration of the loop starts at operation OP1 (element 1 of the instruction buffer), the last loop buffer indicates that operation OP1 is the last operation of just one loop.

The information for operation OP3 is a little more complex. The operation is the end of a loop, with the next iteration starting at instruction buffer element 2 (operation OP2). The last loop buffer indicates that this operation also terminates another loop, the next entry in the table is used when the current address iteration is complete. This will cause the next iteration of the enclosing loop to be performed, by jumping to the operation at instruction buffer element 1 (operation OP1). This ends the loop iterations performed after operation OP3.

5.3.1.2 Entering a Loop

When an operation in the instruction buffer is read, a check is made as to whether initialization is needed for one or more loops that start from the current operation. The decoded address configuration instructions that need to be executed before entering a loop and performing the first operation of the loop are associated with that first operation. There can be more than one loop that needs to be initialized for an operation because an operation can be the start operation for more than one loop. In the example test algorithm step above, operation OP1 is the start operation for both the second and third loop. Therefore, these loops are initialized. This also explains the desirability of providing at least one address register for each nested level of loop.

The following exemplary procedure is used to ensure that all the necessary nested loops have their address registers initialized appropriately:

Initially all address registers are marked as uninitialized.
The initialization index buffer shows the starting loop number that needs to be initialized.
Each uninitialized address register is initialized, using the information in the address configuration buffer.
The loops are iterated.
Once a loop is complete the address register is marked as uninitialized.

Because one operation can be the start operation for more than one address loop, it is desirable to provide a way to quickly determine if a loop has been initialized in order not to slow down the process of loop initialization. In the example above, operation OP1 is the start operation of both the second and third loops (nested loop levels 1 and 2). When executing the second loop, it is desirable to not expend extra cycles to determine whether the second or third loops have been initialized. A running level register can be used to indicate the loop level that is currently being executed. If the running level is the same as the operations OP-level value, contained in the OP-level buffer, initialization of the loop is not needed and this is known. However, if the running level is smaller than the OP-level, initialization in this example is performed for the uninitialized loop address registers before executing the loop. Once this initialization is complete, the running level in this example is adjusted to the loop's OP-level.

For the example above, when operation OP 1 is initially read, the running level is 0, while the OP-level of operation OP1 is level 2. Therefore, loop initialization is needed. Once the second and third loops (nested loop levels 1 and 2) are initialized, the running level is set to 2. In this case, the third loop can be executed continuously without initialization, as the running level is equal to OP-level buffer of operation OP1 before the loop is complete.

When the memory access operations within a loop are being executed, the jump address index buffer 542 (FIG. 10) is read for the operation. This value is used to determine if this operation is the last operation in a loop and, if so, what operation should follow for the next iteration of the loop. The last operation in the loop causes the address register to be updated to it's next address value.

5.3.1.3 Leaving a Loop

When a loop terminates, in this example, the running level is moved back by one and the loop's address register is marked as uninitialized. As multiple loops can be terminated on the same operation, in this example, the programmable MBIST controller steps through the values in the jump address buffer and last loop buffer, trying to advance each loop to the next iteration or terminating the loop, until it encounters a last loop buffer value that is set.

5.3.2 Address Configuration Buffers

The address configuration buffer 502 (FIG. 8) tracks the partially decoded information pertaining to the address loops for all of the loops required by the test algorithm step. Like the configuration instruction buffer, the information in the address configuration buffer is built up as the address loop configuration instructions in the test algorithm step are encountered. The full contents of the address configuration buffer 502 are only available in one embodiment after the end of the outermost address loop has been processed.

There are two distinct buffers in one exemplary form of this block 502:

1. Address buffer. This contains the partially decoded address scheme for each address loop.
2. Relationship buffer. This contains the partially decoded address relationship value for each address loop.

Although this can be varied, desirably the fill decode of these values is only made when the corresponding loop is being initialized or a loop iteration made and the address register value advanced to the next value.

5.3.3 Algorithm Instruction Decoder

The algorithm instruction decoder 504 in one embodiment in accordance with FIG. 8, fully decodes the memory access operation instruction, from the instruction buffer 500, that is currently being executed. This decode information is used to trigger the generating of the appropriate memory control signal activations for the memory access operation being performed by a control generator.

5.3.4 Address Configuration Decoder

The address configuration decoder 506, in one embodiment in accordance with FIG. 8, fully decodes address configuration instructions stored in the address configuration buffers 502. This information is used by an address generator.

5.4 Address Generator

Figure 11:
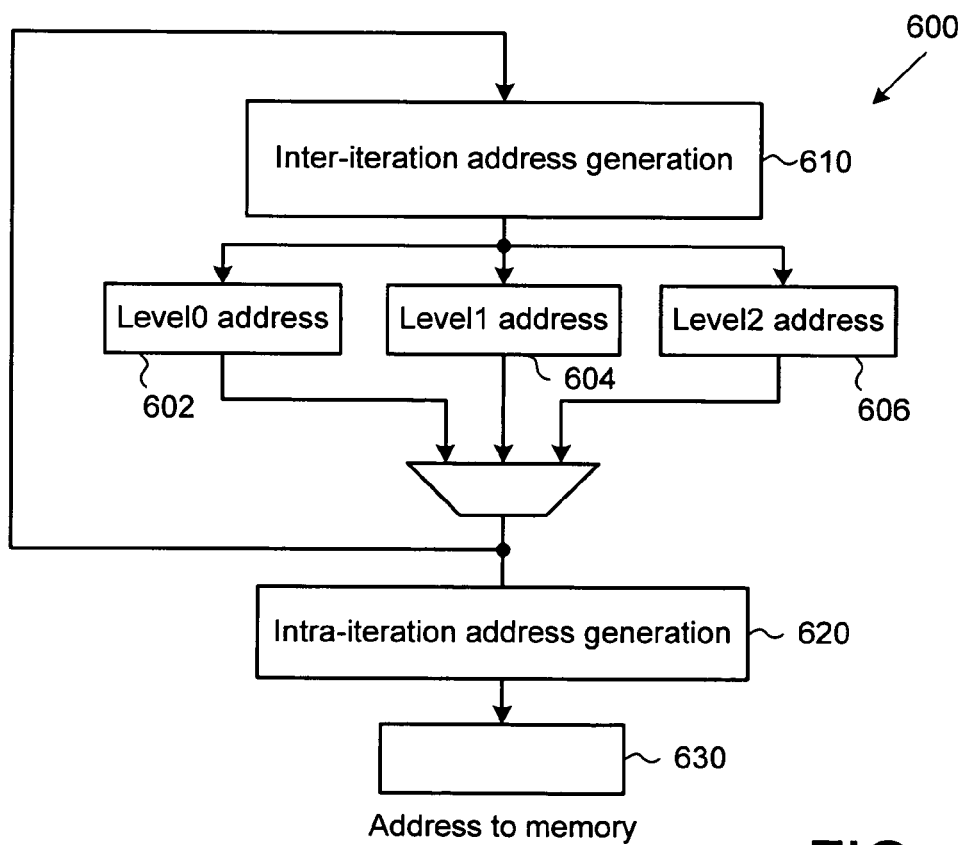
FIG. 11 is a schematic block diagram of an exemplary form of address generator.

An exemplary form of address generator 660, shown in FIG. 11, has three levels 602,604,606 (corresponding to a maximum number of nested loops equal to three in this example) and also has two major functions:

1. inter-iteration address generation. Generation of the current and next address values to be used by the address iteration loop (Block 610). This is determined in this example by the address configuration instructions for the loop. Both the partially decoded address/loop and address/relationship configuration instruction values from the address configuration buffer 502 (FIG. 8) are used to control this.
2. intra-iteration address generation. Generation of the actual address to be applied to the memory (block 630) for each memory access operation within the address iteration loop (block 620). The memory access operation's address level and address manipulation fields are used in this example to construct the memory address to be used for the operation. This address can optionally be bit polarized.

Figure 12:
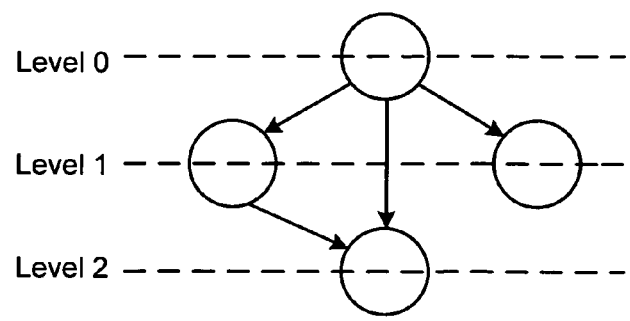
FIG. 12 is a schematic diagram of an exemplary address relationships.

Depending on the address level specified for the memory access operation and the relationship specified for the address loop, the actual memory address can depend on other address loop address register values, such as shown in FIG. 12. In one specific example, as exemplified by this FIG. 12 diagram, the address register value of loop level 0 can be used directly by all operations in loop level 0 and can contribute to the address value used by all other loop level memory access operations. The address value of loop level 1 can only be used by memory access operations in loop level 1 or loop level 2.

Figure 13:
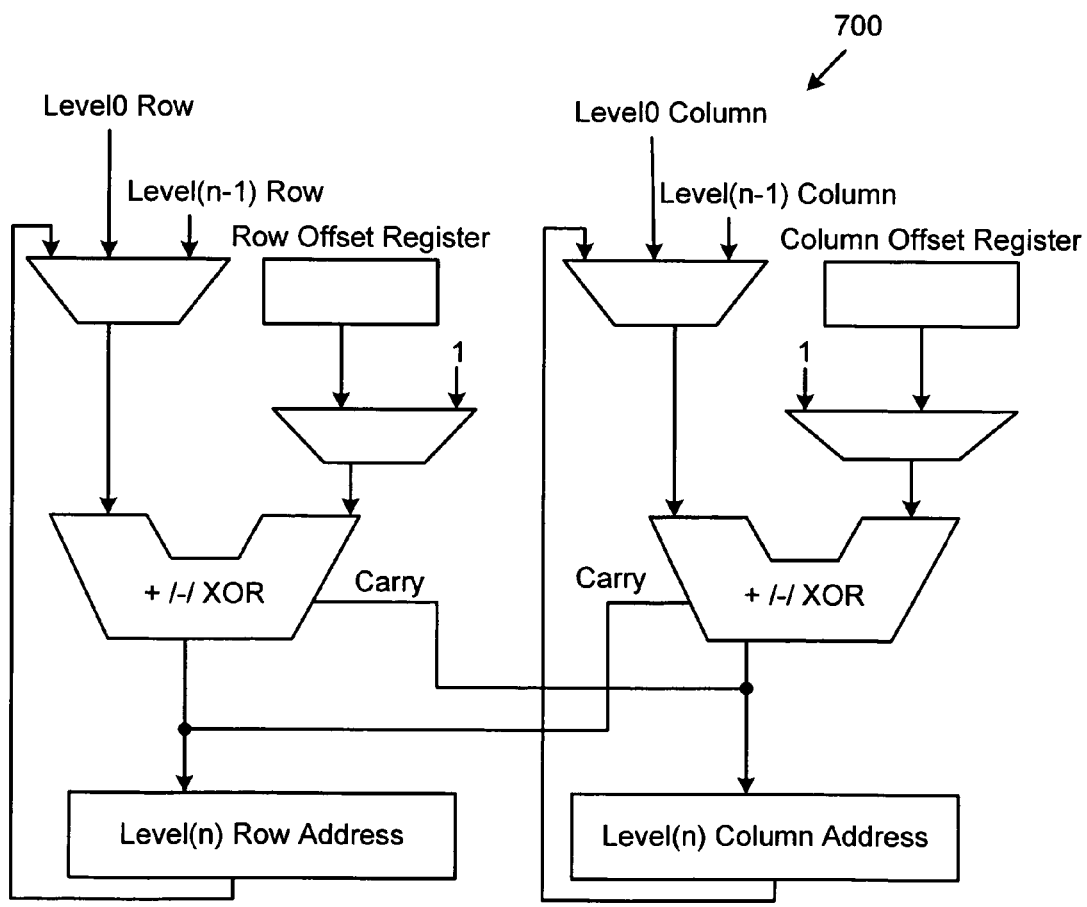
FIG. 13 is a schematic block diagram of an exemplary inter-iteration address generator.

A detailed diagram of an embodiment of the address generation hardware 700 (inter-iteration block 610 in FIG. 11) for operations across loop or algorithm step boundaries is shown in FIG. 13. It should be noted that there are some optional, but desirable, methods used to speed up hardware operation: (1) The address of the running loop can be copied to a separate address register and the updated address written back to its original address register, (2) Carries can be pre-calculated to speed up the hardware, (3) Reference address can be registered, and (4) Control signals controlling the address generation can be registered.

Figure 14:
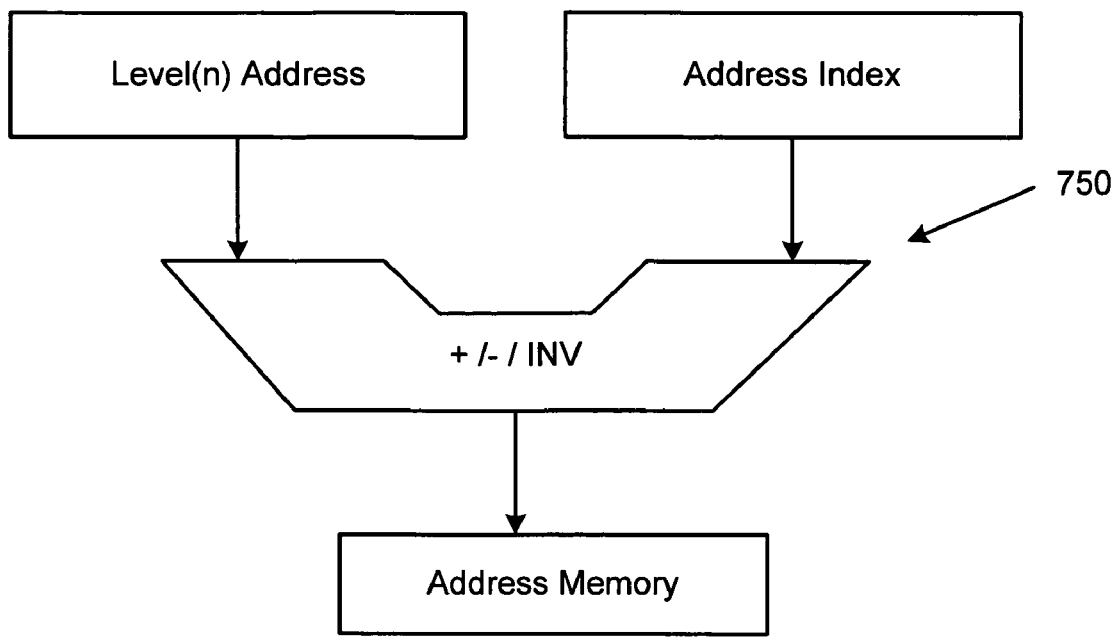
FIG. 14 is a schematic block diagram of an exemplary intra-iteration address generator.

The function of intra-iteration address generation is determined by bits [4:3] in the Algorithm Instructions of FIG. 3A. It can be the current address, current address +−/1 index, or inverse of the current address. The address index is loaded, in one example, in the test program. The default value of the index will be set, such as at '1'. A high-level diagram for an exemplary intra-iteration address generator 750 (block 620 in FIG. 11) is shown in FIG. 14. The level n can be specified using the Algorithm Instructions.

5.5 Data Generator

The data generator 300 (FIG. 4), in one embodiment, performs the following functions:

Generate the data value that is to be written at the current memory location in the present clock cycle; and Generate the correct expected data to be compared with when the data read from the current memory location becomes available.

The complexity of generating the correct expected data increases since the read and write operations can be pipelined. The MBIST controller ensures that the expected data that is generated matches the data that was actually written into the memory one or more (e.g., a couple) of clock cycles earlier. This is done, in one example, by launching the data pattern number and inversion state into a comparator pipeline where it exits for comparison when the memory read value is available. The comparator decodes these values to determine the actual expected value.

The various types of data generation schemes that are supported are listed below. In all cases, both data background and inverse of the data background are supported. The programmable MBIST controller can be extended to support other data generation schemes.

1. For March algorithms, besides the solid "0" and "1" data backgrounds the user can specify any of the backgrounds that can be used from a total of (log2w+I) different backgrounds, where w is the width of a data word.

For example, a memory with data size of 8 bits will have 4 data backgrounds encoded (and the inverse of the data backgrounds will also be available):

0 00000000

1 01010101

2 00110011

3 00001111

2. For Checkerboard algorithm, the topological data background of "01 . . . 01" and its inverse are required. The actual data value will be dependent on the address.

3. For row stripe and column stripe algorithms—the data is generated based on the even and odd address of the memory. In a row stripe algorithm, for example in one run, the even rows are written with "11 . . . 11", whereas the odd rows are written with "00.00". In a second run, the data backgrounds are reversed. Similarly, in a column stripe algorithm, the data is written in a way such that the alternate columns have all 1s and all 0s, respectively.

4. For a unique data algorithm, the corresponding memory address is used as a unique data for every memory location.

5.6 Control Generator

The control generator 500 (FIG. 4) is responsible in this embodiment for generating all of the control signals necessary for the current memory access operation. For full-speed, synchronous, memories this will be simple memory control signal assertions driven directly by the partially decoded memory access operation instruction value. For other, such as asynchronous memories, a state counter can be used with the activation of the control signals being based on the counter state.

Control signal masking can also be performed within this block.

5.7 Output Response Analyzer

The output response analyzer 450 in this embodiment compares the data that is read from the memory and the expected data that is generated from the controller. In one desirable form, the output analyzer comprises a comparator that compares the two values. If the width of the memory is quite high, then the depth of comparator logic increases, and therefore, pipeline stages can be inserted to ensure at-speed MBIST operation.

Data slicing can also be used to reduce data width in the comparison path. When this is done, the same algorithm set is desirably repeated for each slice, to ensure that full coverage is provided. During data slice algorithm execution, in one approach, all write operations will operate on the full width of the memory data word while only the output response analysis will be sliced.

6.0 Exemplary Pseudocode for Selected Algorithms

Assuming the instructions for the proposed programmable MBIST controller as described above in FIG. 3 and Table 3, the pseudo-code for some exemplary algorithms that the programmable MBIST controller can support (e.g., via field programming) are set forth below.

6.1 March 2 Algorithm 1. set test algorithm March
2. set address direction INC
3. BBL_EBL W0 B
4. BBL R0 B
5. W1 B
6. EBL R1 B
7. BBL R1 B
8. W0 B
9. EBL R0 B
10. set address direction DEC
11. BBL R0 B
12. W1 B
13. EBL R1 B
14. BBL R1 B
15. W0 B
16. EBL R0 B
17. BBL_EBL R0 B
18. STOP

6.2 Galloping Algorithm 1. set test algorithm GALPAT
2. set address direction INC
3. BBL_EBL W0 B
4. BBL W1 B
5. BLL R0 L
6. ELL R1 B
7. EBL W0 B
8. BBL_EBL W1 B
9. BBL W0 B
10. BLL R1 L
11. ELL R0 B
12. EBL W1 B
13. STOP

6.3 Walking Algorithm 1. set test algorithm WALKING
2. set address direction INC
3. BBL_EBL W0 B
4. BBL W1 B
5. BLL_ELL R0 L
6. R1 B
7. EBL W0 B
8. BBL_EBL W1 B
9. BBL W0 B
10. BLL_ELL R1 L
11. R0 B
12. EBL W1 B
13. STOP

6.4 Address Decoder PMOS Open Algorithm 1. set test algorithm PMOSOPEN
2. set address direction INC
3. BBL_EBL W0
4. set base address direction ROW_ONLY
5. set local address direction ROW_ONLY
6. set local address offset SCHEME2
7. BBL W0 B
8. BLL W1 L
9. ELL R0 B
10. EBL W0 B
11. BBL_EBL W0
12. set base address direction COL_ONLY 13. set local address direction COL_ONLY
14. set local address offset SCHEME2
15. BBL W0 B
16. BLL W1 L
17. ELL R0 B
18. EBL W0 B
19. STOP

7.0 Additional Exemplary Pseudocode for Selected Algorithms

Assuming the instructions for the proposed programmable MBIST controller as described above in FIG. 3A and Table 4, the pseudocode for exemplary algorithms that the programmable MBIST controller can support (e.g., via field programming) will be readily apparent. For example, march1, march2, march3, col_march1, unique, checkerboard, Rom1, Rom2, galloping, address decoder PMOS open, and other algorithms, including those previously described can be implemented using this architecture. One specific example of the checkerboard type of algorithm that can be supported is the retention CB algorithm, described in pseudocode as set for the below:
retentionCB

```
// Size:
//     4n
//
// Algorithm:
//         up - write checker board, synchronize
//         up - read checker board
//         up - write inverse checker board, synchronize
//         up - read inverse checker board
//
// W_checkerboard up
CFG data/pattern/checkerboard
CFG address/loop/increment/row
   OP addr0, address, data, write
CFG control/loop/0
CFG control/program/pause
// R_checkerboard up
CFG address/loop/increment/row
   OP addr0, address, data, read
CFG control/loop/0
// W_inverse checkerboard up
CFG address/loop/increment/row
   OP addr0, address, inverse_data, write
CFG control/loop/0
CFG control/program/pause
// R_inverse checkerboard up
CFG address/loop/increment/column
   OP addr0, address, inverse_data, read
CFG control/loop/0
CFG control/program/stop
```

8.0 Alternative Embodiments of Programmable MBIST Controller

In these alternative embodiments, in comparison to the base or first embodiments described in connection with FIG. 3, Table 3 and Section 4 above [hereinafter called Base Embodiments], more flexible address schemes and more levels of loops are enabled. Also, the loop control is more flexible than the Base Embodiments. Flexibility is also exhibited by the embodiments discussed above in connection with FIG. 3A, Table 4 and Section 5 above.

In the Base Embodiments described above, two levels of nested loops, base loop and local loop, are allowed and only one local loop can be included in a base loop. This approach accommodates many algorithms such as March algorithms, Galloping/Walking algorithms and tests for address decoder PMOS open faults. For those algorithms with multi-local loops, such as the Butterfly algorithm and the Sliding diagonal algorithm, multi-cycle instructions are used to implement the multi-local loops. For example, instructions such as Butterfly read and Sliding Diagonal read all may be used to perform complicated read operations.

In embodiments of this Alternative design, these multi-cycle instructions are desirably removed to increase flexibility and to allow all algorithms to be composed of simple read and write operations. This Alternative approach enables the programmable MBIST controller to support algorithms with more than two levels of loops and wherein all the loops that are nested can have different address schemes. A desirable approach is disclosed below that enables referencing addresses in different loops.

As before, instructions are desirably divided into two types: Configuration Instructions and Algorithm Instructions. Configuration Instructions define how a test is executed and Algorithm Instructions define how an operation is performed. The difference between these Alternative embodiments and the previously described Base Embodiments, mainly lies in the loop manipulation. Consequently, the following description focuses on loop manipulation. For selected other components that differ in the embodiments, a brief comparison is also provided below.

Exemplary definitions of instructions to support complex multi-loop field programmable MBIST controllers are set forth below in Tables 5 and 6. More specifically, Table 5 illustrates yet another alternative form of exemplary Algorithm Instruction word and Table 6 illustrates another alternative form of exemplary Configuration Instruction.

TABLE 5

Exemplary Algorithm Instruction

| [8:7] | [6:5] | [4:3] | | [2] | [1] | [0] |
|---|---|---|---|---|---|---|
| | | A | A + 1 | A − 1 | 0/1 | R/W | A |
| OP Level | Addr Level | Addr | Addr + index | Addr − index | Data or Data Inverse | Read or Write | Algorithm Instruction |

TABLE 6

Exemplary Configuration Instruction

| [8:7] | [6:4] | [3:1] | [0] |
|---|---|---|---|
| MISC | Configuration definition | Loop control | C |
| | | Last loop definition | |
| | | Loop initialization | |
| | Program control | NOP | |
| | | Pause | |
| | | Stop | |
| | Special OP | Set write mask 0 | |
| | | Set write mask 5 | |
| | | Set write mask A | |
| | | Load MAX address | |
| | | Load MIN address | |
| ADDRESS | Loop Number | DIR | Column addressing | |
| | | Row addressing | |
| | | Row only | |
| | | Column only | |
| | | Diagonal | |
| | | Increasing | |
| | | Decreasing | |
| | | REL | Level No Relation | |

TABLE 6-continued

Exemplary Configuration Instruction

| [8:7] | [6:4] | [3:1] | [0] |
|---|---|---|---|
| DATA | Data selection | +/−$2^n$ | |
| | Data type | XOR $2^n$ | |
| | | Data backgrounds | |
| | | Solid | |
| | | Checkerboard | |
| | | Row stripe | |
| | | Column stripe | |
| | | Unique | |
| | Data update | Update data background | |
| | | Update scheme 1 - next | |
| | | Update scheme 2 - shift | |
| | | Data start | |

As is apparent from Tables 5 and 6, the exemplary Configuration Instruction set and the Algorithm Instruction set for these alternative embodiments are very similar to the instruction configurations described above in connection with the Base Embodiments and embodiments of FIG. 3A and Table 4.

The main difference between the Configuration Instruction set for these alternative embodiments and the previously described Base embodiments lies in the address configurations. Instead of configuring the base loop and the local loop, in the alternative embodiments of Tables 5 and 6, all loops in a test step are desirably configured. There are two types of address configurations: address direction and address relation. The address direction instructions in this example specify the order of address change, and the address relation instructions in this example specify the relationships between addresses in different levels. There is one bit, named LEVEL in the Table 4 example that indicates what two levels of addresses have relationships: "0" indicates Level 0 address, and "1" indicates the address of the loop that immediately nests the current loop.

In this example, there are also three extra instructions: loop control, last loop definition and loop initialization. All three instructions are multi-word instructions.

The exemplary loop control instruction loads the configurations that specify the jump address and the level of each loop. The words following the loop control instruction in one specific example have the following format:

| OP # | Jump Address | Loop Level | Last word |
|---|---|---|---|

The three most significant bits in this example specify the operation number, the next three bits specify the jump address of the current operation, the next two bits indicate the level of the loop whose last operation is the current operation, and the last bit ('Last word') indicates if the word is the last configuration word of the Configuration Instruction.

The last loop definition instruction in this example is a two word instruction. The word following the last loop definition Configuration Instruction specifies if a loop is the last loop associated with an operation, one bit for one loop.

The loop initialization instruction in this example specifies the loops that need initialization. The words following the loop initialization instruction, in this example, have the following format:

| OP# | Initialization Loop | Last word |
|---|---|---|

In this example, the two most significant bits are not used, the next three bits specify the operation numbers, the next three bits specify the loops that begin with the current operation and need initialization, and the last bit ('Last word') indicates the word is the last word of the loop initialization instruction.

In an exemplary Algorithm Instruction for these Table 5 and 6 alternative embodiments, bit 8 and bit 7 specify the highest loop level that a loop is in, which will be used for configuration change, bit 6 and bit 5 specify the level of address that the operation in the instruction will be performed on, bit 4 and bit 3 specify the actual address that the operation will be performed on, which could be the address of the level specified by bit 6 and bit 5, or the address plus or minus an index, and the three least significant bits have the same meaning as the previously described Algorithm Instructions.

These alternative forms of Algorithm and Configuration Instructions of Tables 5 and 6 are given as examples, and may be varied.

8.0.1 Loop Manipulation

An instruction buffer is desirably embedded and can hold a test step. A test step can contain more than one loop. Therefore, an approach is provided to define the boundaries of a loop, and the beginning and the end of a loop. Correct initialization and execution of the loop is also accomplished.

The design concepts can be understood with reference to a specific example, as follows:

Suppose a test step (FIG. 15) is provided that can be written as:

(OP0, ((OP1), (OP2, OP3)), (OP4, OP5))

This is the same example discussed above in Section 5.3.1, although the (loops) are numbered differently in this approach, as explained below.

In this step, there are 6 operations: OP0, OP1 . . . OP5. Each pair of brackets in this example forms a loop. The test step in this case is composed of 5 loops. Loop0 and Loop1 are nested in Loop2, and Loop2 and Loop3 are further nested in Loop4. As is apparent, there are three levels in the example step: Loop0 and Loop1 are in level 2, Loop2 and Loop3 are in level 1, and Loop4 is in a level 0.

Figure 16:
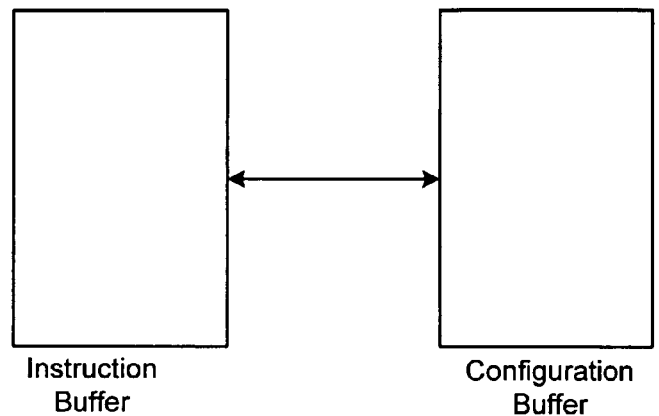
FIG. 16 is a block diagram of exemplary instruction and control buffers.

In this example, the configurations of a test step are loaded into the configuration buffers and the Algorithm Instructions are loaded into the instruction buffer 800 (FIG. 16). When a test step is to be executed, the configurations in the configuration buffers 810 define how the loops are iterated and what address scheme of a loop is to be used.

For each loop, in this example, there are the following configurations: (1) the start operation and the end operation, (2) the level of the loop, (3) the address scheme of the loop.

8.1 Entering a Loop

Figure 15:
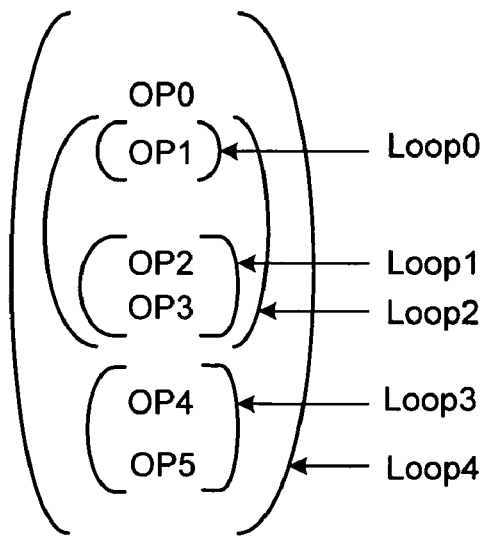
FIG. 15 is a diagram of a test step example.

When a read operation in the instruction buffer 800 is read, a first check is performed to determine whether initialization is needed for one or more loops that start from the current operation. The configurations that need to be executed before entering the loops are associated with the first operation. There may be more than one loop configuration that is to be executed for an operation because an operation could be the start operation for more than one loop. For example, OP1 in FIG. 15 is the start operation for both Loop0 and Loop2. Therefore, both configurations for Loop0 and Loop2 should be executed. This also explains why in this approach, at least one address register is desirable for each level.

An exemplary mechanism that determines whether to perform initialization is as follows: the addresses of all levels are marked that require initialization; the configurations associated with the current operation are used to initialize the un-initialized addresses of the corresponding levels and the addresses are marked as having been initialized; and then the addresses are marked to be un-initialized once the loops are done for the addresses.

Because one operation could be the start operation for more than one loop, it is desirable to quickly determine if a loop has been initialized in order not to slow down the testing (desirably at speed testing) of the loop. For example, OP1 in the example is the start operation of both Loop0 and Loop2. When executing Loop0, it would be undesirable to expend extra test cycles to determine whether the loops (Loop0 and Loop2) have been initialized. One approach is to use parallel hardware to check if all the loops starting with an operation have been initialized. Because the number of loops starting from an operation before a test step is loaded into the buffer is unknown, this approach may require significant logic for each operation, which could result in significant hardware requirements. A more desirable approach is to use a so-called running level register to indicate the level of an address that is being executed. If the running level is the same as the highest level (which can be called the OP-level) associated with the current operation, it is known that initialization of the loop is not required. However, if the running level is smaller than the OP-level, initialization of the loop is known to be needed before the loop is executed.

The running level will desirably be set to the OP-level associated with the operation once the initialization is complete. The running level will be reduced by one after a loop execution is complete. Initialization for the reduced running level takes place before loop execution.

In the example above, when OP1 is first read, the running level is 0, while the highest level associated with OP1 is level 2. Consequently, initialization is needed. Once Loop0 and Loop2 are initialized, the running level is set to 2 such that Loop0 can be executed continuously without initialization, as the running level is always equal to an OP-level of OP1 before the Loop is done.

When a loop is being executed, for each instruction read, a check is desirably made as to whether a jump is needed. The configuration buffers store the instruction buffer address that the jump operation should go to. If the loop has not yet reached its last address, the jump address will serve as the next address to fetch instructions in the instruction buffer.

8.2 Leaving a Loop

Leaving a loop, in this example, also involves a configuration change. In the example in FIG. 15, after Loop1 is finished, the process goes back to Loop2. The configuration in this case is set for Loop2, because the address for Loop2 is to be updated.

8.3 Buffer Address Control

For the last operation of each loop, an associated jump address is provided. The jump address specifies the address that should be jumped to if the current loop is not finished. Also a flag is, in this specific example, attached to each loop to indicate if the loop is the last loop whose last operation is the current operation.

Figure 17:
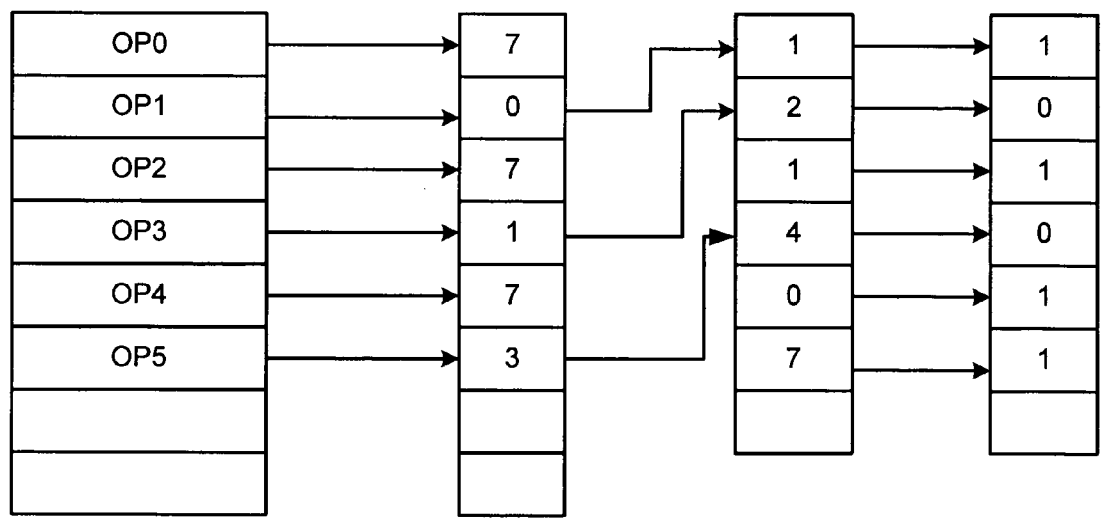
FIG. 17 is a block diagram of an exemplary buffer address control.

FIG. 17 sets forth a diagram for the above example.

8.4 Address Scheme Configurations

A test step may have more than one loop and each loop may have a different address scheme. Consequently, each loop in this example desirably has its configuration stored in the programmable MBIST controller. A desirable address scheme in this example consists of two parts: address direction and address relationship. The address direction specifies how an address is changed, such as column addressing, row addressing or otherwise. The address relationship specifies how an address is related to another address (e.g., addresses of a certain level can be a function of another address of a lower level, see FIG. 12). For example, the addresses in Loop0 (Level 2) can be a function of addresses in Loop4 (Level 0). However in this example, an address of a loop desirably will not be a function of an address in a lower-level loop that does not nest the higher-level loop. For example, the addresses in Loop1 will not be a function of the addresses in Loop3. In this case, the maximum number of relations of an address is L−1 if the address is in the loop of level L−1. In many realistic or practical algorithms, this loop relationship is even more simplified. For example, in some cases an address may be only related to the loop of level 0 and to the loop that immediately nests the current loop. In these cases, there are only two loop relations, which simplifies the instruction design.

Figure 18:
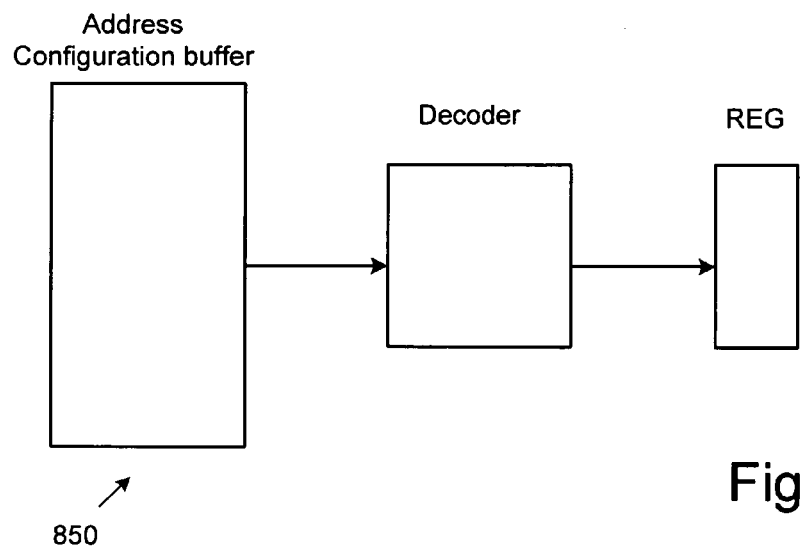
FIG. 18 is a block diagram of an exemplary address configuration decoder.

If the total number of address schemes is 16 and the total number of loops in a step is 8, the number of registers needed to record all address instructions would be 128. To reduce the overhead requirements, the address Configuration Instructions need not be pre-decoded. This would use 48 registers. In this case, the address Configuration Instructions would be decoded only when they are needed, for example, upon entering a loop and leaving a loop (see FIG. 18).

8.5 Configuration Change Control 8.5.1 Initialization

Figure 19:
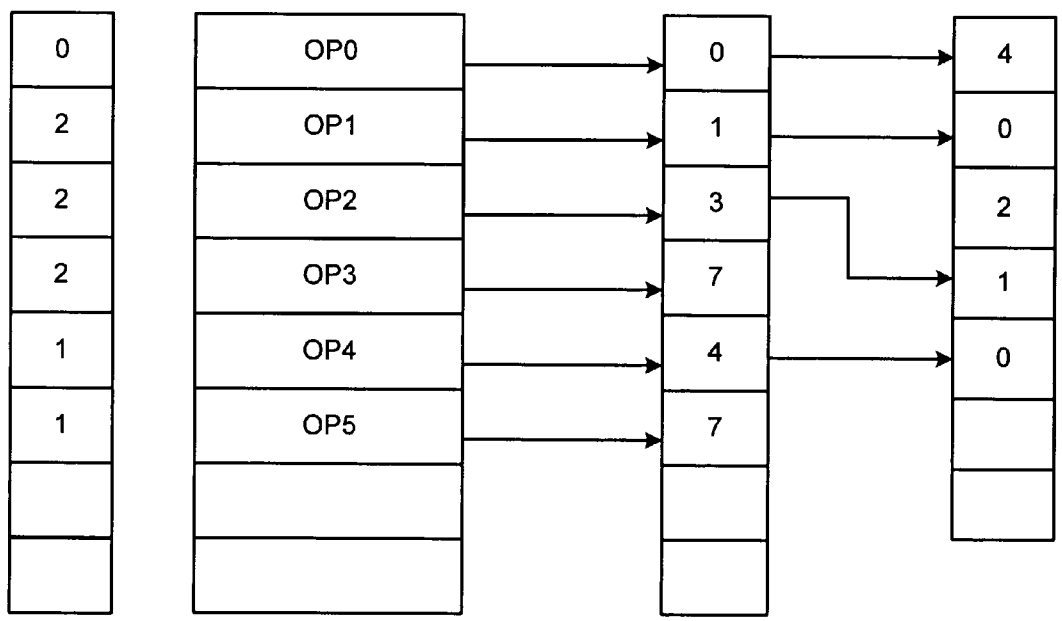
FIG. 19 is a diagram of exemplary initialization configurations.

When a loop is entered, initialization is typically needed. FIG. 19 shows an approach involving the attachment of initialization configuration indexes to the beginning operation of a loop. For example, when OP2 is reached.

8.5.2 Leaving a Loop

Figure 20:
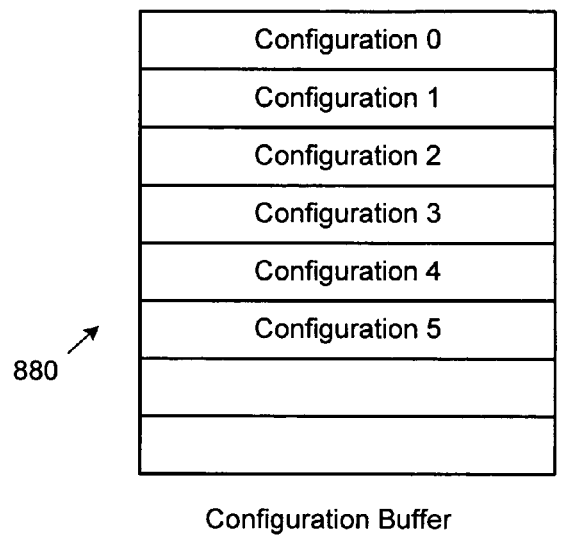
FIG. 20 is a diagram of an exemplary configuration buffer.

The loops in a step are desirably ordered by their last operations and the configurations are desirably stored in the configuration buffer in the same order (see, for example, configuration buffer 880 in FIG. 20). With this approach, when a loop is left, the next configuration will always be the next one in the configuration buffer. For example, if Loop1 is done, the process automatically goes to Loop2.

8.6 Extra Cycles

As is apparent from the above description, in the illustrated approach of these latter alternative embodiments, extra test cycles are needed when entering and leaving a loop. This means that full-speed testing is achieved for a loop that does not nest another loop but that slightly less than full-speed testing is achieved in between these latter embodiments loops for a loop nesting another loop.

8.7 Address Generator

At least one address register is desirably used for each level of loops because addresses in any level can be used in a higher-level loop. Although one address register is desirably used for each level (e.g., like 850 in FIG. 18), the address logic for operations such as subtraction and addition can be shared between the address registers of different levels. As the number of levels increase, the logic sharing will result in speed degradation. For this reason, having at least one address generator for each level can be highly desirable.

8.8 Other Parts

The mechanisms for an instruction decoder, control signal generator, data generator, latency adjuster, and output response analyzer may be like the previously described Base Embodiments and, for this reason, are not described in detail in this portion of the description.

9.0 Interaction with ATE

In accordance with one exemplary embodiment, instructions are desirably divided into blocks. Each block desirably contains just one type of instruction: either Configuration Instructions or Algorithm Instructions.

A block of Configuration Instructions desirably contains a sequence of consecutive Configuration Instructions with no Algorithm Instructions in between. A block of Algorithm Instructions desirably proceeds to a configuration block (if it is not the first block of the algorithm) and another block desirably follows the configuration block (if it is not the last block of the algorithm).

A block of Algorithm Instructions usually contains one test step. However, for example, when the step following the current step has only one operation, the step may be combined with the current step to form a block.

Instructions are desirably first loaded into instruction memory until the instruction memory is full.

The instructions in the instruction memory are then decoded, classified and then either decoded by a configuration decoder or loaded into instruction buffers. Once a block is processed, a load request is desirably sent to an ATE. The ATE loads additional data to the instruction memory if there are still instructions that have not yet been loaded.

In the meanwhile, if there are instructions in the instruction buffers, a test step is desirably being run. As a result, instruction loading time is effectively hidden. To avoid interference from instruction loading of an ATE, the instruction read from the instruction memory is set to NOP when loading is being performed by the ATE.

It should be noted that load request of a desirable form of field programmable MBIST controller is desirably block-based, e.g., once a block is processed, a load request is issued by the MBIST controller. The loading to instruction memory from an ATE need not load a whole block to instruction memory.

Figure 21:
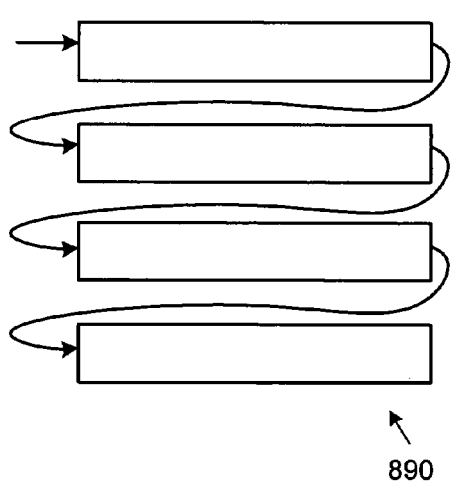
FIGS. 21 and 22 are exemplary approaches for determining the number of instructions loadable from an ATE to instruction memory.
Figure 22:
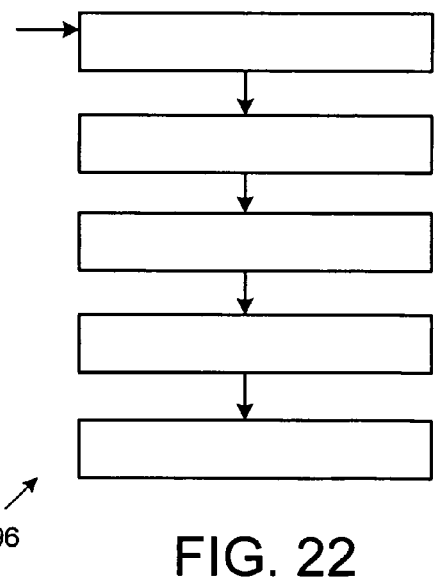

The number of instructions that an ATE can load to the instruction memory can be, for example, determined by the number of instructions that have just been processed by the programmable MBIST controller. Two exemplary versions for determining the number are as follows:

(1) The numbers are stored in a file (block_bound) which will be loaded to the ATE. In this version, the whole instruction memory contains shift registers 890 and the instructions are shifted into the memory (FIG. 21); or (2) The number is directly advanced from a Program Counter (PC) when a block is read. The programmable MBIST controller will then request loading from the ATE until the instruction memory is filled again. In this version, there is only one 9-bit shift-register. One instruction is first shifted into the shift-register, and then the instruction is clocked into instruction memory (see 896, FIG. 22).

The instruction loading time can be hidden (accomplished in a time that is less than or equal the time required for a test step) in a test step except under the following situations:

(1) When the instructions are initially loaded into the instruction memory;

(2) When a configuration block, other than a simple direction Configuration Instruction, is positioned between two algorithm blocks; and (3) When the loading time of a block is so long that more time is required for loading than the time required to finish one test step.

One example of conditions that give rise to the third category is as follows:

Suppose the BIST clock period is Pb and the ATE clock period is Pa, the address range is R, and the word size of an instruction is 9 bits. The situation most possibly occurs when the step being run contains only one operation. If the number of instructions that can be loaded to the instruction memory is N, where N should satisfy:

$$N*9*Pa < Pb*R$$

e.g., $N < (Pb/Pa)*R/9$

This example does not consider the synchronization time between the two different clocks. The ratio Pb/Pa is always equal to or less than 1. The smaller the ratio is, the smaller the number of instructions that can be loaded into the instruction memory without extra time being required for such loading beyond the time required for the test. That is, if the speed gap between ATE and BIST is too large, it is possible that a test has to be held temporarily to permit the completion of the instruction loading.

An external interface for the programmable MBIST controller can be used to determine the MBIST controller's hand shaking protocol with the ATE. Specifically, the complexity of the interaction scheme will depend on the size of the instruction memory within the MBIST controller. Assuming that the size of the instruction memory is limited, a general interface is described in this section that allows parts of an algorithm to reside in the memory at any point of time and with the MBIST controller starting to operate with a subset of instructions that are loaded into the instruction buffers.

In order to start the BIST session, a "mbist_start" signal is delivered in this embodiment from the ATE to the MBIST controller. Similarly, a STOP instruction in the instruction set will be utilized in this example to assert a "stop" signal to the MBIST controller, indicating the end of the algorithm. In addition, the MBIST controller in this specific example interacts with the ATE under the following three situations.

1. ATE needs to load instructions to the instruction memory.

2. The MBIST controller is sending diagnostic data to the ATE.

3. A retention test is in progress and the MBIST controller is waiting for a resume signal.

9.1 Loading the Test Algorithm 9.1.1 Free Running Memory Load Clock

Figure 23:
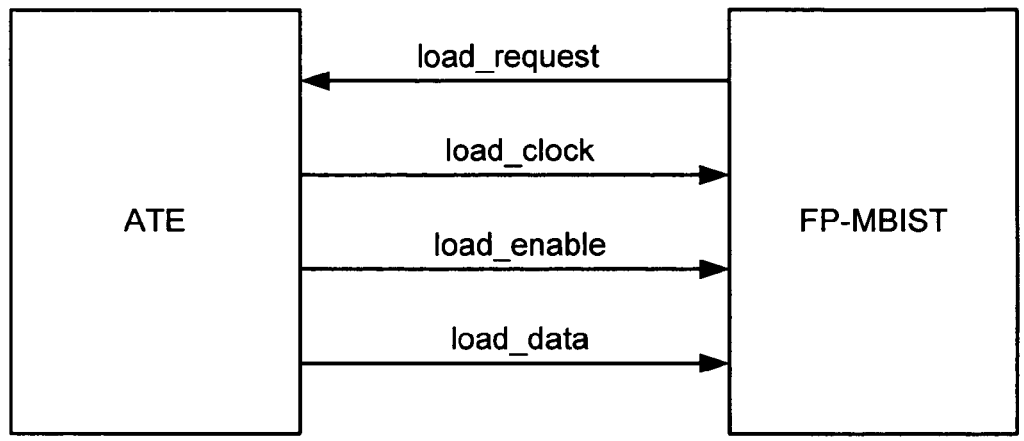
FIG. 23 is a schematic block diagram of an exemplary ATE programmable MBIST controller interface.

The ATE is responsible in this embodiment for loading the instructions to the instruction memory in the MBIST controller. The instruction memory can be of any size and can be selected to optimize between the area overhead and the test application time for a given algorithm. There are three signals that can be used in this example by the ATE to load instructions to the instruction memory, namely, load_clock, load_enable, and load_data (FIG. 23). The load_clock signal can be shared with diagnostic clock in the MBIST controller, whereas the load_data signal, in this example, is a single bit serial input that provides actual instruction data to the controller. The load request signal is used by the MBIST controller to notify the ATE that the ATE can now begin loading the instructions.

Initially the ATE fills up the instruction memory, in this example, as the size is known apriori. The MBIST controller starts decoding the instructions in the instruction memory and loads the Algorithm Instructions into the internal instruction buffer. This procedure continues until a loop boundary is encountered or all instructions in the instruction memory have been fetched. In this example, the MBIST controller will request additional instructions from the ATE by asserting the load request signal in the following two situations.

a) A non-loop offset instruction is seen after a 'loop offset' instruction.

b) All the instructions in the instruction memory have been fetched.

Figure 24:
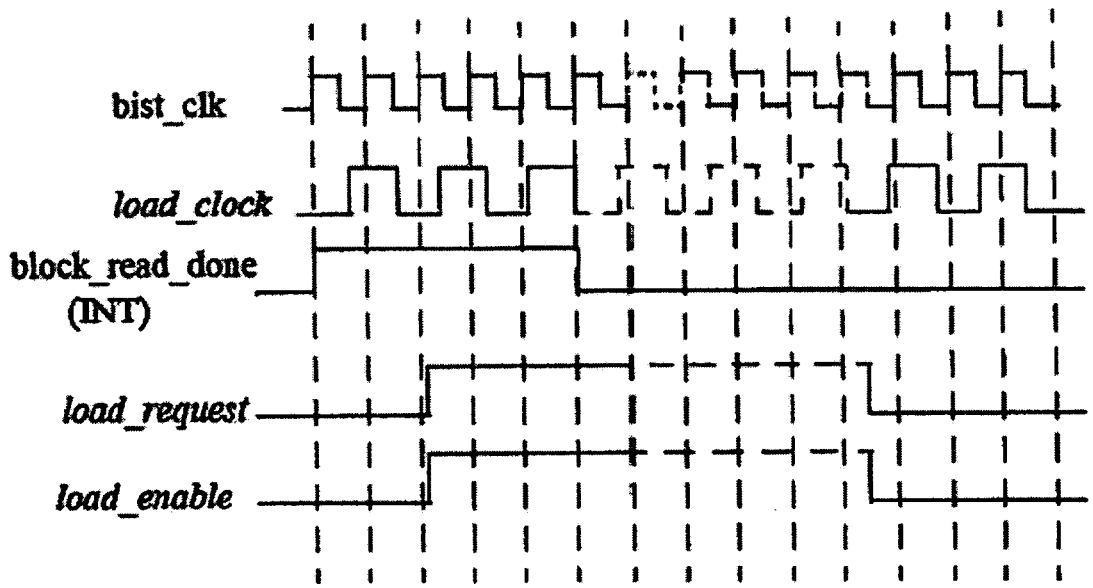
FIG. 24 is an exemplary handshaking protocol for the ATE to programmable MBIST controller interface of FIG. 23.

The waveforms of the loading procedure of this example is shown in FIG. 24. Once block_read_done is asserted and synchronized by load_clock, the load request signal will be asserted. The load_enable will be asserted by the ATE to load instructions. When the MBIST controller detects loading from the ATE, it will de-assert the block_read_done signal. When the instruction memory is filled, the load request will be de-asserted and the ATE will de-assert load_enable as well. Although in the example waveform, load request and load_enable are asserted at the same time, load_enable can be asserted much later as the ATE takes time to detect the load request signal.

9.1.2 Memory Load Clock on Demand

Figure 25:
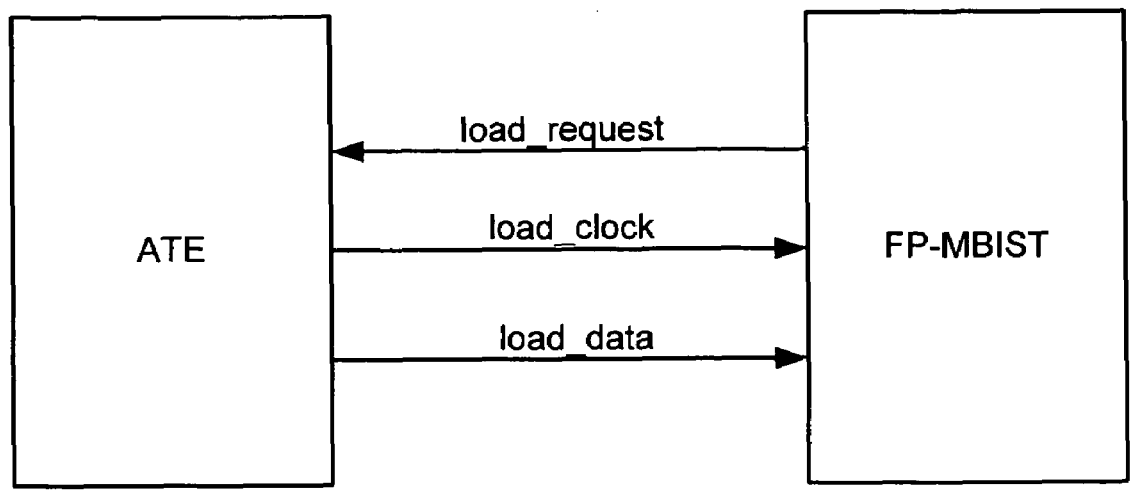
FIG. 25 is a schematic block diagram of alternative exemplary ATE programmable MBIST controller interface.

There are two signals in this example that are used by the ATE to load instructions to the instruction memory-load_clock and load data (FIG. 25). The load_data signal and load_request signals can be, for example, as described above.

The load_request signal is asserted in this example only when the instruction memory is empty. The ATE starts filling up the instruction memory only when the load request signal is active. The load request signal is de-asserted once the controller detects that the ATE is loading instructions.

Before the ATE sends the actual instruction data to the controller, the ATE in this example sends a synchronization sequence '01' so that the MBIST controller can determine that instruction data is to be shifted in.

The ATE should desirably control the number of clock cycles of load_clock sent to the MBIST controller, which should be at least the number of bits in the instruction memory plus three, with two cycles for the synchronization sequence and one cycle used to move data from a temporary shift register to instruction memory after a whole instruction word is shifted into the temporary shift register. The MBIST controller functions correctly in this example even if more clock cycles are sent as long as they are not the synchronization sequence ('01').

Figure 26:
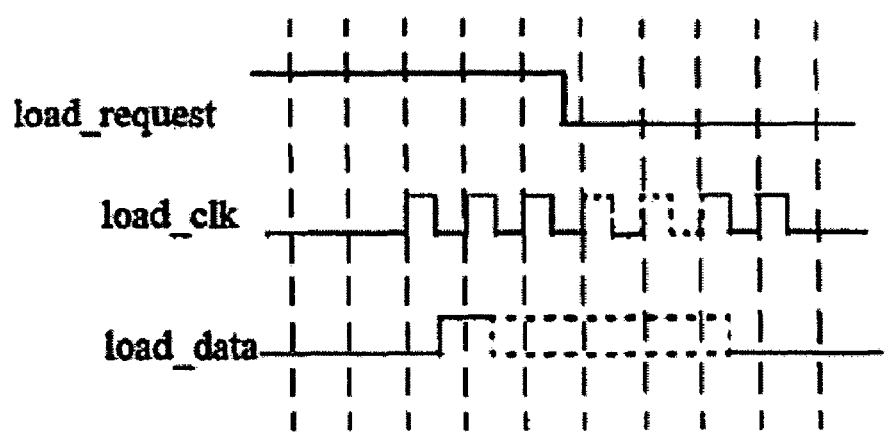
FIG. 26 is an exemplary handshaking protocol for the ATE to programmable MBIST controller interface of FIG. 25.

The waveforms for the protocol for the FIG. 25 interface are shown in FIG. 26.

9.2 Diagnostic Monitor

Although not required, a diagnostic monitor is desirable used in one embodiment to capture diagnostic data and shift out the failing data to the ATE. In one form, the diagnostic monitor desirably comprises and more desirably consists of two finite state machines (FSM): one operating in the BIST clock domain and the second operating in the diagnostic clock domain. The two FSMs are explained below (See FIGS. 27 and 28).

9.2.1. cont_state (BIST Clock Domain FSM)

Once a failure is seen by the cont_state FSM in the CONT_IDLE state, this FSM will go to CONT_SCAN state and issue a start_diag signal for the diag state FSM. When diagnostic data is shifted out, a synchronized diag done signal is sent from the diag state FSM. The signal will result in the cont_state FSM moving from the CONT_SCAN state to the CONT_SYN state. The CONT_SYN state will return to the CONT_IDLE state once the synchronized signal diag_done goes low and the restart signal (int restart) is asserted. This indicates that start_diag has gone low and the event has been seen by the diag_state FSM, but at the same time a second failure is detected. However, if the restart signal is not asserted in the CONT_SYN state, the cont_state will enter the CONT_REC state, in which the state machine will wait for a specified number of recovery cycles. If failures are detected when this FSM is in the CONT_REC state, the FSM will enter the CONT_SCAN again to shift out the first failure detected in the CONT_REC state, otherwise it will go back to the CONT_IDLE state.

The recovery cycles can be controlled by users at the programmable MBIST controller generation time. These cycles should be long enough for ATE so that the fail_flag can be sampled correctly.

If the MBIST controller FSM is in CONT_SCAN or CONT_SYN states, and a new failure is detected by the MBIST controller, or the MBIST controller FSM is in the CONT_REC state and more than one failure is detected, the restart signal will be asserted. This leads to the restart procedure, thereby starting the execution of the algorithm from a safe point as discussed below in section 9.2.2.

9.2.2. diag_state (Diagnostic Clock Domain FSM)

Once a synchronized start_diag is seen by the FSM in the DIAG_IDLE state, the diag_state FSM goes to the DIAG_SHIFT state, at which diagnostic data is shifted out to the ATE. When all the data has been shifted out, the diag_state FSM shifts to the DIAG_SYN state at which this FSM waits for the start_diag signal going low. At the same time, the diag_done signal is sent to the cont_state FSM. Once the diagnostic FSM sees synchronized start_diag going low, this FSM goes to the DIAG_IDLE state, waiting for a new start_diag signal.

Figure 27:
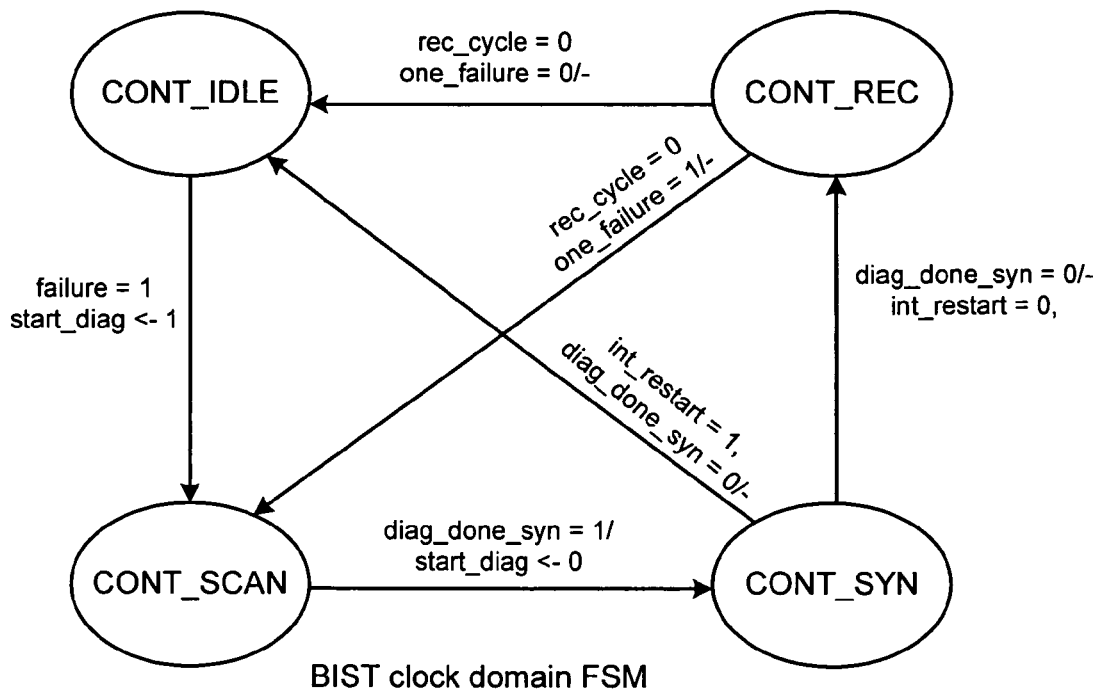
FIG. 27 is a state diagram for an exemplary finite state machine (FSM) for a MBIST clock domain FSM.
Figure 28:
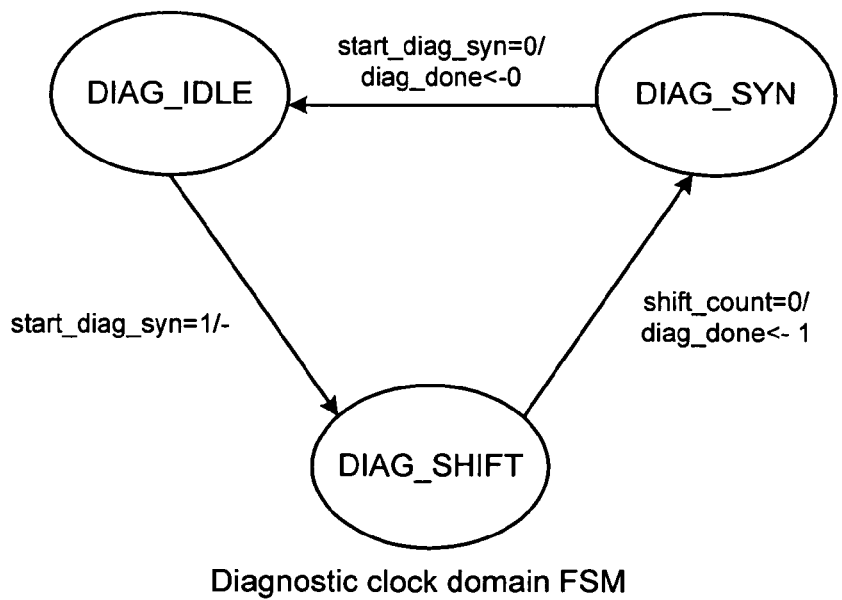
FIG. 28 is a state diagram for an exemplary finite state machine (FSM) for a diagnostic clock domain FSM.

The state transition diagrams for these exemplary two FSMs are shown in FIGS. 27 and 28.

Figure 29:
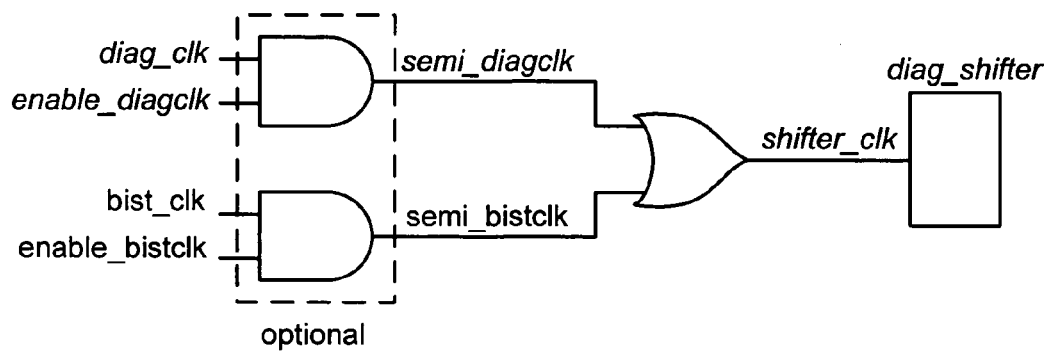
FIG. 29 is a schematic diagram of an exemplary circuit for use in shifting out diagnostic data.

It should be noted that an internal diagnostic-data shift clock is desirably generated in this example from the MBIST clock and diagnostic clock to both capture and shift out diagnostic data, which can be seen with reference to FIG. 29.

With reference to FIG. 29, two signals enable_diagclk and enable_bistclk, are generated in this example to select the clock going to the diagnostic register. Optional two AND gates in FIG. 29 are used to prevent possible glitches when two clocks are being switched. These AND gates are optional as the possible glitches do not affect the correctness of the logic operation. The diagnostic clock signal is enabled when synchronized start_diag signal is seen by diagnostic clock domain FSM and is disabled when the diag_done signal is asserted. The MBIST clock is disabled when the start_diag signal is asserted and is enabled when the synchronized diag_done signal goes from high to low.

Figure 30:
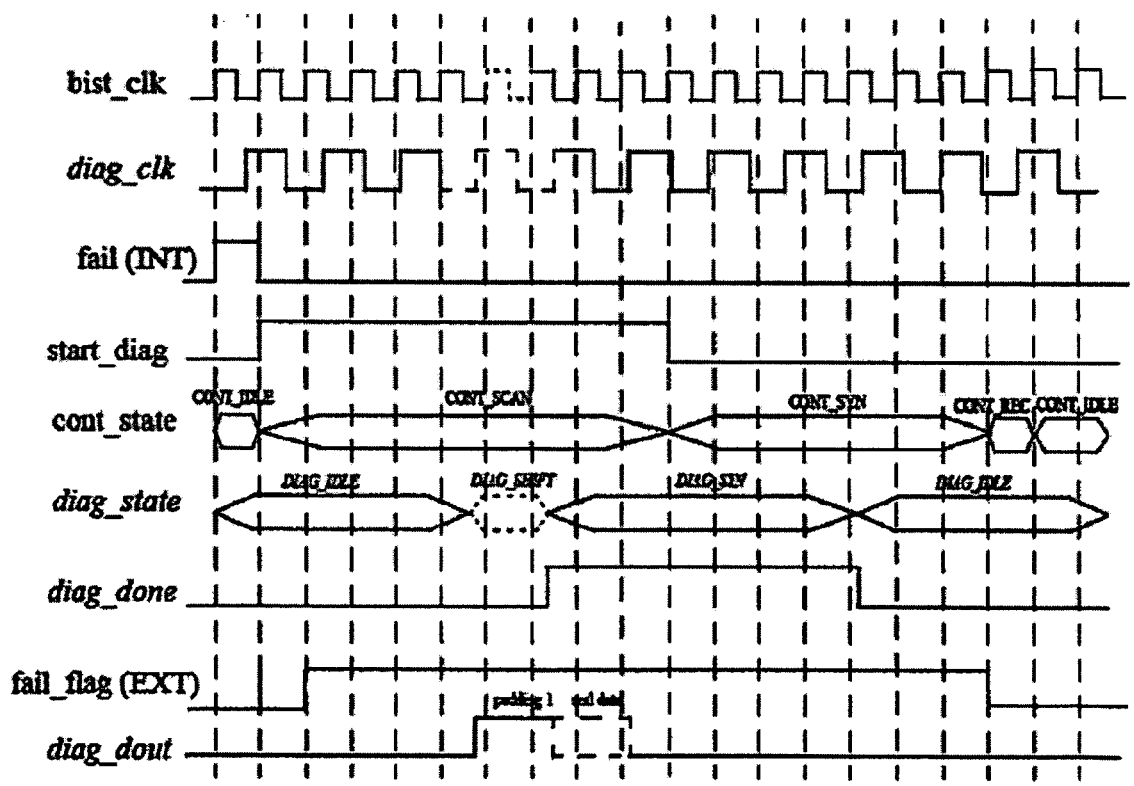
FIG. 30 is an exemplary signal waveform for one embodiment of a diagnostic monitor.

Some signals in the diagnostic monitor are shown in FIG. 30.

The signals shown in italic font in FIG. 30 are in diagnostic clock domain. The other signals (non-italic font) in FIG. 30 are in BIST clock domain.

9.3 Scanning out Diagnostic Data

9.3.1 Restart from Beginning of Test Program

Figure 31:
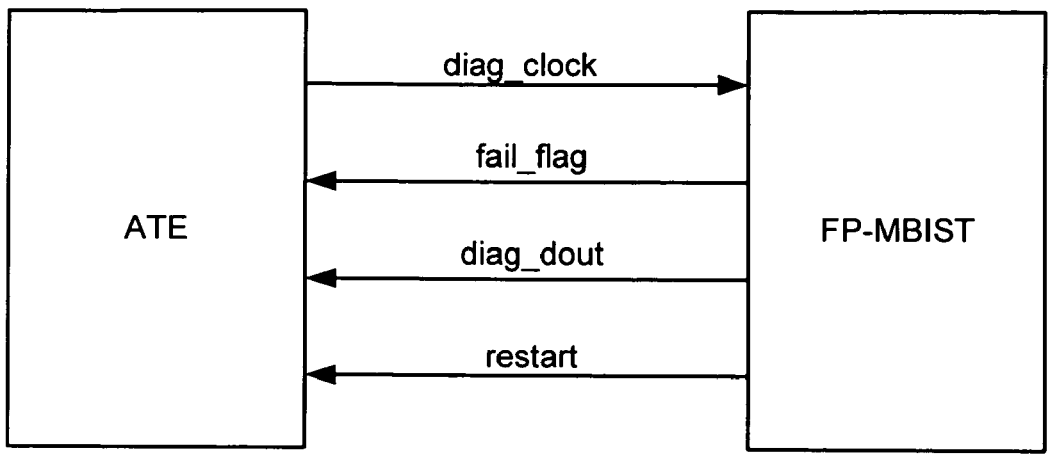
FIG. 31 is a schematic block diagram of an exemplary ATE to programmable MBIST controller diagnostic interface.

There are four signals used in one exemplary embodiment as part of a diagnostic interface between the ATE and the MBIST controller, namely, free running diag_clock from ATE, a diag_dout signal, restart signal, and fail_flag from controller (see FIG. 31). In FIG. 31, the reference to FP-MBIST refers to Field Programmable MBIST.

When a data mismatch is found, the start_diag signal goes high and a fail_flag signal is asserted. The fail_flag will be deasserted when start_diag goes back to 0 in this example.

In this example, the diagnostic data is serially scanned out to the ATE. Once synchronized and the start_diag signal is seen by diagnostic clock domain FSM, a padding or synchronization bit '1' is first sent to the ATE. In this embodiment, the actual diagnostic data follows the synchronization bit. Once finished, the diagnostic data sent out to ATE will be always '0', in this example, since the clock is always running.

If a new failure is detected in the middle of scanning out the first failure, a 'restart (INT)' signal from the diagnostic monitor 900 is sent to the MBIST controller. The MBIST controller will save the current state as a restart point and send a restart (EXT) signal to the ATE. The restart (EXT) signal will be asserted for one complete load_clock (slower clock) cycle. This scheme assumes that the ATE can react to the signal reloading instructions from the beginning of the test program. Once the current diagnostic data 902 is shifted out to the ATE completely, the MBIST controller will, in this example, start running the test program again. The MBIST controller will skip all the failures that have been already shifted out to the ATE before it reaches the last error shifted out.

Figure 32:
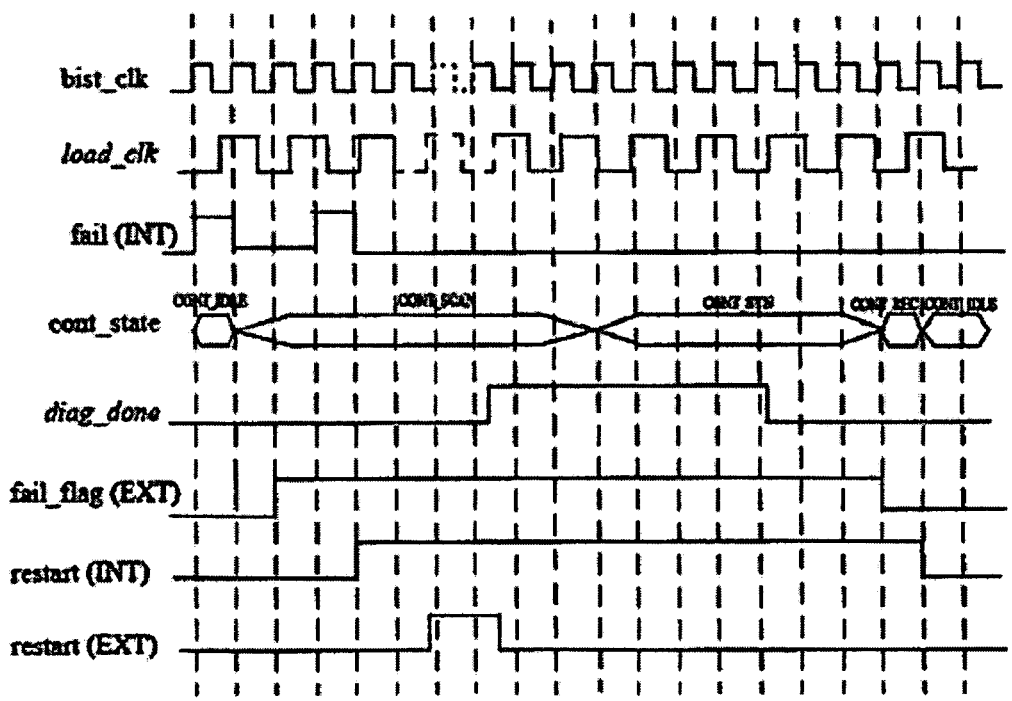
FIG. 32 is a diagram of selected waveforms for an exemplary diagnostic interface with restart.

Exemplary waveforms for this embodiment are shown in FIG. 32.

9.3.2 Restart from Beginning of Test Step (Default Behavior)

Figure 33:
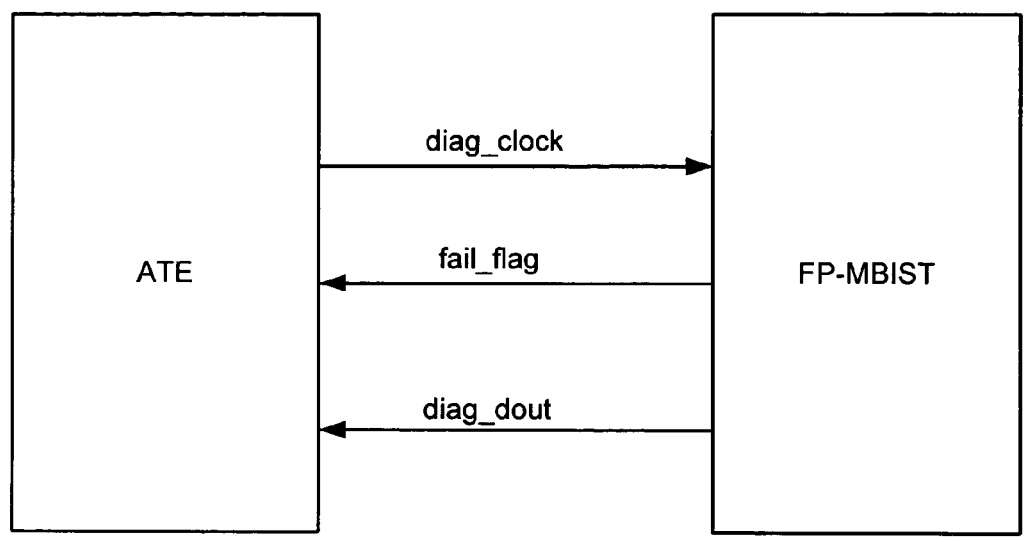
FIG. 33 is a schematic block diagram of an exemplary alternative form of an ATE to MBIST controller interface.

In the example of this embodiment, there are three signals used for diagnostic purposes between the ATE and the MBIST controller: diag_clock from ATE to the MBIST controller, and diag_dout signal and fail_flag from the MBIST controller to the ATE (See FIG. 33).

The diagnostic data is serially scanned out in this embodiment to the ATE through a diag_dout pin. Once the synchronized version of the start_diag signal is seen in the diagnostic clock FSM, a padding bit '1' (similar to the previous case) is first sent to the ATE. Following this bit, the actual diagnostic data is sent to the ATE in a serial manner. Once finished, the diagnostic data sent out to ATE will always be '0', in this example, until new diagnostic data is ready. Less desirably, parallel delivery of data from the ATE can be used.

If a new failure is detected in the middle of scanning out the first failing data, a 'restart' (INT) signal from the diagnostic monitor is sent to the MBIST controller. The MBIST controller will save the current state as the restart point. Once the current diagnostic data is shifted out to the ATE completely, the MBIST controller will perform a restart operation from the beginning of the current test step.

In this approach, the restart procedure usually includes two steps: re-initialization of the memory and restart from the beginning of the current test step. The re-initialization step will recover the value in the memory before the current test step is executed. For example, if a test step (r0, w1, r1) detects two consecutive failures, one can first re-initialize the memory to '0' and then execute the test step again. The re-initialization step in this example uses the same data pattern and addressing scheme as the current test step to initialize the entire memory under test. However, if the current test step contains no write operation, the initialization step is desirably skipped. For example, if a test step is (r0) and a restart is required, the test step will be re-run but the re-initialization step is skipped. The MBIST controller in this embodiment will automatically detect whether a test step contains write operations.

The diagnostic clock can be either a free-running clock or sent on demand by the ATE to the controller. In the latter case, in this example, the ATE will send diag_clock to the controller when the fail_flag signal is asserted. The ATE will disable the diag_clock once fail_flag is de-asserted.

FIG. 32 depicts exemplary waveforms of this approach. Supporting a restart operation in this example does not change the interface to the ATE.

9.3.3 Format of the Diagnostic Data

An exemplary format for the diagnostic data can be expressed as follows.

[Padding bit '1', PC+buf_count, address [0:NUM_LEVEL−1], fail_map]

In this example format, PC corresponds to the instruction number of the first instruction of the test step detecting the failure. The variable "buf_count" denotes the operation number in the test step. Value address[0:NUM_LEVEL−1] correspond to address 0, address 1, ..., address NUM_LEVEL−1, where NUM_LEVEL means the number of levels of addresses. The fail_map data corresponds to the XOR of the expected data and the actual data from the memory output. If all levels of the addresses are not used, the unused addresses will be set to 0. It should be noted that the reported addresses correspond to the addresses before the intra-iteration address calculation.

For example, consider the following test program:

0: enable diagnosis

1: enable restart

2: set addr inc, row addressing

3:10: w0

4: Loop offset I0

5: set addr inc, row addressing

6:10: r0

7:11: w1

8:12: r1

9: Loop offset I0

10: stop

Assume that the number of data bits is eight, the number of address bits is four, and two levels of addresses have been implemented. Additionally, in this example, the number of instructions allowed in the instruction buffer is eight (therefore buf_count is 3 bits) and the maximum number of instructions supported in a test program is 256 (therefore PC is 8 bits).

If instruction 8 detects a failure at address 12, the fail_map is 8'b00000010, PC equals 5 as instruction 5 is the first instruction of the test step detecting the failure, buf_count equals 2 as operation 2 in the test step detects the failure, address0 equals 12 as failure is detected at the address, and address1 equals 0 as the test step has only one level and address1 is not used.

Therefore, the data to be scanned out is:

[1, 00000111, 1100, 0000, 00000010]

In this approach, the ATE receives a padding bit '1' before the real diagnostic data.

For a March-only version of the MBIST controller as described below (see section 10), desirably only one address register is used and is shifted out. The data shifted out is in this March-only version of the MBIST controller is as follows.

[1, 00000111, 1100, 00000010]

9.3.4 Sharing Diagnostic Clock and Memory Load Clock

The instruction memory load clock and diagnostic clock can share the same input pin "shift_clk". If the clocks are not free-running, the "shift_clk" can be sent to the controller upon request, either via load_request or when fail_flag is asserted, or both.

9.3.5 Retention Test Interface

For a retention test, in one example a hand shaking mechanism can be used that involves two signals communicating between the MBIST controller and the ATE. A PAUSE instruction is used in this example for a retention test. Internally, upon decoding of the instruction, a pause signal is issued to the MBIST controller as well as to the ATE, indicating the beginning of retention test. The MBIST controller, in response, goes to a "hold" state, whereas the ATE would know that a resume signal, in this example, needs to be sent to the MBIST controller in order to resume the MBIST session. Asserting the resume signal by the ATE would indicate the resumption of the MBIST session to the MBIST controller.

Figure 34:
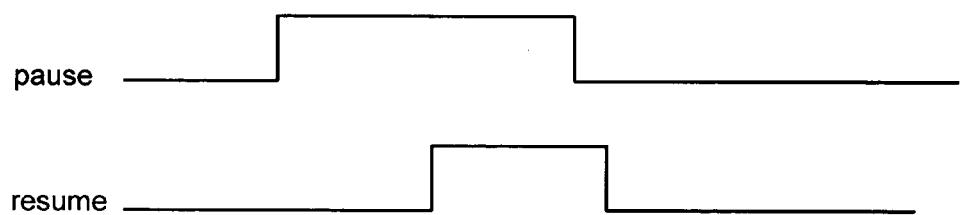
FIG. 34 is a diagram of exemplary pause and resume signal waveforms for a retention test.

The waveforms of exemplary pause and resume interface signals are shown in FIG. 34. The pause signal will be de-asserted once the controller sees that the resume signal is asserted. The resume signal is de-asserted once the pause signal is de-asserted. No strict timing relationship between the time when pause is de-asserted and the time when resume gets de-asserted is required as long as, in this example, the resume signal is de-asserted before the next pause.

10.0 Controller Generation

The new programmable MBIST controller can be generated (programmed) by a suitable EDA tool. An example of such a tool is MBIST Architect. It is desirable for the programmable MBIST controller to be used directly in the existing memory MBIST insertion flow of such a tool.

When the programmable MBIST controller is generated, a basic test bench and set of test vectors can be generated. These can be exercised to demonstrate the correct functionality of the MBIST controller. The test bench and test vectors can be designed so as to not cause any particular memory test algorithm to be performed on the memories associated with the MBIST controller.

As well as writing out the MBIST controller HDL, and other traditional files, a new view of the MBIST controller can be generated by the EDA tool. This new tool can contain a persistent version of the configuration state of the MBIST controller as it has been generated.

The persistent state of the MBIST controller can be loaded and memory test programs can be converted from a textual representation into a test bench and test vector set, ready for application to the MBIST controller. During this process the memory test program can be checked for semantic errors.

11. March-only Controller

The technology disclosed herein can readily be adapted to provide an MBIST controller that supports a specified one or more algorithms rather than being more fully programmable as explained above. As an example, the architecture may be modified and simplified to support a signal type of algorithm if, for example, desired by an end user. An advantageous example of this approach is described below for a March-only controller. The March-only controller supports March-type algorithms only. A dedicated controller of this type allows for simplification of the previously described field programmable MBIST controller architecture due to the simplistic nature of March algorithms.

11.1 Instruction Set

For the algorithm instructions, in this example, bits [7:6] are not used. Three intra-loop address manipulation methods are used: address, address+index and address-index. Data, in this example, can be data background or inverse of data background. Memory operations can be read operation, read operation without comparison, and write operation.

Exemplary Algorithm Instructions are shown in Table 7.

TABLE 7

Exemplary Algorithm Instructions For March-Only MBIST Controller

| [7:6] | [5:4] | [3] | [2:1] | [0] |
|---|---|---|---|---|
| — | Address Manipulation | Data Manipulation | Operation | 1 |
| Un-used | 00 - Address | 0 - Data | 00 - Read | |
| | 01 - Un-used | 1 - Inverse_Data | 01 - Read_no_compare | |
| | 10 - Address_+_index | | 10 - Write | |
| | 11 - Address_-_index | | 11 - Un-used | |

For the Configuration Instructions, in this example, there are only two addressing schemes, row addressing and column addressing. There is no address relationship as there is only one level of addressing in March algorithms. The exemplary Configuration Instructions for this MBIST controller are shown in Table 8. (The instructions implemented for just March algorithm support are high-lighted in bold.) It should be noted that the instruction 'loop offset' always has an offset of '0' as a test step in March algorithms always jumps back to its first operation after all operations within a step are completed.

The detailed descriptions of the instructions can be found the discussion of FIG. 3A and Table 4 above.

TABLE 8

Exemplary Configuration Instructions For March-Only MBIST Control

| [8] | [7] | [6] | [5] | [4] | [3] | [2] | [1] | [0] | N° |
|---|---|---|---|---|---|---|---|---|---|
| 0 | 00 Control | | 000 Program | | 000 NOP | | | 0 | 1 |
| | | | | | 001 Pause | | | | 2 |
| | | | | | 010 Stop | | | | 3 |
| | | | | | 011 Reserved | | | | 4 |
| | | | | | 100 Reset_Fail_flag | | | | 5 |
| | | | | | 101 Reset_State | | | | 6 |
| | | | | | 110 Reset_Mask | | | | 7 |
| | | | | | 111 Algorithm_Start | | | | 8 |
| | | | 01 Loop | | Loop Offset | | | | 9 |
| | | | 10 Mask | | 000 Set0 | | | | 10 |
| | | | | | 001 Set1 | | | | 11 |
| | | | | | 010 Set2 | | | | 12 |
| | | | | | 011 Set3 | | | | 13 |
| | | | | | 100 Set4 | | | | 14 |
| | | | | | 101 Set5 | | | | 15 |
| | | | | | 110 Set6 | | | | 16 |
| | | | | | 111 None | | | | 17 |
| | | | 11 Load | | 000 Start Address | | | | 18 |
| | | | | | 001 Stop Address | | | | 19 |
| | | | | | 010 Index | | | | 20 |
| | | | | | 011 Memory | | | | 21 |
| | | | | | 100 Port | | | | 22 |
| | | | | | 101 Block | | | | 23 |
| | | | | | 110 Page | | | | 24 |
| | | | | | 111 Slice | | | | 25 |
| | 01 Data | 0 Background | | | Data Background Index | | | | 26 |
| | | 10 Pattern | | | 000 Solid | | | | 27 |
| | | | | | 001 Checkerboard | | | | 28 |
| | | | | | 010 Row_Stripe | | | | 29 |
| | | | | | 011 Column_Stripe | | | | 30 |
| | | | | | 100 Unique | | | | 31 |
| | | 11 Write Mask | | | 000 Select Write Mask | | | | 32 |
| | | | | | 001 Set Write Mask | | | | 33 |
| 0 | 10 Address | 0 Loop | Direction | | 000 Row | | | | 34 |
| | | | 0 Increment | | 001 Column | | | | 35 |
| | | | 1 Decrement | | | | | | |
| | 11 Other | 00 Diagnostic | | | 000 Enable | | | | 36 |
| | | | | | 001 Disable | | | | 37 |
| | | | | | 010 Restart | | | | 38 |
| | | | | | 011 NoRestart | | | | 39 |
| | | | | 0100 Interleaving | | | 0 Enable | | 40 |
| | | | | | | | 1 Disable | | 41 |
| | | | | 0101 Port_Test | | | 0 Enable | | 42 |
| | | | | | | | 1 Disable | | 43 |
| | | | 10 Next | | 000 Memory | | | | 44 |
| | | | | | 001 Port | | | | 45 |
| | | | | | 010 Block | | | | 46 |
| | | | | | 011 Page | | | | 47 |
| | | | | | 100 Slice | | | | 48 |

11.2 Hardware Design

The top-level diagram of the architecture can be the same as in FIG. 4.

The logic blocks are described as follows.

11.2.1 Instruction Memory

In one form of March-Only MBIST controller, the instruction memory is a buffer between the programmable MBIST controller and the source of the instruction sequence being executed by the MBIST controller. It is formed from a register file of, for example, eight bit words. The size of the instruction memory can be decreased, or increased.

11.2.2 Instruction Decoder.

There are two logic functions in the instruction decoder for an exemplary March-only MBIST controller, namely:

Deciding if the instruction is an Algorithm Instruction or a Configuration Instruction.

Decoding the Configuration Instruction.

The first decision can be done by simply inspecting bit 0 of the instruction word as explained above. If it is set to '0', then the instruction is a Configuration Instruction, otherwise it is an Algorithm Instruction.

Decoding for all configuration instructions can be done in this example by inspecting the most significant bits of the instruction word, to determine the specific configuration instruction. For most configuration instructions the state of the MBIST controller is updated immediately. Address configuration instructions are desirably treated differently. Such instructions can be partially decoded and then passed onto a step controller for further decoding.

11.2.3 Step Controller

The step controller in this March-only MBIST controller example in one form stores one step of pre-decoded algorithm instructions and address configurations for a step and controls the execution of the test step. The step controller comprises or consists of four sub-blocks, namely, an instruction buffer and buffer control, address configuration buffer, address configuration decoder, and algorithm instruction decoder. The detailed diagram of an exemplary form of step controller is set forth above in FIG. 8.

The instruction buffer and buffer control block 500 in this example contains an instruction buffer and control logic for the execution of a test step. The address configuration buffer 502 stores the address configuration, row addressing or column addressing. The address configuration decoder 506 decodes the configuration read from the address configuration buffer, while the algorithm instruction decoder 504 decodes the algorithm instructions read from the instruction buffer.

The word size of the instruction buffer in this example is five, which stores bits [5:1] of algorithm instructions of a test step. The number of words in the instruction buffer can vary. An exemplary default number is eight. The address configuration buffer can, for example, be a 4-bit register.

Figure 35:
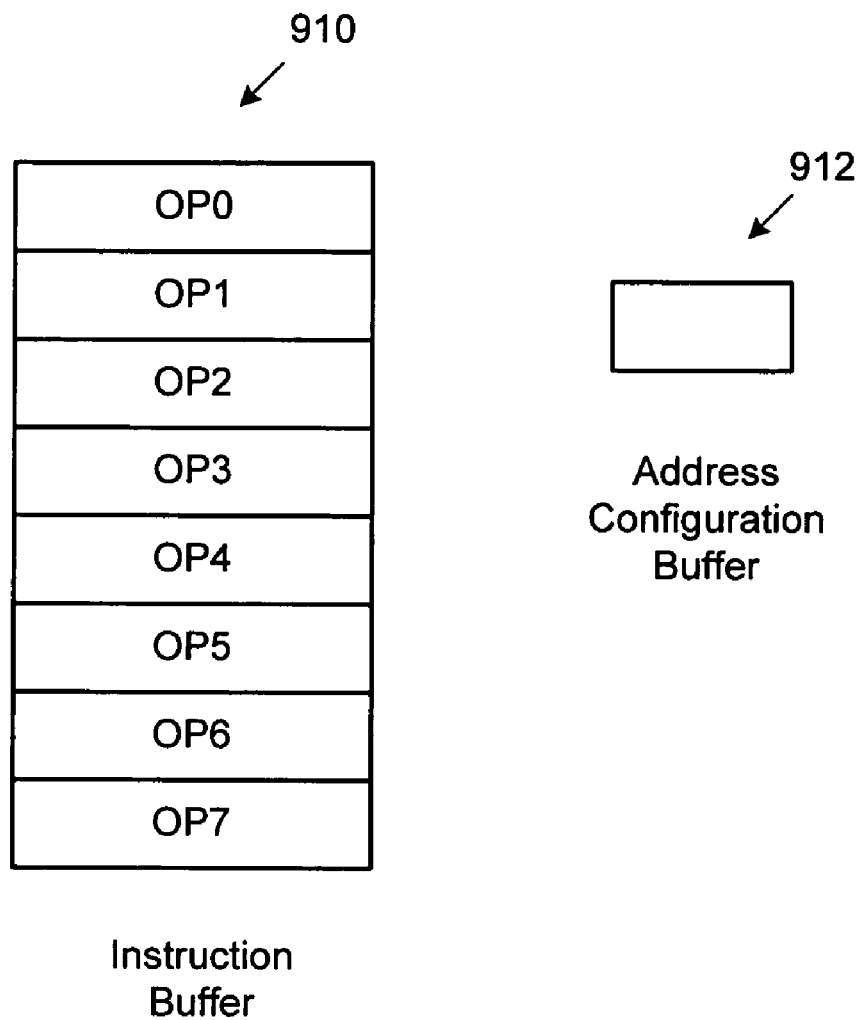
FIG. 35 is an exemplary instruction buffer and address configuration buffer for a form of March-only MBIST controller.

An exemplary instruction buffer 910 and the address configuration buffer 912 are shown in FIG. 35.

11.2.4 Address Generator

One form of March-only data generator comprises or consists of two parts: inter-iteration address generation in this example and intra-iteration address generation. The inter-iteration address generation updates addresses according to the addressing scheme defined by a configuration instruction: row addressing or column addressing. The intra-iteration address generation generates address based on the bits [5:4] and the address generated by the inter-iteration address generator. The intra-iteration address can be the inter-iteration address, or be the inter-iteration address +1-index. (index can be set, for example, to 1 in this version.)

11.3 Data Generator

A suitable data generator for this March-only MBIST controller generates the data value to be written to or read from the current memory location of the current memory operation.

Exemplary data generation scheme types that are supported by this example are listed below. In all cases, both data background and inverse of the data background are supported. The different data can be set by using configuration instructions.

For March algorithms, besides the solid "0" and "1" data backgrounds the user can specify any of the backgrounds that can be used from a total of ($\log_2 w+1$) different backgrounds, where w is the width of a data word.

For example, a memory with data size of 8 bits will have 4 data backgrounds encoded (the inverse of the data backrounds is also available):

0 00000000

1 01010101

2 00110011

3 00001111

In comparison, for Checkerboard algorithms, the topological data background of "01 . . . 01" and its inverse are required. The actual data value will be dependent on the address. For a row stripe and column stripe algorithm, the data can be generated based on the even and odd address of the memory. In a row stripe algorithm, for example in one run, the even rows are written with "11 . . . 11", whereas the odd rows are written with "00.00". In a second run, the data backgrounds are reversed. Similarly, in a column stripe algorithm, the data can be written in a way such that the alternate columns have all 1s and all 0s respectively. For a unique data algorithm, the corresponding memory address is used as a unique data for every memory location.

11.4 Control Generator

The control generator in this March-only example is responsible for generating all of the control signals necessary for the current memory access operation. For full-speed, synchronous memories, this can be simple memory control signal assertions driven directly by algorithm instructions stored in the instruction memory. For others, such as asynchronous memories, in one example, a state counter and the activation of the control signals based on the counter state can be used.

11.5 Output Response Analyzer

The output response analyzer compares the data that is read from the memory and the expected data that is generated from the MBIST controller. In one form, this analyzer can comprise or consist of a comparator that compares the two values. If the width of the memory is quite high, then the depth of comparator logic increases, and therefore, pipeline stages can be inserted to ensure at-speed BIST operation.

The output response analyzer can also store a restart point if restart is required. The restart point is the state of the controller when a second failure is detected before the information of the first failure is being shifted out to the ATE. The information can include the operation number of a test step and the memory address. In one approach, the analyzer does not compare the memory output if the controller is performing a restart and the restart point has not been reached.

11.6 Diagnostic Monitor

See section 9.2 above for an example of a suitable diagnostic monitor. The approach of section 9.1.2 can be implemented for both loading test programs and scanning out diagnostic data.

12.0 Exemplary Block Diagrams and Interfaces Inside the Programmable MBIST Controller This section of the description sets forth exemplary interfaces between modules. The modules have been modified slightly from the functional block diagram of FIG. 4.

Figure 36:
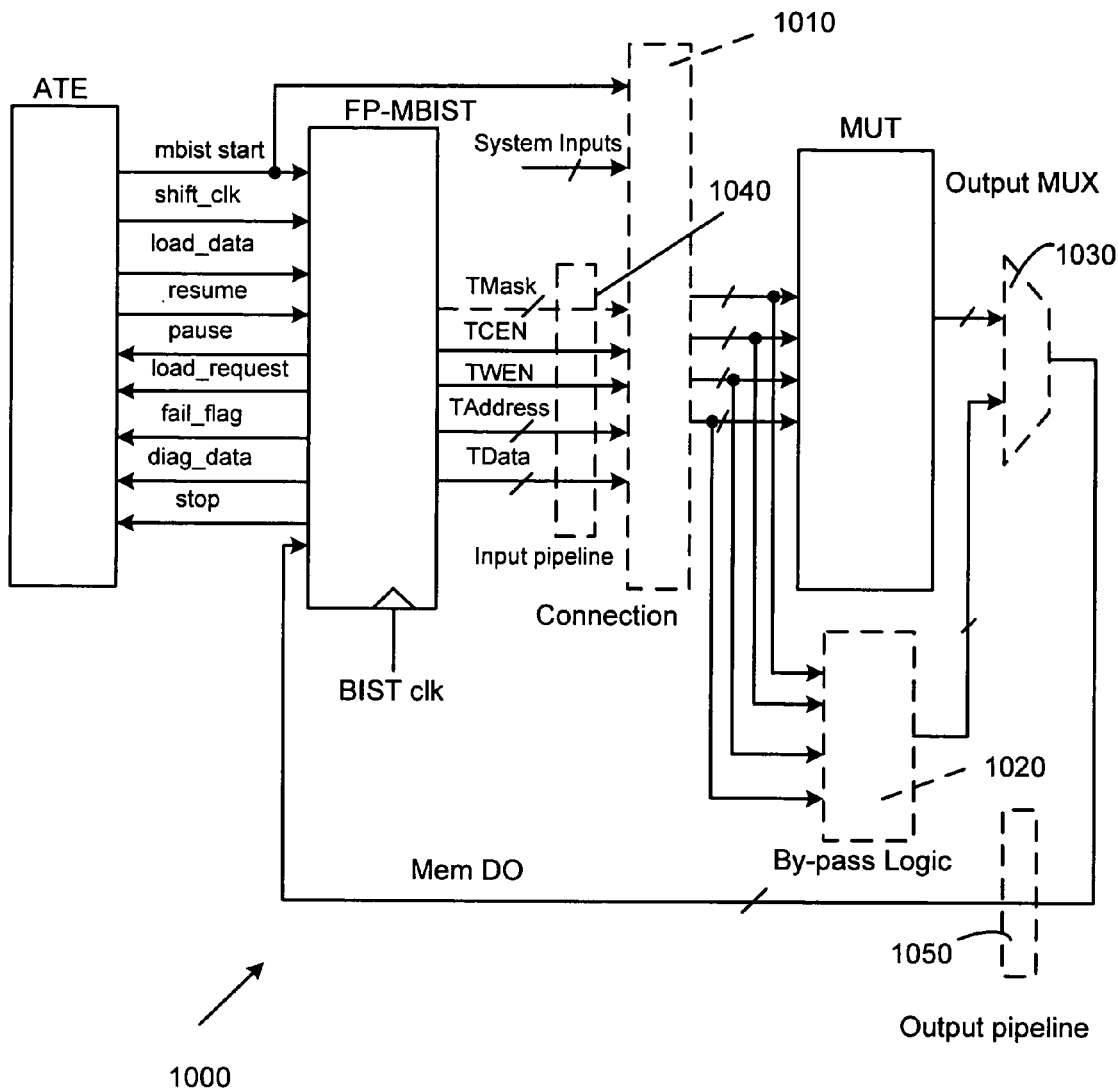
FIG. 36 is an exemplary top level interface for one form of a programmable MBIST controller.

FIG. 36 shows an exemplary top-level interface 1000. In this example, dashed boxes are optional. The connection module 1010 is optional in this example if the memory-under-test (MUT) is BIST-ready. In connection with FIG. 36, examples of the module FP-MBIST have been described in detail above. Additional optional modules in the exemplary interface are described below.

The connection module 1010 is the input interface from FP-MBIST (the programmable MBIST controller) to the memory-under-test (MUT). Module 1010 comprises MUXes that generate inputs to the MUT by selecting the system inputs and the test inputs. The connection module is typically omitted when the MUT is BIST-ready, e.g. when the MUT has embedded MUXes. The by-pass logic module 1020 is designed to allow the memory inputs to bypass the MUT through certain logic, such as an XOR tree and/or latches. The output MUX module 1030 selects the memory outputs and the signals from the by-pass logic.

The input and/or output pipeline modules 1040,1050, for example, are pipelining registers inserted in the memory inputs and/or the memory outputs.

Some control logic for automatic test pattern generation purposes can also be added to memory control signal inputs.

Figure 37:
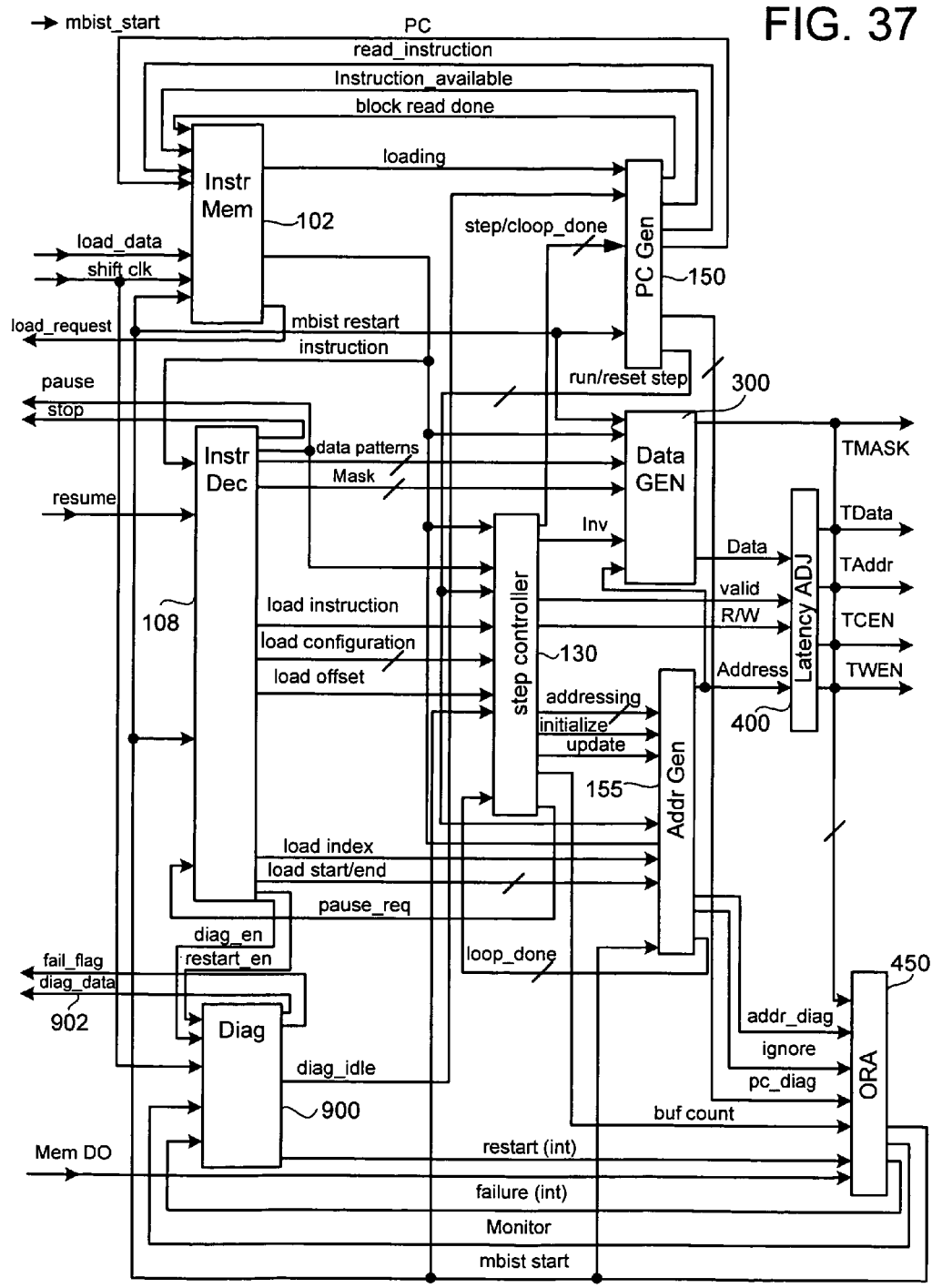
FIG. 37 is an exemplary internal interface for one embodiment of a programmable MBIST controller.
Figure 38A:
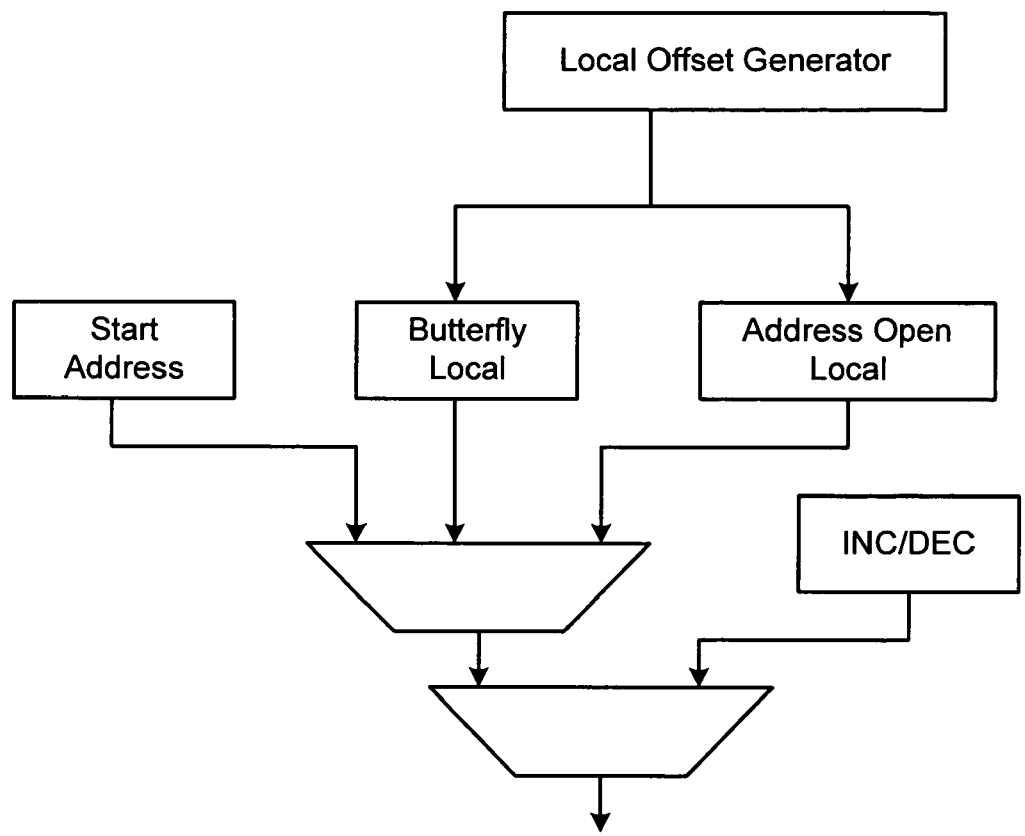
FIGS. 38A and 38B are exemplary address generator data path diagrams.
Figure 38B:
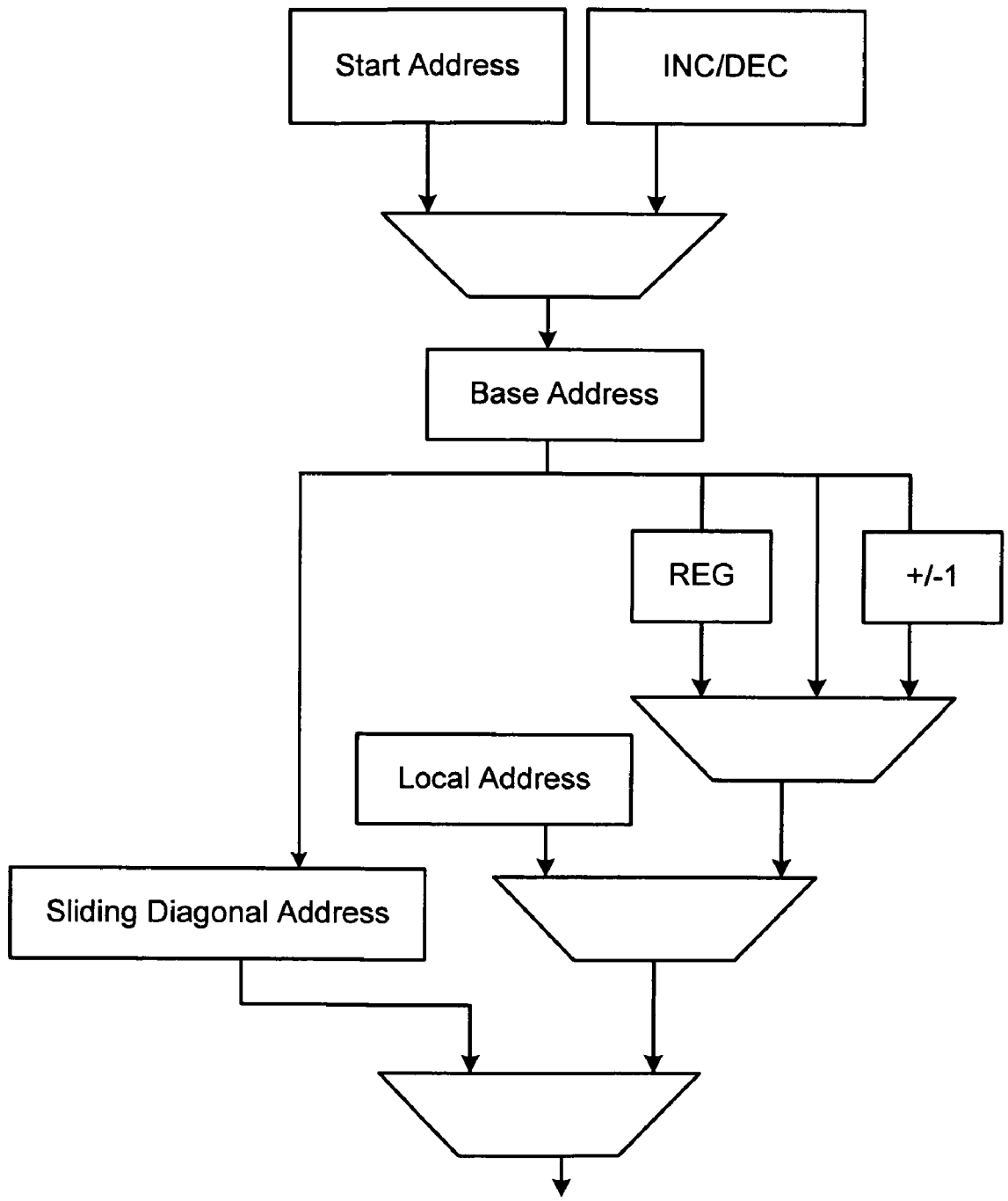

The modules and the internal interfaces within an exemplary programmable MBIST controller are shown in FIG. 37. Some signals are combined into a vector for conciseness. Other signals have been omitted for conciseness.

With reference to FIG. 37, the mbist_start signal starts the BIST test, which will go to all modules.

The instruction memory module 102 (FIGS. 4 and 37) (InstrMem) controls the instruction loading from the ATE and stores a block of instructions. Module 102 sends a load_request signal to the ATE to request instruction loading from the ATE. Input load_data comes from the ATE, which, in this example, can be a serial data stream consisting of instructions. The shift_clk signal is used for loading.

The program counter generator 150 (PCGen) generates PC to InstrMem 102. The PCGen module 150 also sends signals: read_instruction, instruction_available and block_read_done to control the instruction reading from the instruction memory 102. Module 150 generates a run step or reset step signal to start a test step or reset registers for a new test step.

The instruction decoder 108 (InstrDec) decodes instructions read from InstrMem 102, including data patterns/Mask signals for provision to the data generator (DataGEN) 300, step control loading signals (load instruction, load config, load offset) for the step controller 130, address generation loading signals (load index, load start/end) for the address generator (AddrGen) 155, and diag_enable/restart_enable for the Diagnostic Monitor (Diag) 900. Module 108 also generates a pause/stop signal from the instruction to indicate the start of a retention test and the end of BIST. An input resume signal from the ATE will de-assert pause.

The step controller 130 controls the running of a test step. Module 130 sends current loop/step done signals to PCGen 150, initialization signals (initialize) to AddrGen 155 to initialize address registers inside AddrGen, addressing schemes to AddrGen for address generation, signal update to AddrGen to indicate address updating is required, and signal Inv (data polarity) signals to DataGEN for data generation.

The data generator 300 (DataGEN) generates data and write Mask signals according to the information from InstrDec (Data patterns/Mask), the information from step controller (Inv) and address from AddrGen.

The latency adjuster 400 (LatencyADJ) adjusts the latency between signals generated from different modules: Data, valid, R/W and Addr. Module 400 generates the test inputs to MUT: e.g., TData, TAddr, TCEN and TWEN.

The address generator 155 (AddrGen) generates address to MUT. Module 155 checks if a loop done is finished and asserts loop_done if so. This module also indicates if an address is out of range using signal ignore.

The output response analyzer 450 (ORA) compares the expected data and the memory output and generates internal fail signals (failure) to indicate passage or failure of a MUT. Analyzer 450 generates monitor signals from the input information: address, pc, buf_count. Module 458 also stores restart point and indicates if restart reaches the restart point.

The diagnostic monitor (Diag) 900 captures the monitor signal from ORA 450 and shifts out the diagnostic data serially (diag_data). Module 900 generates the fail flag signal (fail_flag) to the ATE. Module 900 also generates an internal restart signal to ORA 450. The output diag_idle indicates if Diag 900 is not shifting any data.

The above components can be altered, rearranged, combined and designed to interact with more or fewer than the signals shown in FIG. 37.

The interfaces of FIGS. 36 and 37 can be modified as desired, for example, to accommodate changes in the architecture of an MBIST controller.

13.0 Overview of Selected Features

Exemplary features of the illustrated Base and Alternative Embodiments for a field programmable memory BIST controller can be broadly classified into the following categories.

13.1. Memory BIST algorithms can be classified into two types, namely, ones that are of linear complexity with respect to the memory address space, and second, the ones that are of non-linear complexity with regards to the memory address space. The first or Base embodiments support a wide range of linear algorithms as described in literature, such as standard March tests, checkerboard tests, unique data tests, bit/byte write-enable tests, and others. In addition, the first embodiments also support non-linear algorithms such as Galloping 0/1, Walking 0/1, address decoder PMOS open faults, Butterfly, Sliding Diagonal, etc., and their possible variations. The alternative embodiments that accommodate algorithms with more complex nested loops can support broader categories of algorithms in addition to algorithms supported by the Base embodiments. The alternative embodiments are believed to support all known algorithms.

13.2. In addition to being programmable to support a much larger set of algorithms, one of the features of the Base embodiments is to support running of the supported algorithms at the functional speed (a.k.a. full-speed). In other words, the proposed architecture allows the user to run the field programmable BIST controller at the rated functional speed of the memory. This desirably includes pipelining the memory read and write operations in a way such that BIST can perform a read/write operation per clock cycle. Some alternative embodiments provide full speed running for algorithms that have loops that do not contain any loop. Other embodiments expand the at speed or full speed running of algorithms with more complex interacting loops. The Base and alternative embodiments may be combined in whole or in part as desired.

13.3. The design of the Base embodiments can be fairly modular in nature. The modularity is based on the functionality required by different groups of algorithms. Consequently, users can choose the group of algorithms they desire the controller to support, and accordingly, the architecture will be synthesized. This gives the flexibility to choose the complexity of the programmable hardware and attain better optimization between programmability and hardware overhead. The design of the alternative embodiments that accommodates loop within loops is not based on the groups. Instead such alternative embodiments are based on address schemes. Choosing different address schemes enables different algorithms. This provides flexibility in that users can choose address schemes to support a number of loops/operations and make a tradeoff between programming flexibility and hardware.

13.4. Both the Base embodiments and alternative embodiments desirably use an instruction set that consists of two sets, namely, Algorithm Instructions and Configuration Instructions. Algorithm Instructions are desirably selected to be those instructions that directly control the operations pertaining to an algorithm step. Algorithm Instructions are desirably decoded at-speed since changes may take place from cycle to cycle between every operation in a particular address. Configuration Instructions desirably are selected to be those instructions that control the data background, addressing scheme, and other control signals and can (and often do not)

change at every algorithm step. The Algorithm Instruction sets for proposed algorithms are very versatile and desirably allow the definition of generic algorithm steps within the framework of the supported memory BIST algorithms. The above observations are applicable to both the Base and alternative embodiments.

13.5. The instruction decoder of the Base embodiments, although variable, in one illustrated form desirably consists of three instruction decoders. The first instruction decoder is desirably a pre-decoder that decodes primarily whether the introduction is an Algorithm Instruction or a Configuration Instruction. The second instruction decoder desirably decodes the Algorithm Instructions. Usually this second decoder has to operate at least at-speed (at the functional speed of the memory). The third instruction decoder desirably decodes Configuration Instructions. Configuration Instructions can be more complex and may take more than a single cycle for decoding. The alternative embodiments that support multiple loop within a loop algorithms, desirably can comprise a fourth additional decoder, namely, a loop configuration decoder that decodes address configurations for each loop or can use alternative architectures. Other decoder architectures are also specifically described.

13.6. For at-speed BIST, the Algorithm Instructions have to be decoded at-speed (at least at the rated functional speed of the memory under test). In order to achieve the same, in the Base embodiments, desirably at least two sets of instruction buffers are used to load the instructions. In these embodiments, the primary loop in the algorithm is termed the base loop. The BIST operation starts by loading the first base loop instructions into the first buffer, which is also known as the base-loop buffer. During the time the instructions in the first buffer are being executed, the second buffer is loaded with all the instructions in the second base loop of the algorithm. The size of the base-loop buffers may vary depending on the number of instructions in the base loop. Although variable, the alternative embodiments can comprise only one Algorithm Instruction buffer.

13.7. In the Base embodiments, for every base loop operation in an algorithm, there can be one or more local loop operations within the same. These local loops may require sequential execution (one after the other) or may have a nested structure. In order to have the ability to run algorithms with multiple local loops at-speed, one or more local loop buffers are desirably used for every base buffer. When loading all operations for a base loop into the base-loop buffer, the instructions corresponding to local-loop buffers are loaded into the local-loop buffers. Multiple small program counters are desirably used to control the addressing schemes for these buffers. These embodiments can be easily extended to increase the number of base loop and local loop buffers. The size of the local-loop buffers can be varied. The alternative embodiments support any number of loops, given enough hardware.

13.8. In the Base embodiments, if there are multiple loops in the algorithm, one form of instruction set will have a JUMP instruction. However, once the instruction is compiled, the absolute address indicating where to jump in the instruction memory is desirably stored. This minimizes the time to calculate the next address during BIST, thereby eliminating the extra delay normally associated with decoding a JUMP instruction. In the alternative embodiments, Configuration Instructions are desirably loaded to internal buffers to specify how a loop is to be loaded.

13.9. In one specific exemplary implementation of the Base embodiments, two address generators are used. One address generator is for the base-loop and the other is for the local-loop. However, this approach is not restrictive. The Base embodiments can have more than two address generators, such as if requested by the user. In addition, an index register corresponding to every address generator can be synthesized such that the programmable MBIST controller is able to support flexible address increments in an algorithm. This is useful when the user wants to jump around different sections of the array and apply the algorithm within that address space. The address generators can generate certain types of addresses that are specific for supporting the disclosed algorithms such as mentioned herein. These address generators are specific implementations. However, the architecture allows flexible address generators, for example, those that support arithmetic as well as logical operations. In certain alternative embodiments, although plural address generators can be used, in one desirable form only one address generator is used with shared operation logic.

13.10. In the Base and alternative embodiments, a data generator desirably generates data that is suitable for any type of March algorithm as well as other more complex algorithms. However, the data generator can also have a very flexible architecture and can generate any type of data background (involving arithmetic and logical operations) desired by the user. In addition, the number of data generators is not restricted to one, and can, for example, be increased to any number, for example, as requested by the user. Also, the MBIST controller can be dedicated to one or more algorithm types (e.g., March-only Algorithms) to simplify the overall architecture at a cost of lost programming.

13.11. In the Base and alternative embodiments, the addressing scheme can desirably be broken down into several fields, such as block, page, row, and column. The address of the memory in this case can desirably broken down into several components such as memory block number, memory page, X-address, Y-address. Users desirably will be provided with the flexibility to choose some of these parameters at run-time.

13.12. In the Base and alternative embodiments, in one desirable approach, the instruction memory need not store the entire algorithm at once. In other words, a hand-shaking scheme between the controller and the test equipment (ATE) may be used such that the instruction memory can be filled up with new instructions from the ATE while some other instructions are being executed by the programmable MBIST controller. As a result, the size of the instruction memory can be optimized to reduce the overall area overhead of the MBIST controller.

13.13. In the Base embodiments, the local address can be function of the base address. The relationship between base address and local address either exists or not. In the alternative embodiments, desirably addresses in different levels are related so that one address can be a function of another higher-level address. Thus, for example, the current address can be either a function of a level0 address or a function of the immediately higher-level address. Given enough hardware, the current address can be a function of any other level address. In the alternative embodiments, the address schemes are desirably not directly related to specific algorithms. To implement a test algorithm, although possible, in the alternative embodiments there is no need to explicitly specify the test algorithm in the instructions. Instead, in certain alternative embodiments, different test algorithms can desirably be generated based on setting proper address schemes. Also, in the alternative embodiments, different configurations for each loop can be supported so that each loop can have different address schemes.

13.14 One goal of an embodiment of a field programmable MBIST controller and testing system is to provide a full-speed GHz memory BIST with high flexibility of field-programming and low area overhead. The high flexibility desirably means not only being able to program data background and address schemes, but also being able to program both linear and non-linear test algorithms.

13.15 The design of an exemplary field-programmable memory BIST (FP-MBIST) consists of two parts: instruction design and hardware design. There are two types of instructions: Configuration Instructions and Algorithm Instructions. The hardware may comprise or consist of instruction memory, instruction decoder, program counter generator, control signal generator, address generator, data generator, latency adjuster and output response analyzer.

13.16 The following definitions apply to the description.
Loop: a series of operations that is repeatedly performed on all pre-defined addresses of a memory under test. '( )' is used to denote a loop. For example: a March element can be written as (RWR) which denotes a loop.
Base loop: a loop that is not embedded in any other loop
Local loop: a loop that is embedded in a base loop
Base cell: a memory cell whose address will be updated for each iteration of base loop
Local cell: a memory cell whose address will be updated for each iteration of local loop
Test step: a base loop that may or may not include local loops

14.0 Additional Examples

Here are two examples.
A Galloping algorithm can be written as:

$$U(W_b0), U(W_b1, (R_10, R_b1), W_b0), U(W_b1), U(W_b0, (R_11, R_b0), W_b1)$$

There are four test steps in the exemplary algorithm. 'U' denotes increasing address direction. ($W_b0$) denotes a base loop, in which '0' is written to base cell. The subscript 'b' denotes base cell. ($W_b1, (R_10, R_b1), W_b0$) means a base loop, in which a local loop, ($R_10, R_b1$), is nested. $R_10$ denotes writing '0' to local cell and subscript '1' denotes local cell. It is apparent that the local loop can perform operations on base cells, however the base loop operations (the operations not in the local loop) cannot be performed on local cells.

A March 2 algorithm can be written as:

$$U(W0), U(R0W1R1), U(R1W0R0), D(R0W1R1), D(R1W0R0), D(R0)$$

Because there is no nested loop in a March algorithm, all memory cells are base cells. The subscript 'b' is omitted in this example. For convenience, the address direction, 'U' or 'D', and the data background, '0' or '1', may be omitted in the following description.

The instruction in one embodiment has a word size of 9 bits. The Least Significant Bit (LSB) in this embodiment is used to differentiate two types of instructions: Configuration Instruction or Algorithm Instruction. LSB=1 denotes an Algorithm Instruction and 0 denotes a Configuration Instruction.

The meaning of each bit in another exemplary Algorithm Instruction for the Base embodiments is shown in Table 9 below and is also described below:

TABLE 9

| Algorithm Instruction | | | | | | | | | |
|---|---|---|---|---|---|---|---|---|---|
| [8] | [7] | [6] | [5] | [4:3] | | | [2] | [1] | [0] |
| EBL | BBL | ELL | BLL | B | L | B + 1 | B − 1 | 0/1 | R/W | A |
| End of Base Loop | Begin of Base Loop | End of Local Loop | Begin of Local Loop | Base addr | Local addr | Base addr + 1 | Base addr − 1 | Data or Data Inverse | Read or Write | Algorithm Instruction |

Bits [8:5] specify if the operation is at the beginning or at the end of a test step. A test step is used to define the beginning point and the end point of a base loop or a local loop.

Bits [4:1] of an Algorithm Instruction specify an operation that is performed on a memory cell or a memory word.

Bits [4:3] denote the memory cells/words to be accessed. The memory cell/word could be a base cell/word in a base loop, a local cell/word in a local loop, or a cell/word adjacent to the base cell/word.

Bit [2] denotes data or data inverse to be written to or read from a memory cell/word.

Bit [1] specifies the operation performed on a memory cell/word. As bit-oriented memory is a special case of word-oriented memory with word size of 1. The discussion below will be based on word-oriented memories.

The address generation for sliding diagonal test and butterfly test is a little different. For the sliding diagonal test, besides the base and the local address registers, an additional address register is used, and may be called a diagonal address register. The diagonal address will increase or decrease both row address and column address starting from the base address.

There are two exemplary special Algorithm Instructions dedicated for sliding diagonal algorithm. If bits [4:3] of an Algorithm Instruction equal '01', a 'sliding read/write all' operation will be performed. If bit [4:3]='11', a 'sliding read/write diagonal' operation will be performed. Both the instructions are multi-cycle operations. The 'sliding read/write all' operation will read/write all cells in the memory while the 'sliding read/write diagonal' operation will read/write diagonal cells in the memory.

For a butterfly test, there is also an exemplary special instruction, called 'butterfly read/write'. If bits [4:3] of an Algorithm Instruction equal '01', a 'butterfly read/write' operation will be performed. It is also a multi-cycle instruction. The operation will read or write the cells in the 4 directions from the base cell. Although the above three multi-cycle instructions actually perform second loop operations, they are desirably loaded to the base loop buffer for convenience in the First embodiments.

The Configuration Instructions for the First embodiments, for example, define the test algorithms to be used, how address changes, data backgrounds to be used and changed and also some program control instructions. Configuration Instructions are desirably hierarchically designed so that each instruction field can be decoded in parallel. Bits [7:6] in an example specify the category of a Configuration Instruction: algorithm selection and control and special operations, address configuration, or data configuration. Each category can be further divided into sub-categories. For example, address Configuration Instructions can be divided into 4 sub-categories: base direction configuration, base address loading, local direction configuration, and local offset. Bits [5:4] are used in this example to differentiate the 4 sub-categories. The next 3 bits [3:1] further define the function of each instruction. Bit [8] is not used in this example and is for future extension.

Another embodiment of exemplary Configuration Instructions (for the Base embodiments) are set forth in the Table 10 below:

TABLE 10

| [8] | [7:6] | [5] | [4] | [3:1] | [0] |
|---|---|---|---|---|---|
| Unused | MISC | Algorithm selection | | Test algorithms | C |
| | | Program control | | NOP pause stop | |
| | | Special OP | | Set write mask 0 Set write mask 5 Set write mask A | |
| | ADDRESS | | Base direction | Column addressing Row addressing Row only Column only Diagonal | |
| | | | | Increasing Decreasing | |
| | | | Base load | Load MAX address Load MIN address | |
| | | | Local direction | Column addressing Row addressing Row only Column only | |
| | | | Local offset | Set local to base Offset scheme 1 Offset scheme 2 | |
| | DATA | Data selection | | Data backgrounds | |
| | | | Data type | Solid Checkerboard Row stripe Column stripe Unique | |
| | | | Data update | Update data background Update scheme 1 - next Update scheme 2 - shift Data start | |
| | EXTENSION | | | | |

The instructions can also be classified into two types: single word instruction and multi-word instruction. In this example, there are two multi-word instructions: load MAX address and load MIN address, which specify the bound of addresses of memory to be tested. In this example, only one of MAX and MIN address can be specified. The load instruction word is followed by the address. The address in this example should not be confused with either Configuration Instructions or Algorithm Instructions.

For March algorithms, the March direction will be changed between two March elements (steps). To make sure that the direction Configuration Instruction will not add extra cycles between two steps, the direction Configuration Instruction is desirably also pre-decoded. As the direction instruction between two steps can be decoded when the previous step is running, the decoding can be done in multiple cycles, thus this does not slow down the system speed. A state machine may be used to control the direction change.

The indicator of last addresses, the last base address and the last local address, may be used to Ping-Pong or alternate two steps stored in the two buffer pairs. As the address generation and the last address signal generation are in a critical path, pipelining is desirably used to obtain at-speed operation. For example, two pipelines stages may be inserted between the Algorithm Instruction decoder and the last address signal generation. In this case, the last address should be indicated two cycles earlier than the real last address in order to Ping-Pong two buffers promptly.

For March algorithms, i.e., algorithms without nested loops, the last address signal may be asserted for one cycle at the time that is $(k+1)*(n-1)$ cycles later when last address +k (when the March direction is decreasing) or last address −k (when the March direction is increasing) is reached. In this example, k is the number of stages between the Algorithm Instruction decoder and the last address indicator (here, k is 2), and n is the number of operations in the running step.

For algorithms with nested loops, such as galloping and walking algorithms, the last local address signal may be generated in the same way as above. However the last base address signal cannot be done in the same way because a local loop of many cycles is inserted between operations in a base loop. Instead, the last base address signal may be asserted based on the last local address. For example, the last base address signal may be generated by delaying the last local address signal for m cycles when the real last base address is reached, where m is the number of operations following the local loop in the current base loop.

Both $(k+1)*(n-1)$ and m may be calculated for each step by using hardware. The calculations can be done in multiple cycles.

In one exemplary programmable MBIST controller design, all March algorithms, galloping/walking algorithms, butterfly, sliding diagonal test and test for address PMOS open faults are included. However, all of these tests will not always be used or allowed to be used due, for example, to the hardware and test time limitations. For this reason, it is desirable to provide a programmable controller capable of being programmed to choose from the different types of algorithms to be included. These exemplary test algorithms programmable into one basic form of an embodiment of a programmable MBIST controller can be divided into five groups: March, galloping/walking, butterfly, sliding diagonal and test for address PMOS open faults. March algorithms are basic, and may, for example, always be included in a basic form of programmable MBIST. For the other groups, some, none, or all can be included in the programmable MBIST. Thus, there may be up to 16 different versions of a basic programmable MBIST in accordance with this example depending upon which algorithms and combinations thereof are programmed into the controller (e.g., in the field).

The selected groups of algorithms should share logic as much as possible to reduce area overhead. The datapaths of the groups may be partitioned into two parts: those that can be shared with other groups and those cannot. The logic for March algorithms in this example will be shared by all groups.

The instruction design may substantially be maintained as explained above so as to minimize changes to the instruction decoder. However, the instruction decoder may be simplified by not decoding some instructions for certain unused test algorithms.

The two buffer pairs, in this example, may be combined with the instruction memory. The two base loop buffers, in this example, may be used by all algorithms while the local loop buffers in this example are used only by galloping/walking algorithms and test for address PMOS open faults.

Similarly, local loop buffer PCs (LPCs) are only needed, in this example, by galloping/walking algorithms and test for address PMOS open faults. They need not be included for other groups.

The control signal generator and the latency adjuster may be the same and used for all the groups. The data generator is desirably the same for all groups, except for sliding diagonal test. For sliding diagonal test, the data background is desirably inverted for the diagonal memory cells. The output response analyzer is same for all groups except for the galloping/sliding algorithms. For the galloping/walking algorithms, the memory output need not be evaluated when the base address equals the local address.

The groups share almost all the logic of the control signal generator, latency adjuster, data generator and output response analyzer with minor differences.

The main difference among the groups lies in the address generator. The datapaths of the address generator can be simply illustrated by FIGS. 40A and 40B.

Local address, in this example, will be used only by non-linear algorithms. In the local address generator, the local offset in this example will only be used by butterfly test and address open test. Also there is butterfly-specific local address logic and address open test-specific local address logic. The sliding diagonal address is used only by the sliding diagonal algorithm test. Such components will be added only when the corresponding algorithm groups are included.

For diagnostic purposes, diagnostic data may be scanned out to an ATE. The ATE should be able to identify the test step and the test operation that are used to detect the failures. To do this, the ATE needs to know the memory address that fails the test. The ATE also needs the comparison result of the expected memory output and the actual memory output.

A problem may arise when a second failure is detected and the previous diagnostic data have not yet been scanned out completely. Three exemplary methods to handle this issue are as follows: (1) to hold the previous diagnostic data and ignore the newly detected failure, (2) to pause and resume the BIST controller, and (3) to restart the test algorithm upon a second failure. The first method might miss reporting some failures and the second method might miss detecting some time-related failures. The advantage of the third method is that it does not lose test quality.

However, the third approach can increase diagnosis time in comparison to the other two methods as the third approach restarts a test algorithm upon detecting the second failure before completing the previous failure. The restart point does not have to be the beginning of an algorithm. However the restart point should be the initialization point of a fault. So an instruction may be included that is dedicated to specifying the restart point of an algorithm.

These diagnostic approaches may also be used.

Exemplary extended instructions for diagnosis purpose are listed in the Table 11 below.

TABLE 11

Exemplary Extended Configuration Instructions for diagnosis

| [8] | [7:6] | [5] | [4] | [3:1] | [0] |
|---|---|---|---|---|---|
| Unused | Extension (11) | | Diagnosis (00) | Enable Diagnosis (000) Disable Diagnosis (001) Enable Restart (010) Disable Restart (011) Restart Point (100) | C |
| | | | EXTENSION | | |

Having illustrated and described the principles of our invention with reference to several illustrative embodiments, it should be apparent to those of ordinary skill in the art that these embodiments and concepts may be varied in arrangement and detail while still falling within the scope of our invention. We claim all such modifications.

We claim:

1. A method for testing at least one memory included in an integrated circuit using a test algorithm comprising one or more test steps described by algorithm instructions and configuration instructions, the method comprising:

receiving the configuration and algorithm instructions delivered to an instruction memory of a memory testing portion of the integrated circuit;

evaluating the received configuration instructions;

determining that all algorithm instructions for one of the test steps have been received;

evaluating the algorithm instructions for said one of the test steps following the determination that all of the algorithm instructions for said one of the test steps have been received, wherein the evaluating the algorithm instructions comprises addressing at least selected cells within the memory to which test data is to be applied to test the cells according to the at least one test algorithm, the act of addressing the selected cells being accomplished so as to address cells at the functional operating speed of the memory at least during certain memory access operations within the one of the one or more test steps;

applying test data to the addressed cells; and analyzing output results read from the at least selected cells to which test data is applied to determine whether the test results match expected test results from the selected cells in response to the applied test data.

2. The method according to claim 1 wherein the act of addressing comprises addressing cells in at least one inner loop of one of the test algorithms nested within at least one outer loop of the one of the test algorithms, and wherein the act of addressing comprises addressing transitions between cells of the inner and outer loop so as to implement at least one testing algorithm comprising a nested loop algorithm.

3. The method according to claim 2 wherein the act of addressing comprises addressing cells in a plurality of nested loops and wherein the act of addressing comprises addressing transitions between cells of the different loops so as to implement at least one testing algorithm comprising a plurality of nested loops.

4. The method according to claim 3 wherein the act of addressing comprises addressing cells at the functional operating speed of the memory at least during memory access operations within a loop.

5. The method according to claim 4 comprising the act of recording diagnostic data for selected errors that become revealed by functional operating speed testing.

6. The method according to claim 1 comprising the act of delivering configuration instructions and algorithm instructions to the integrated circuit to implement a plurality of testing algorithms.

7. The method according to claim 1 wherein the act of decoding comprises decoding algorithm instructions in parallel with the decoding of configuration instructions.

8. The method according to claim 7 further comprising the act of executing memory operations for a first test step described by a first set of algorithm instructions stored in at least one first buffer while at least one second buffer is receiving a second set of algorithm instructions describing memory operations for a second test step and executing operations of the second test step stored in the second buffer while the first buffer is receiving a third set of algorithm instructions describing memory operations for a third test step, wherein the second test step is subsequent to the first test step and the third test step is subsequent to the second test step.

9. The method according to claim 8 wherein the at least one first buffer comprises at least one first base loop buffer for storing sequences of operations performed on all base addresses in accordance with a testing step and wherein the at least one second buffer comprises at least one second base loop buffer for storing sequences of operations performed on all base addresses in accordance with a testing algorithm step, wherein the at least one first buffer also comprises a first local loop buffer for storing sequences of operations performed on local addresses that differ from a base address associated with an operation of the first base loop buffer, and wherein the at least one second buffer also comprises a second local loop buffer for storing sequences of operations performed on local addresses that differ from a base address associated with an operation of the second base loop buffer.

10. The method according to claim 9 wherein the local addresses comprise all addresses of the memory cells other than the base address for an operation associated with the base address.

11. The method according to claim 9 wherein the local address comprises a subset of less than all of the addresses of the memory cells other than the base address for an operation associated with the base address.

12. The method according to claim 9 comprising the act of reaching the next base address in the base loop buffers from the current base address in the base loop buffer following the execution of the sequence of operations stored in the local address buffer associated with the current base address.

13. The method according to claim 9 wherein the act of addressing comprises addressing commencing with a first cell of a selected group of cells to the last cell of the selected group of cells.

14. The method according to claim 9 wherein the act of addressing comprises addressing all cells of the memory starting from a reference cell.

15. The method according to claim 14 wherein the reference cell is at the first row and first column address of an array of cells of the memory.

16. The method of claim 1, wherein at least one of the configuration instructions is evaluated over multiple clock cycles.

17. The method of claim 1, wherein the said one of the test steps is a first one of the test steps, the method further comprising repeating the method of claim 1 for a second one of the test steps.

18. A method for testing at least one memory included in an integrated circuit comprising:

decoding configuration and algorithm instructions delivered to an instruction memory of a memory testing portion of the integrated circuit;

determining at least one test algorithm comprising test steps to be applied to the memory from the decoded instructions;

addressing at least selected cells within the memory to which test data is to be applied to test the cells according to the at least one test algorithm, the act of addressing the selected cells being accomplished so as to address cells at the functional operating speed of the memory at least during certain memory access operations within a test step;

applying test data to the addressed cells;

analyzing output results read from the at least selected cells to which test data is applied to determine whether the test results match expected test results from the selected cells in response to the applied test data;

executing memory operations for a first test step stored in at least one first buffer while at least one second buffer is receiving memory operations for a second test step and executing operations of the second test step stored in the second buffer while the first buffer is receiving memory operations for a third test step, wherein the second test step is subsequent to the first test step and the third test step is subsequent to the second test step, wherein the act of decoding comprises decoding algorithm instructions in parallel with the decoding of configuration instructions, wherein the at least one first buffer comprises at least one first base loop buffer for storing sequences of operations performed on all base addresses in accordance with a testing step, wherein the at least one second buffer comprises at least one second base loop buffer for storing sequences of operations performed on all base addresses in accordance with a testing algorithm step, wherein the at least one first buffer also comprises a first local loop buffer for storing sequences of operations performed on local addresses that differ from a base address associated with an operation of the first base loop buffer, wherein the at least one second buffer also comprises a second local loop buffer for storing sequences of operations performed on local addresses that differ from a base address associated with an operation of the second base loop buffer, and wherein the act of addressing at least selected cells in the memory comprises determining row and column addresses for each of the selected cells in parallel.

19. A method of providing an MBIST circuit, comprising:

receiving a user designation of a plurality of nested loops required to apply one or more memory testing algorithms desired by the user to be run by the MBIST circuit to test one or more memories of an integrated circuit; and synthesizing the MBIST circuit, wherein the MBIST circuit is configured to have the capability of running, according to a plurality of instructions comprising algorithm instructions and configuration instructions, the one or more memory testing algorithms having the plurality of nested loops designated by the user, wherein the MBIST circuit comprises an address generator configured to generate respective addresses for each nested loop in the plurality of nested loops, the respective addresses comprising row values and column values, and wherein the MBIST circuit further comprises a first decoder configured to identify one of the plurality of instructions as an algorithm instruction or a configuration instruction.

20. The method of claim 19, further comprising a second decoder configured to decode algorithm instructions and a third decoder configured to decode configuration instructions.

21. A method of providing an MBIST circuit comprising:
receiving a user designation of at least one category of memory testing algorithms from a plurality of categories of algorithms; and
synthesizing the MBIST circuit, wherein the MBIST circuit is configured to have the capability of running the memory testing algorithms of the at least one category of algorithms designated by the user, and wherein the MBIST circuit comprises first and second buffers configured to store algorithm instructions of the memory testing algorithms, each of the first and second buffers comprising a base loop buffer and a local loop buffer.

22. The method according to claim 21 wherein the user designated at least one category of algorithms comprising at least one algorithm that includes a plurality of nested loops.

23. A method of providing an MBIST controller comprising:
receiving a user designation of a plurality of address generators required for an MBIST circuit to run memory testing algorithms desired to be run by a user; and
synthesizing the MBIST circuit, wherein the MBIST circuit is configured to have the plurality of address generators designated by the user for running the memory testing algorithms desired to be run by the user, and wherein at least some of the address generators are configured to determine, in parallel, row and column addresses for each of selected memory cells within a memory being tested by the MBIST circuit.

* * * * *